US012009355B2

(12) United States Patent
Fulford et al.

(10) Patent No.: US 12,009,355 B2
(45) Date of Patent: Jun. 11, 2024

(54) 3D STACKED DRAM WITH 3D VERTICAL CIRCUIT DESIGN

(71) Applicant: Tokyo Electron Limited, Tokyo (JP)

(72) Inventors: H. Jim Fulford, Albany, NY (US); Mark I. Gardner, Albany, NY (US); Partha Mukhopadhyay, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 208 days.

(21) Appl. No.: 17/574,525

(22) Filed: Jan. 12, 2022

(65) Prior Publication Data

US 2023/0225109 A1 Jul. 13, 2023

(51) Int. Cl.
| | | |
|---|---|---|
| *H01L 27/02* | (2006.01) | |
| *H01L 29/66* | (2006.01) | |
| *H01L 29/78* | (2006.01) | |
| *H10B 12/00* | (2023.01) | |

(52) U.S. Cl.
CPC .... *H01L 27/0207* (2013.01); *H01L 29/66666* (2013.01); *H01L 29/7827* (2013.01); *H10B 12/033* (2023.02); *H10B 12/05* (2023.02); *H10B 12/31* (2023.02)

(58) Field of Classification Search
CPC ...... H10B 12/033; H10B 12/31; H10B 12/03; H10B 12/05; H10B 12/315; H01L 28/90; H01L 28/91; H01L 29/66666; H01L 29/7827; H01L 27/0207
See application file for complete search history.

(56) References Cited

U.S. PATENT DOCUMENTS

| | | | |
|---|---|---|---|
| 9,024,376 B2 | 5/2015 | Masuoka et al. | |
| 9,425,324 B2 | 8/2016 | Diaz et al. | |
| 9,478,624 B2 | 10/2016 | Colinge et al. | |
| 2011/0260225 A1* | 10/2011 | Lee | H10B 12/33 257/296 |

OTHER PUBLICATIONS

U.S. Appl. No. 17/524,668 as filed Nov. 11, 2021.

\* cited by examiner

*Primary Examiner* — Mohammad M Hoque
*Assistant Examiner* — Kevin Quinto
(74) *Attorney, Agent, or Firm* — FOLEY & LARDNER LLP

(57) ABSTRACT

Apparatuses, devices and methods for fabricating one or more vertically integrated single bit capacitor-based memory cells is disclosed. A single bit capacitor-based memory cell can include a vertically oriented transistor and a vertically oriented capacitor that is vertically integrated with the transistor, so as to form a memory cell. Aspects of the disclosure include process steps for forming the transistor and the capacitor, including a first metal part of a capacitor, a second metal part of a capacitor and an electrically insulating layer disposed between the two. The transistor and the capacitor also include an electrical contact between them and a layer that insulates the transistor from the base layer or the underlying substrate.

19 Claims, 43 Drawing Sheets

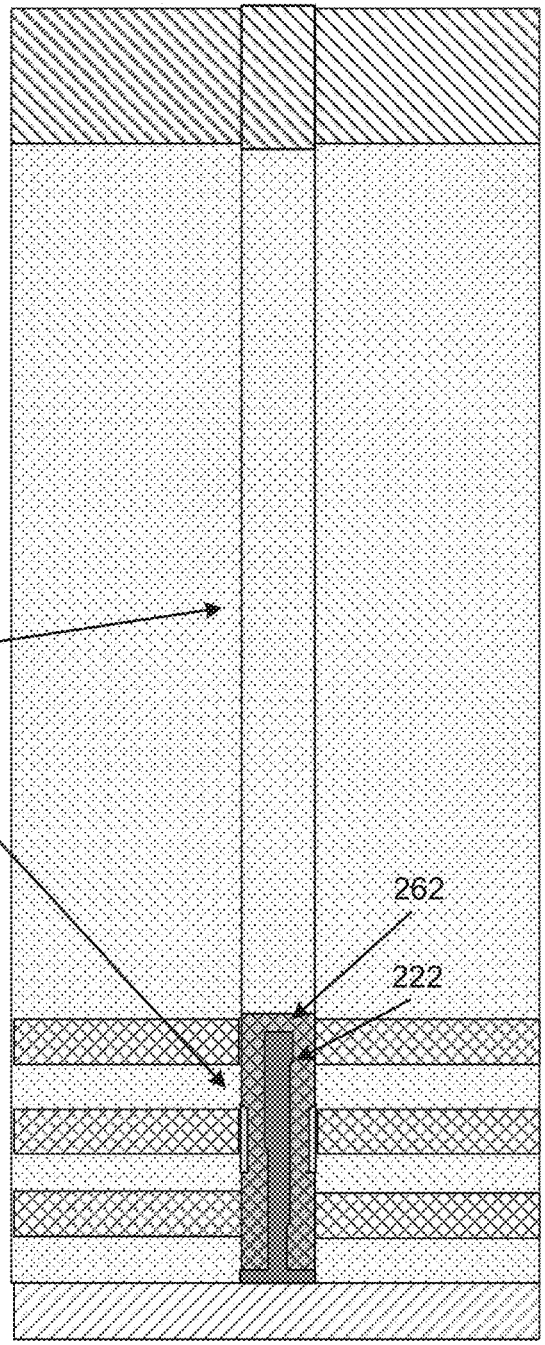
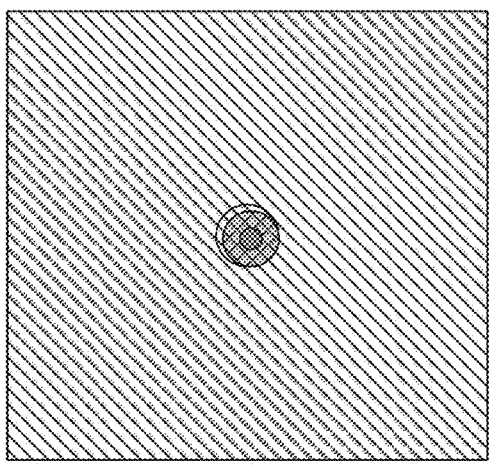
FIG. 3

 Base Layer 104
 Dielectric 1 106
 Metal 1 110
 Dielectric 2 212
 SiGe 218
 Doped Si 214
 High-k 216
 Dielectric 3 220
 Dielectric 4 222
 Metal 2 224
CROSS-SECTIONAL VIEW 402
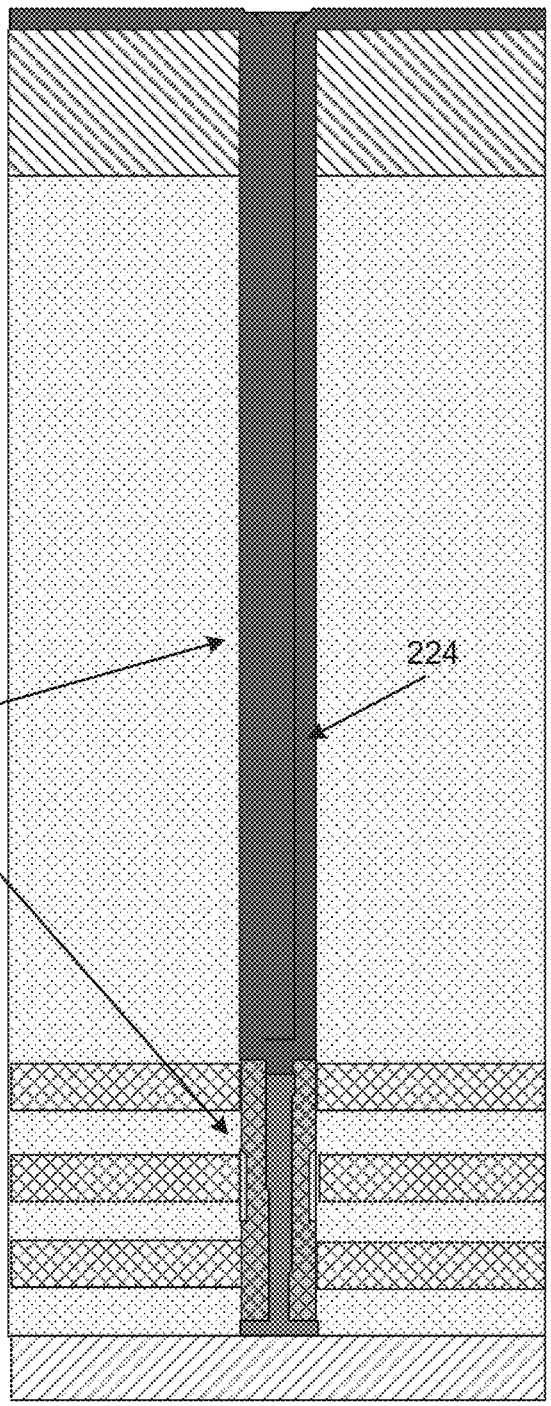
Column 250
Transistor 260
TOP VIEW 400
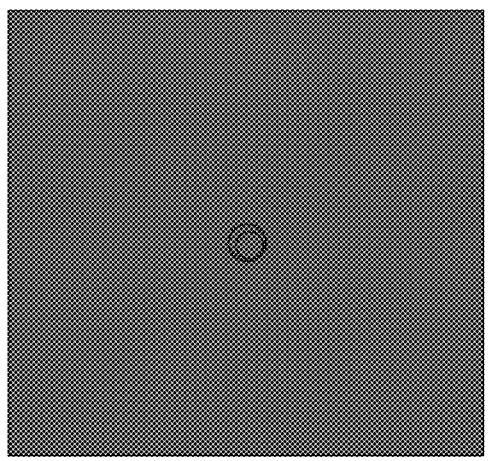
FIG. 4

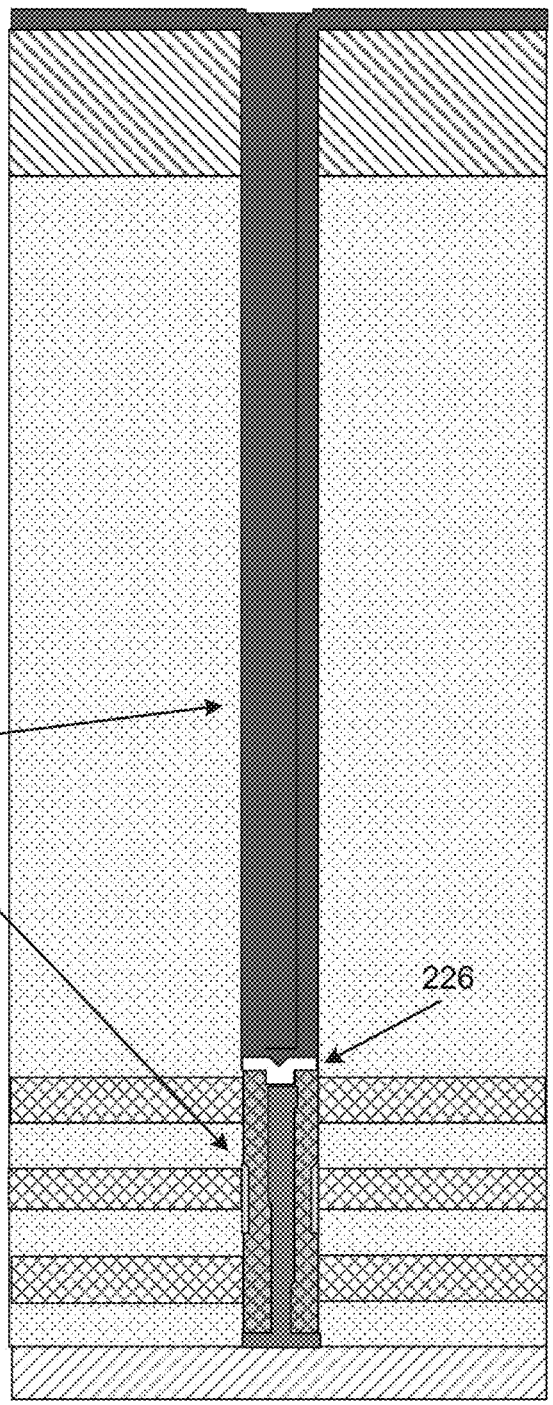
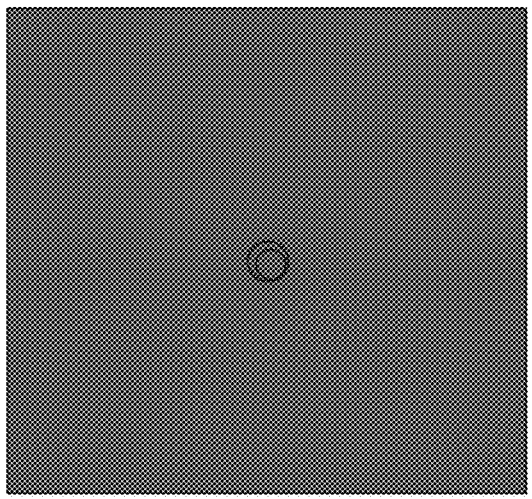
FIG. 5

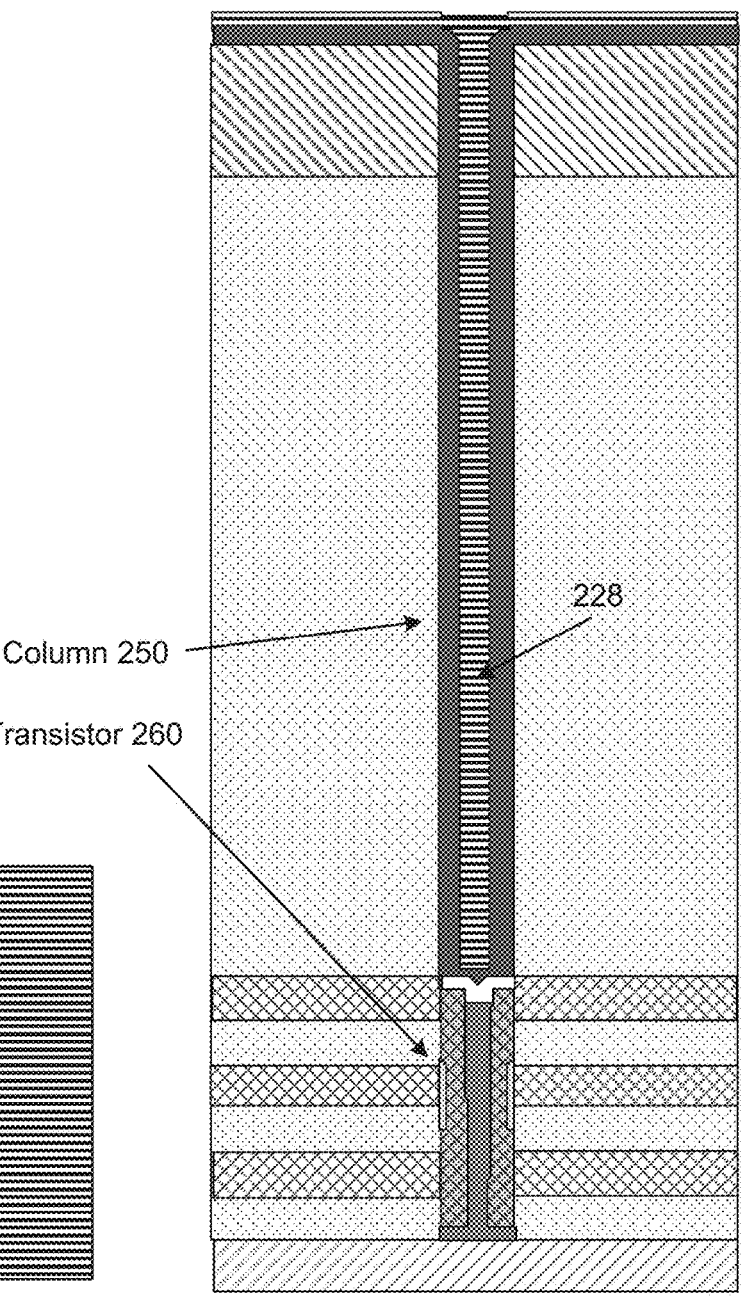
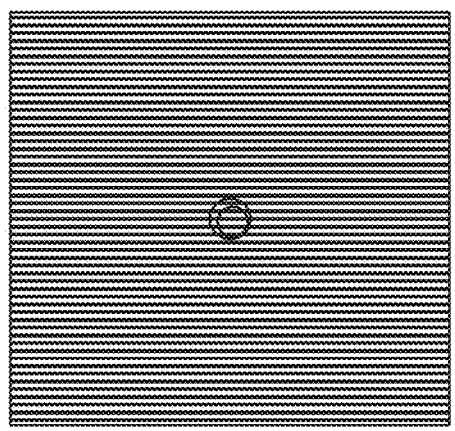
FIG.6

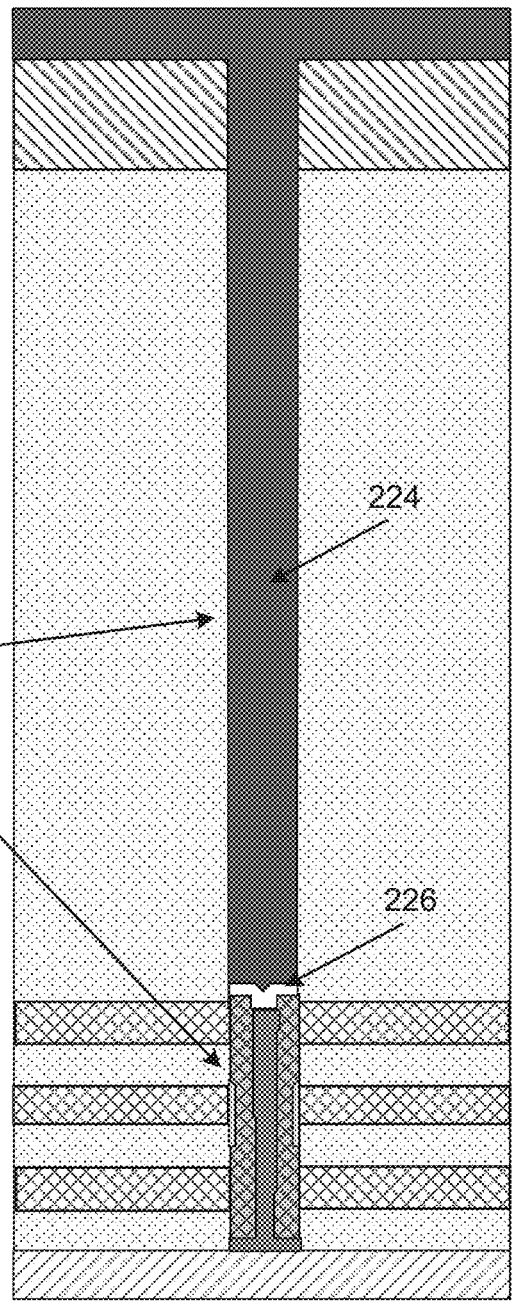
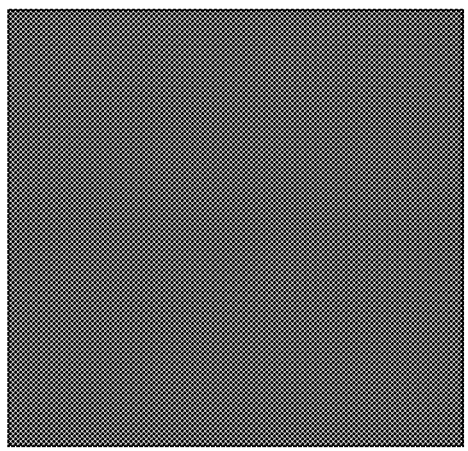
FIG. 8

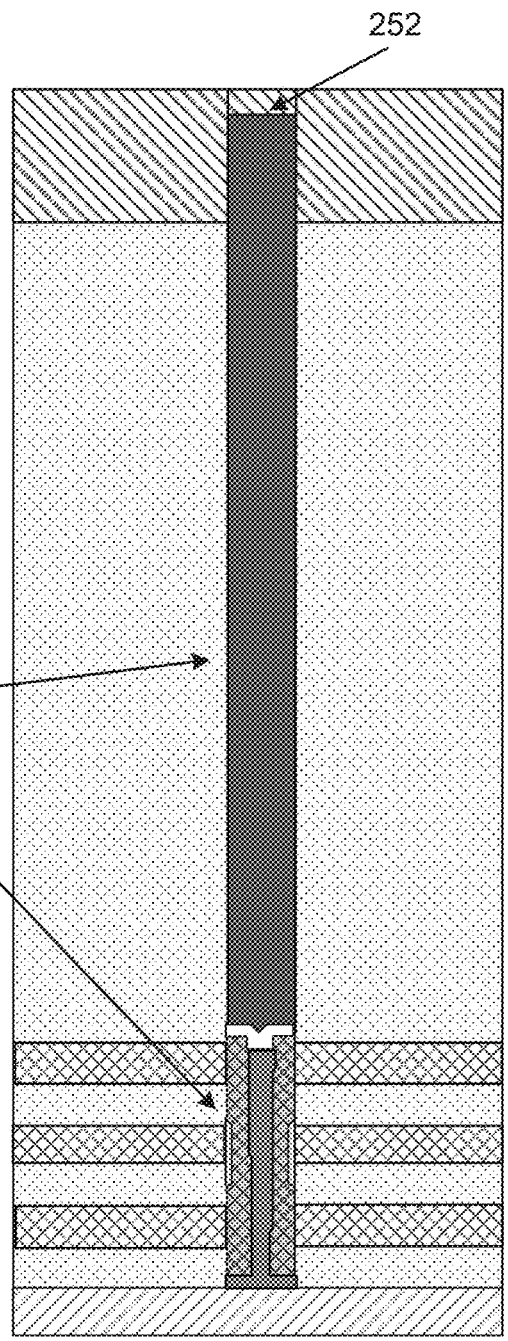
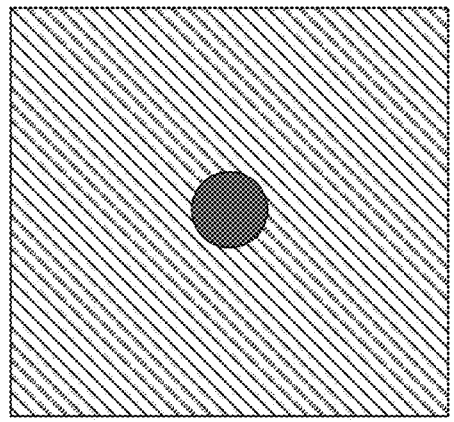
FIG. 9

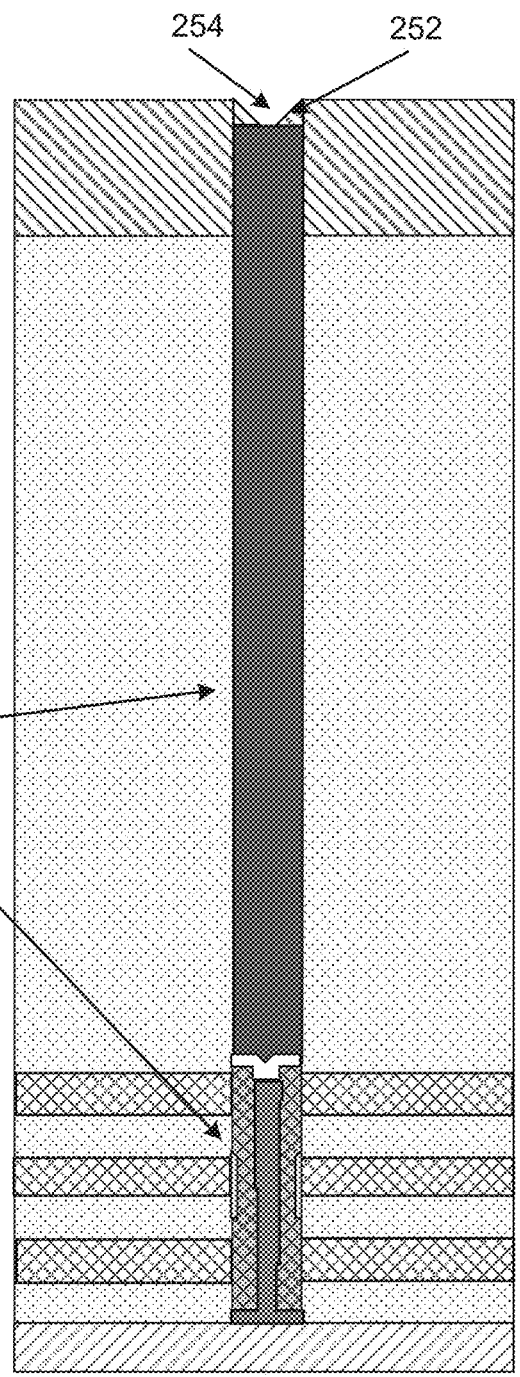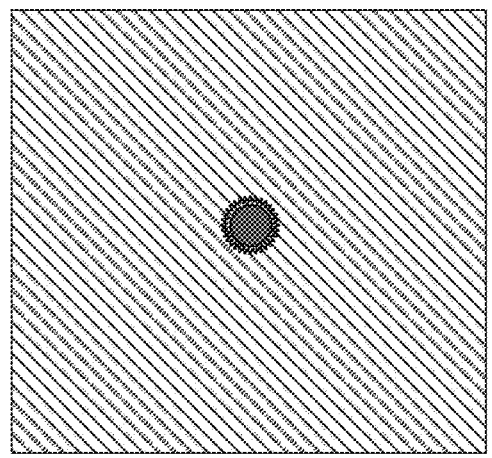
FIG. 10

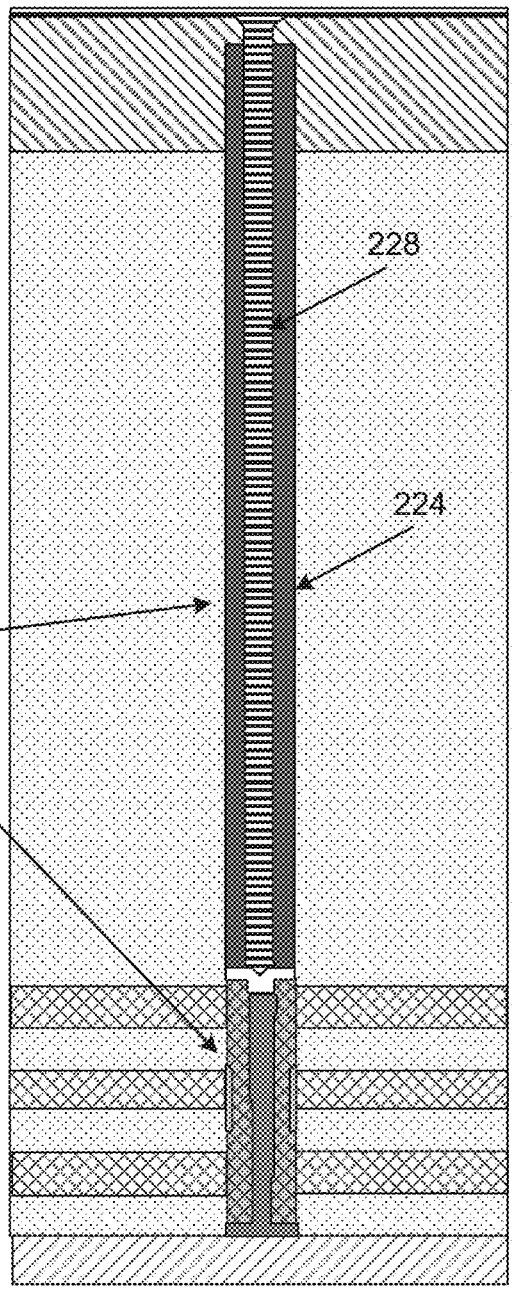
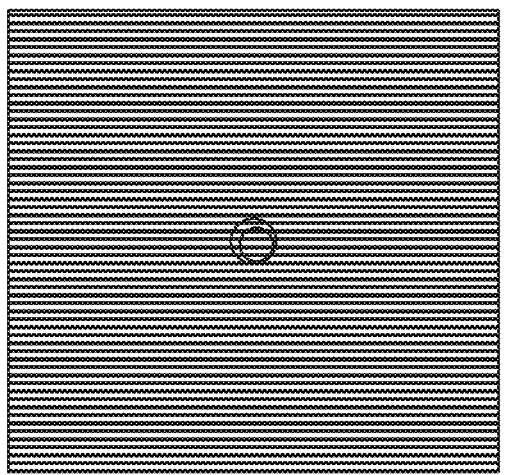
FIG. 11

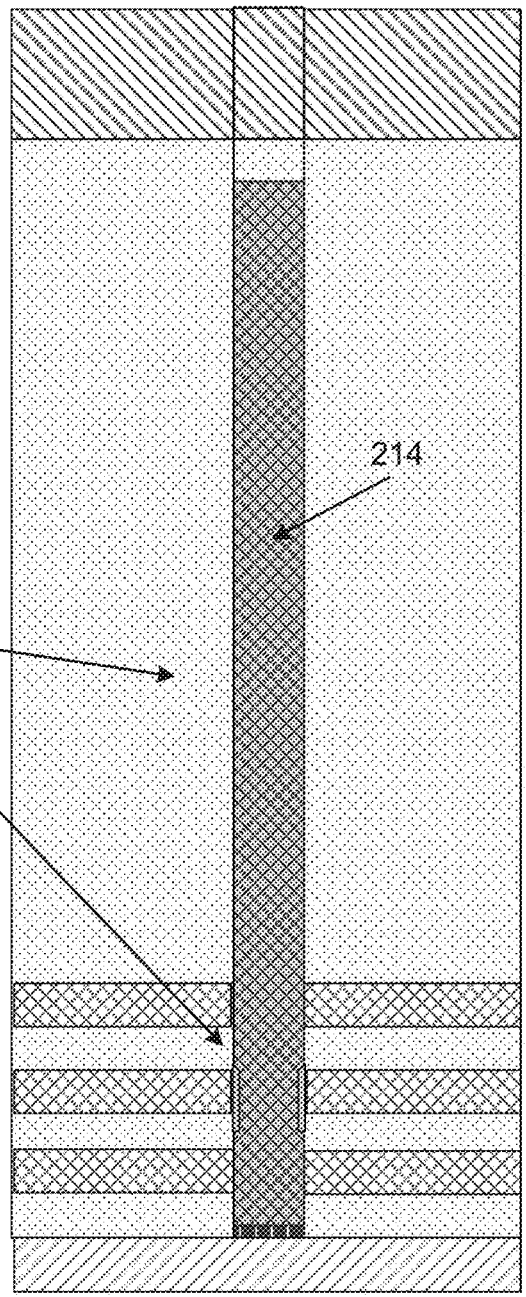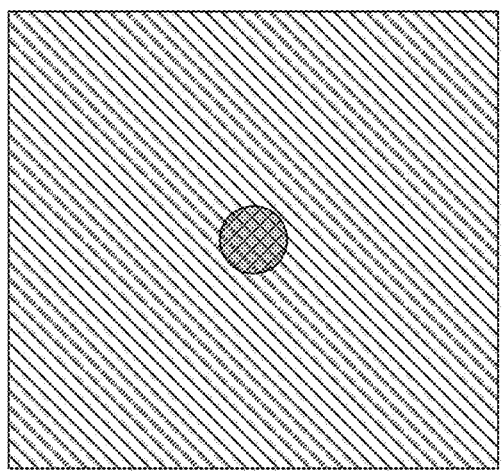
FIG. 13

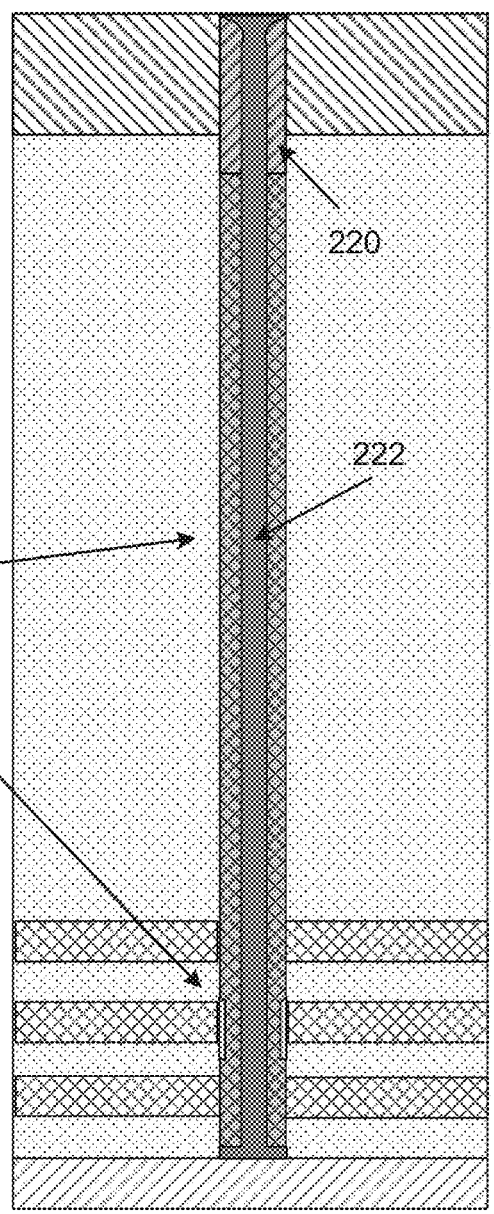
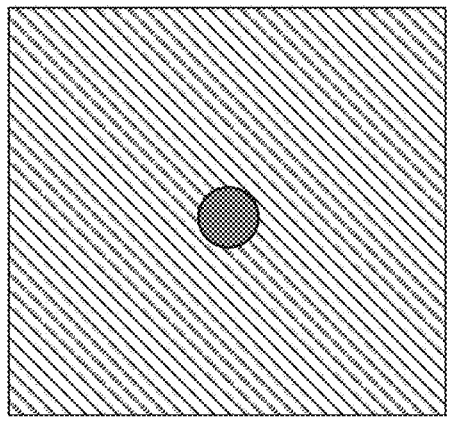
FIG. 14

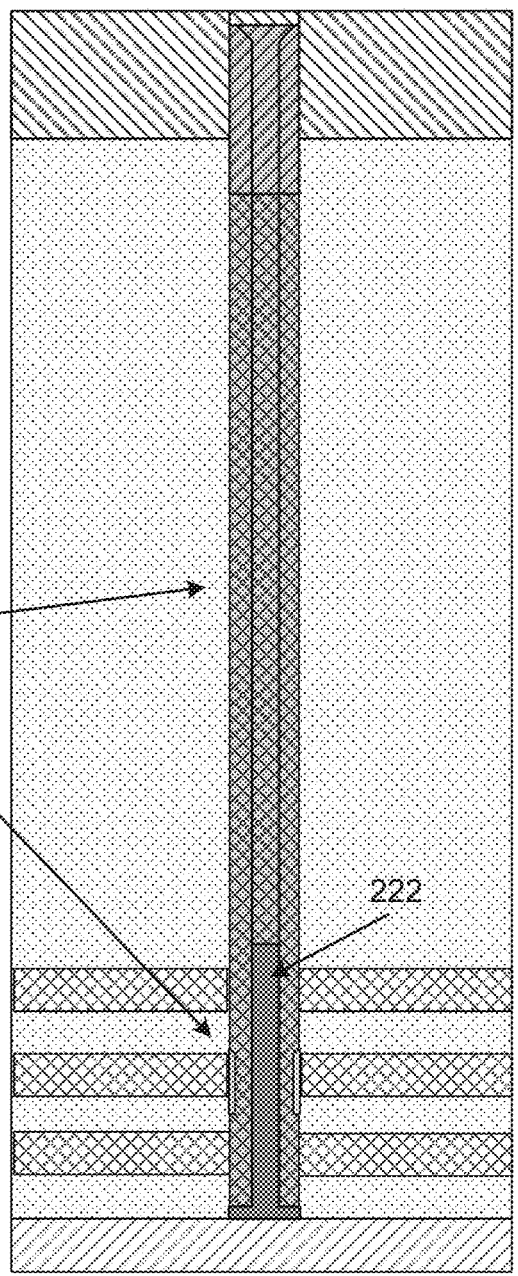
| | | |
|---|---|---|
| ▨ | Base Layer | 104 |
| ▦ | Dielectric 1 | 106 |
| ▩ | Metal 1 | 110 |
| ▨ | Dielectric 2 | 212 |
| ▐ | SiGe | 218 |
| ▩ | Doped Si | 214 |
| ▢ | High-k | 216 |
| ▩ | Dielectric 3 | 220 |
| ▨ | Dielectric 4 | 222 |
CROSS-SECTIONAL VIEW 1502
Column 250
Transistor 260
TOP VIEW 1500
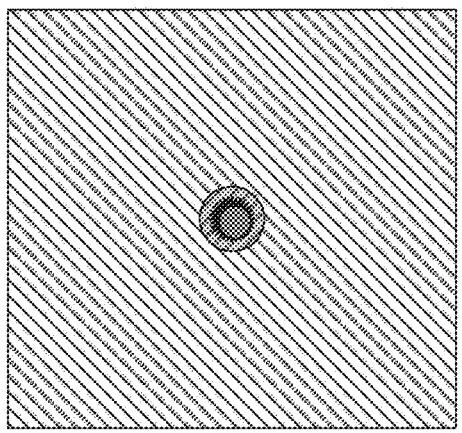
FIG. 15

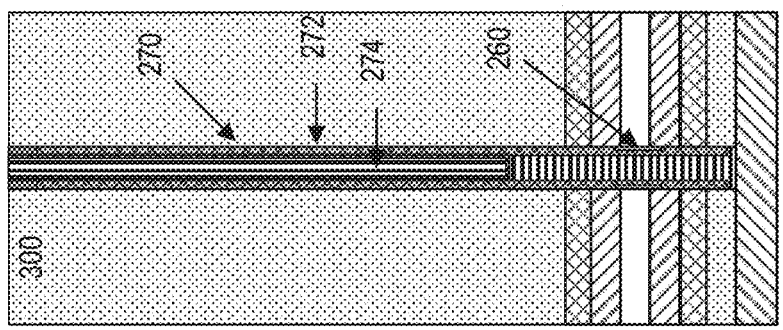
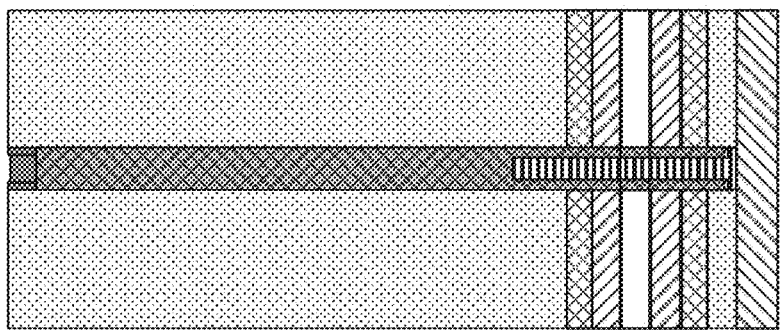
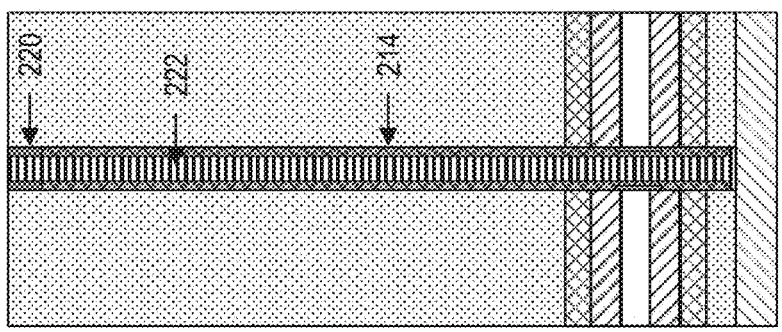
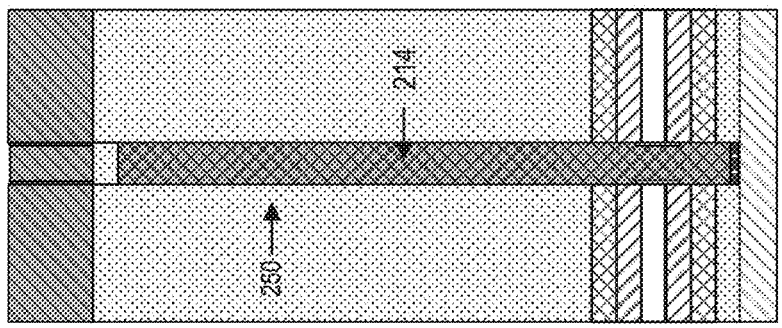
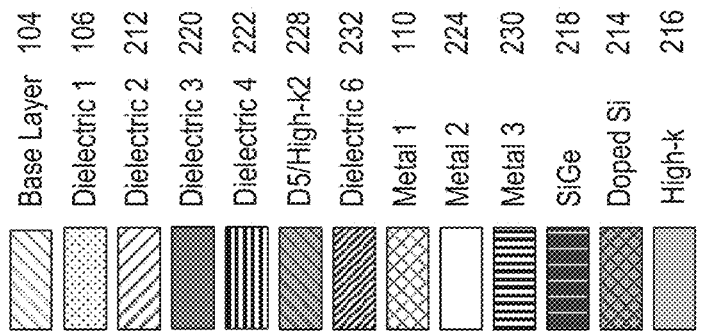

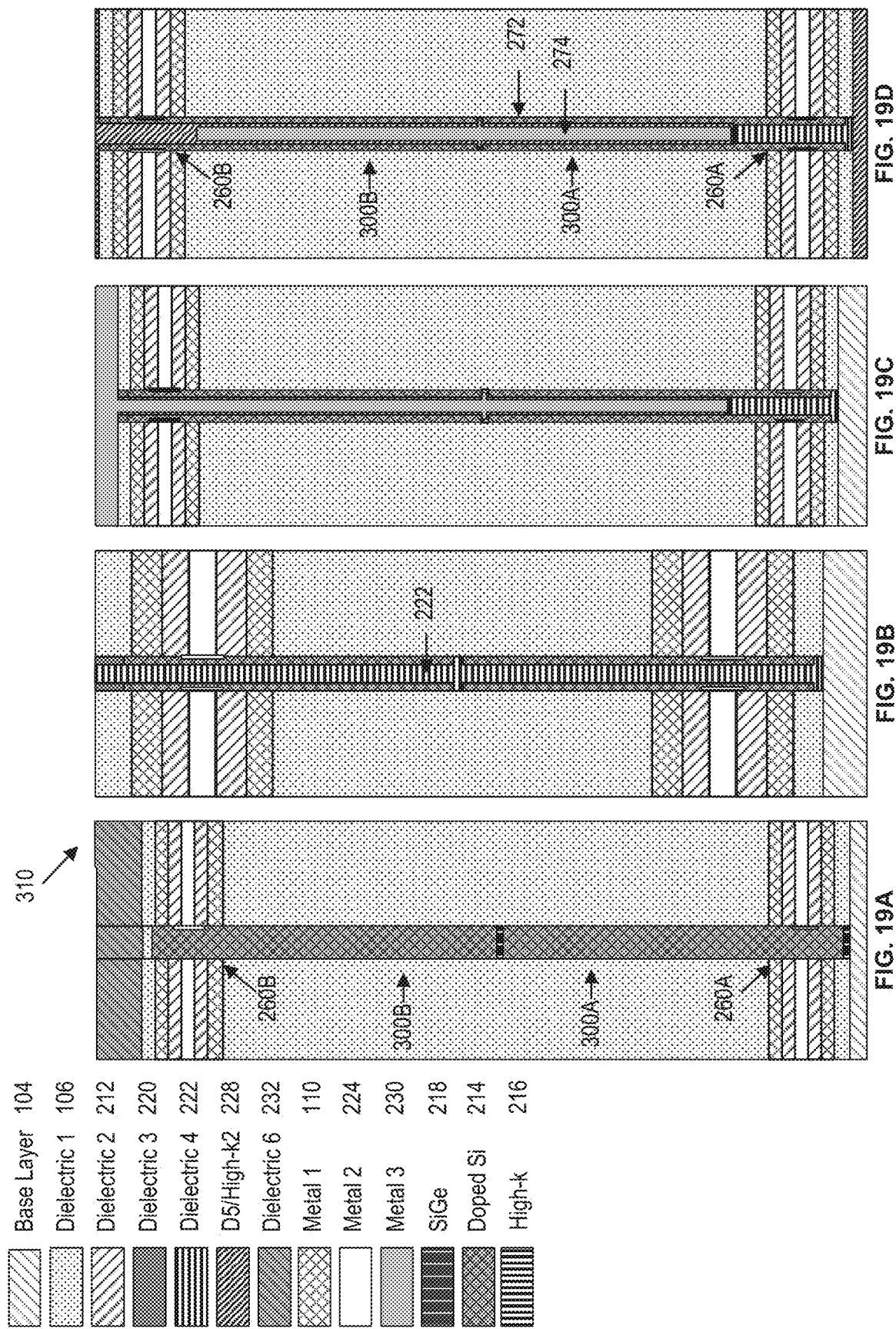

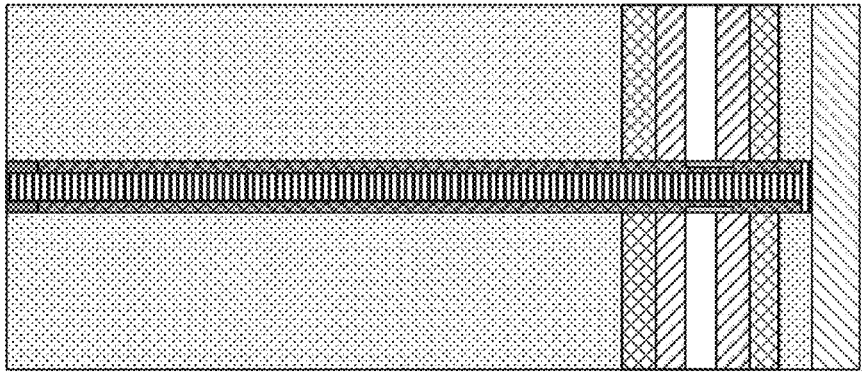
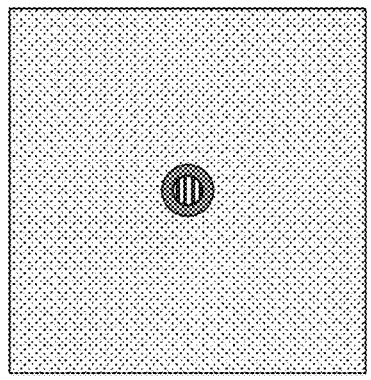
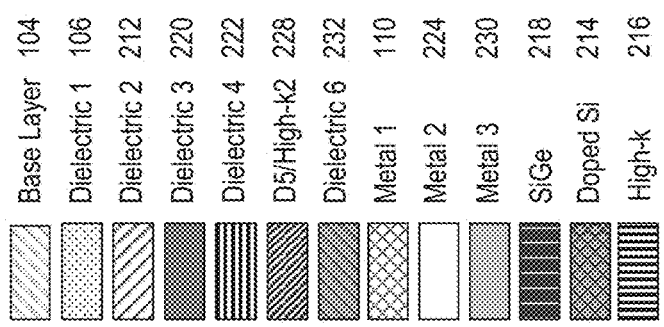
FIG. 22

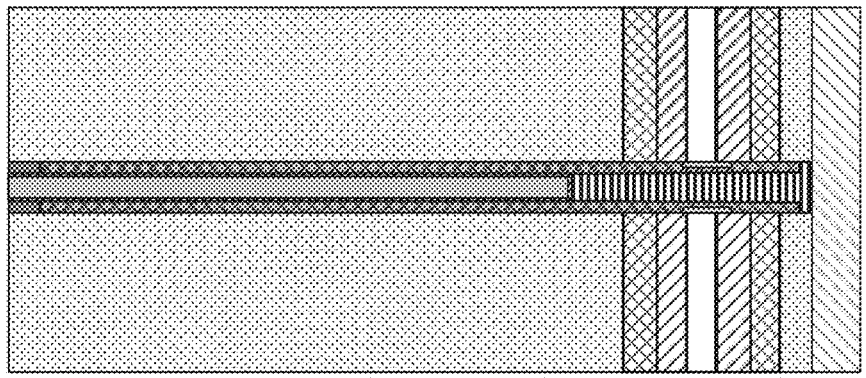
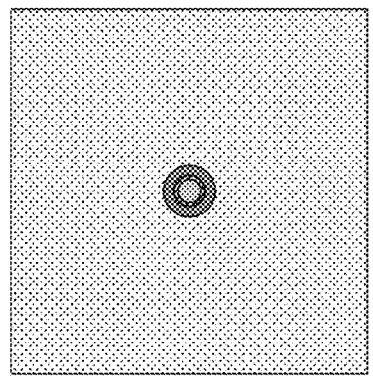
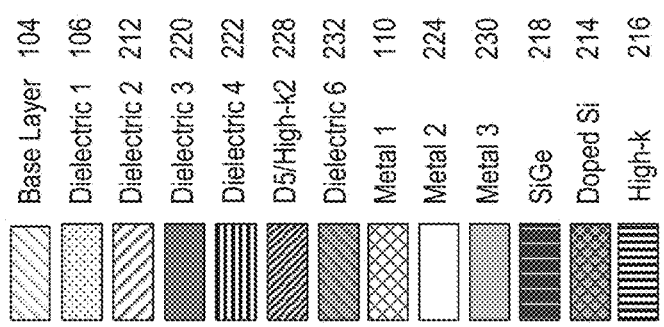
FIG. 24

Method 4200

3D STACKED DRAM WITH 3D VERTICAL CIRCUIT DESIGN

TECHNICAL FIELD

The present invention relates generally to the field of manufacturing semiconductor devices.

BACKGROUND

In modern semiconductor integrated circuit devices, individual memory circuits play an important role. Manufacturing such circuits usually relies on different fabrication processes, such as film-forming depositions, etch mask creation, patterning, material etching and removal, and doping treatments, many of which are performed repeatedly to form desired circuits on a substrate. Conventional fabrication techniques only manufacture memory circuits in one plane, while wiring or metallization can typically be formed above the active device plane. Devices manufacturing using these techniques are typically characterized as two-dimensional (2D) circuits. Although scaling efforts in 2D circuit fabrication have increased the number of transistors per unit area, 2D fabrication techniques remain limited as they are approaching physical atomic limitations with single digit nanometer semiconductor device fabrication nodes. Semiconductor device fabricators have expressed a desire for new solutions in addressing these challenges.

SUMMARY

Three-dimensional (3D) integration can help alleviate limitations of 2D semiconductor device manufacturing by stacking semiconductor devices not only in the plane of the substrate (e.g., X-4 directions), but also in the third dimension (e.g., 2-direction), as well. Vertically arranging semiconductor devices can open new opportunities for semiconductor device manufacturers as 3D circuit fabrication can substantially increase the number of semiconductor circuits per unit area of a substrate.

Typical capacitor-based memory cells, including, for example, dynamic random-access memory ("DRAM"), have been implemented using 2D semiconductor techniques. As a single-bit DRAM cell typically includes a transistor and a capacitor, this circuit is normally implemented using a trench-based configuration, whereby a transistor is disposed on a substrate next to a corresponding capacitor. However, this 2D arrangement requires a DRAM cell to occupy the substrate surface for both the transistor and the capacitor.

To reduce the amount of substrate surface needed to implement a DRAM cell, the present solution can provide a vertically-stacked 3D capacitor-based memory cell design in which a capacitor-based memory cell, such as a DRAM cell, can be implemented on a substrate space that is sufficient for only one vertically oriented device, either a capacitor or a transistor, while still implementing the entire DRAM circuit thereon. This minimized substrate surface for a memory cell becomes even more beneficial in the instances in which multi-bit memory cells can be stacked vertically as multiple memory cells can utilize only the space required for a single device even if the number of vertically-aligned memory cells are formed as a memory cell structure for 2-bit, 4-bit, 8-bit, 16-bit or more. In short, by stacking vertically upwards for a substrate surface, a smaller amount of substrate surface area is being used for one or more memory cells.

Specifically, the present solution can provide apparatuses and methods for making 3D vertically stacked capacitor-based memory cells, such as DRAM cells, in which the at least two semiconductor devices, such as a transistor and a capacitor, are stacked on top of each other (i.e., oriented vertically with respect to the substrate on which the transistor and capacitor are built). The present solution can also provide apparatuses and methods for vertically stacking and integrating multiple memory cells, including 2, 4, 8, more.

The present solution can implement a vertically integrated DRAM cell by providing a vertical field-effect transistor ("VFET") with an elongate rod-shaped capacitor on top or otherwise vertically aligned with the VFET. The VFET can be a vertically-oriented, cylindrical FET. In some implementations, length of the VFET is larger or equal to its width. In some implementations the length of the VFET is smaller than the width. The base of the VFET can have any cross-sectional footprint, such as substantially circular or elliptical, square or triangular, quadrilateral, pentagonal, hexagonal, and so on. The cylindrical VFET can be perpendicular to the substrate and have source, gate, and drain contacts be substantially vertically aligned (i.e., aligned within typical tolerance of manufacturing) above one another.

The capacitor of the vertically integrated DRAM cell can also be cylindrically shaped and vertically-aligned with the transistor. The capacitor can include two parallel and spaced apart metal components for providing capacitance and acting as capacitor plates. The first metal component can be shaped as a rod having an outer surface that can be inserted into or be formed so as to be at least partly inside of an elongate interior cavity and inner surface thereof of the second metal component. A dielectric material layer can be disposed between the outer surface of the first metal rod-shaped component and the interior surface of the interior cavity of the second component into which the first component is formed or inserted. The dielectric material layer can electrically insulate and maintain a distance between the first and the second metal components, thereby forming a capacitor with the capacitance occurring between the first metal component and the second metal component. Completing the capacitor circuit, one of the first or the second metal components can be attached to a ground, while the other metal component can be attached to a source of power, such as a DRAM refresh signal or a write line. The second metal component can also be connected to the source/drain of the transistor, as necessary to complete the DRAM circuit.

Multiple memory cells can be integrated vertically to form multi-bit vertically integrated DRAM memory. This can be accomplished by orienting individual memory cells in pairs, where each cell may be disposed as a mirror image of another, such that a vertically oriented memory cell having a vertical VFET and a vertical capacitor integrated on top of the VFET is connected to or is otherwise vertically-aligned with a second memory cell through the vertical capacitor or a second vertical capacitor mirroring the vertical capacitor on top of which is a VFET of the second memory cell.

In some aspects, the present disclosure relates to a memory, such as a multi-bit DRAM memory cell. One embodiment of a memory may include a column-shaped opening extending through one or more layers of material formed above a substrate, where the column-shaped opening can include a first portion including a first transistor, a second portion including a first capacitor electrically coupled to and extending from the first transistor, a third portion including a second capacitor, and a fourth portion including a second transistor electrically coupled to and extending from the second transistor.

Each of the first and second transistors may include a first source/drain structure extending horizontally from the column-shaped opening, a gate structure above the first source/drain structure and extending horizontally from the column-shaped opening, a second source/drain structure above the gate structure and extending horizontally from the column-shaped opening, where each of the structures are separated by at least one dielectric. A semiconductor material may extend from the first source/drain structure to the second source/drain structure. The semiconductor material may be doped silicon.

The second and third portions can be vertically adjacent to one another, and the first portion may be below and adjacent to the second portion. The fourth portion may be above and adjacent to the third portion.

The first capacitor can include a first electrical conductor, a second electrical conductor, and a dielectric disposed between the first and second electrical conductors. The first and second electrical conductors may be elongated and extending through the column-shaped opening. The second capacitor may include a first electrical conductor, a second electrical conductor, and a dielectric disposed between the first and second electrical conductors, where the first and second electrical conductors may be elongated and extend within the column-shaped opening. The first electrical conductor of the first and second capacitors may be electrically connected to one another, and the second electrical conductor of the first and second capacitors may be electrically isolated from one another.

The first electrical conductor of the first and second capacitors may extend through a central region of the column-shaped opening. The second electrical conductor of the first and second capacitors may extend along a wall defining the column-shaped opening. The first electrical conductor of the first and second capacitors can be electrically connected to an electrical common line. The second electrical conductor of the first capacitor can be in electrical contact with the first transistor, and the second electrical conductor of the second capacitor can be in electrical contact with the second transistor.

The second electrical conductor of the first capacitor and the second electrical conductor of the second capacitor can be separated by a second dielectric.

The dielectric and second dielectric can be different materials from one another, and the first and second electrical conductors can have circular profiles. The first and second electrical conductors can be metal. The first electrical conductor can be metal and the second electrical conductor can be doped silicon.

The first transistor and first capacitor can form a first memory cell, and the second transistor and second capacitor can form a second memory cell.

One method of fabricating a memory may include forming a column-shaped opening extending through one or more layers of materials formed above a substrate. A first transistor can be formed in a first portion of the column-shaped opening to form a first portion of the column. A first capacitor can be electrically coupled to and extending from the transistor in the column-shaped opening to form a second portion of the column. A second transistor may be formed in the column-shaped opening to form a third portion of the column. A second capacitor electrically coupled to and extending from the transistor in the column-shaped opening to form a fourth portion of the column.

Forming the first and second transistors can include forming first source/drain structures of the first and second transistors extending horizontally from the column-shaped opening. Gate structures of the first and second transistors may be formed to extend horizontally from the column-shaped opening. Second source/drain structures of the first and second transistors may be formed to extend horizontally from the column-shaped opening. Each of the structures can be separated by at least one dielectric. A semiconductor material extending from the first source/drain structure to the second source/drain structure of each of the first and second transistors can be formed.

Forming the first capacitor can include forming a first electrical conductor, a second electrical conductor, and a dielectric disposed between the first and second electrical conductors. The first and second electrical conductors of the first capacitor can be elongated and extend within the column-shaped opening. Forming the second capacitor can include forming a first electrical conductor, a second electrical conductor, and a dielectric disposed between the first and second electrical conductors, where the first and second electrical conductors of the second capacitor can extend within the column-shaped opening. Forming the first electrical conductor of the first and second capacitors can include electrically connecting the first electrical conductors of the first and second capacitors to one another. Forming the second electrical conductor of the first and second capacitors can include electrically isolating the second electrical conductors of the first and second capacitors from one another.

Forming the first electrical conductor of the first and second capacitors can include extending along a central axis of the column-shaped opening. Forming the second electrical conductor of the first and second capacitors can include forming the second electrical conductor as a lining along the column-shaped opening. Forming the first electrical conductor of the first and second capacitors can include electrically connecting the first electrical conductor to an electrical common line. Forming the second electrical conductor of the first capacitor can include forming an electrical contact of the second electrical conductor of the first capacitor with the first transistor. Forming the second electrical conductor of the second capacitor can include forming an electrical contact of the second electrical conductor with the second transistor.

Forming the second electrical conductor of the first capacitor and the second electrical conductor of the second capacitor can include disposing a second dielectric between the first and second electrical conductor.

Disposing the dielectric and second dielectric can include disposing dielectric materials that are different from one another. The dielectric and second dielectric can be different materials from one another. The first and second electrical conductors can have circular profiles. The first and second electrical conductors can be metal. The first electrical conductor can be metal and the second electrical conductor can be doped silicon.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings:

FIGS. 1-7 are top, cross-sectional, and perspective views of an example structure and process flow to form a memory using a hollow core ALD metal/liner approach, according to an embodiment;

FIGS. 8-12 are top, cross-sectional, and perspective views of an example structure and process flow to form a memory using a hollow core metal fill approach, according to an embodiment;

FIGS. 13-16 are top, cross-sectional, and perspective views of an example structure and process flow to form a memory using a hollow core doped-silicon-metal capacitor approach, according to an embodiment;

FIGS. 17A-B, 18A-D, and 19A-G are cross-sectional views of an example structure and process flow to form a N=1 or N=2 memory cell, such as a single-bit or a two-bit DRAM memory cell, according to an embodiment;

FIGS. 20-24 are top, cross-sectional and perspective views of an example structure and process flow to form a N=1 unit memory cell using a hollow core ALD metal/liner approach, according to an embodiment.

DETAILED DESCRIPTION

Figure 1:
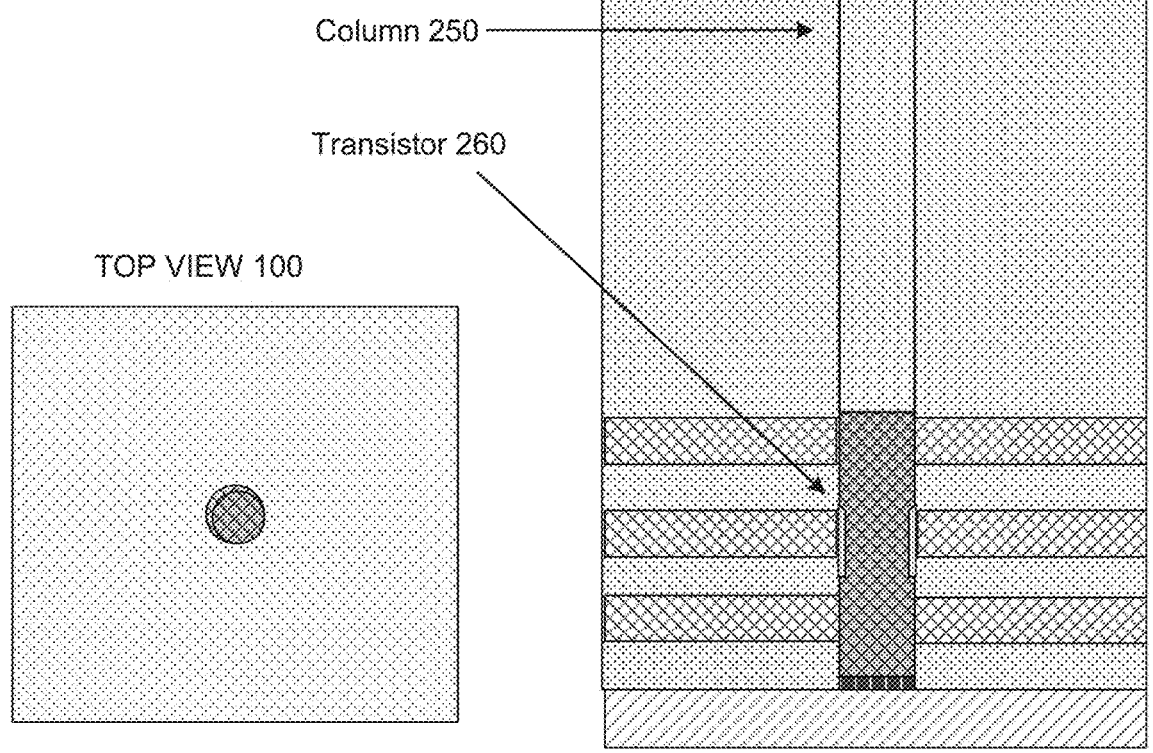

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

It is understood that apparatuses, systems and devices produced by the structures described herein can be used or find their application in any number of electronic devices utilizing structures and/or circuits described herein, such as for example, controllers, memory chips, systems or process on a chip processors, graphics processing units, central processing units and more. For example, structures and/or circuits described herein can include a part of systems utilizing memory, such as any computing systems including for example: computers, phones, servers, cloud computing devices, and any other device or system that utilizes memory devices.

The embodiments described herein may enable an increased stack height of one or more 3D semiconductor devices without requiring epitaxial growth (e.g., an epitaxial semiconductor channel or epitaxial source/drain, etc.). Therefore, a semiconductor substrate is not required, and any base layer material (e.g., glass, plastic, etc.) may be used instead of a traditional silicon substrate. A base layer, however, can be a semiconductor substrate, such as a silicon substrate. In addition, these techniques can be implemented using self-aligned high-k gate dielectric regions in few process steps, using a metal-first design. As such, these techniques provide both efficient flow and low Dt. In addition, such techniques can enable N-high stacks of semiconductor devices, thereby allowing for higher circuit density. Some embodiments include 3D stacks of vertical conductive channel nano sheets in both CFET and side-by-side configurations.

The process flows described herein utilize conductive dielectric materials to form 3D channel regions for the definition of NMOS and PMOS devices without using epitaxial growth. As such, the techniques described herein can be manufactured, or "stacked" on any existing vertically stacked device or substrate, such as metal, plastic, or otherwise, according to various implementations. The present techniques may improve upon other semiconductor manufacturing techniques by increasing the N height of stacked semiconductor devices, such as transistors, thereby providing high density logic. The techniques described herein provide processes to manufacture high-k gate dielectrics with relatively few process steps using a metal first design. Although illustrations herein may show an NMOS device arranged over a PMOS device, alternative configurations may include a PMOS device over NMOS device, NMOS device over NMOS device, PMOS device over PMOS device, or other alternative including one or more NMOS devices or PMOS devices.

The techniques provided herein can utilize conductive dielectric materials (sometimes referred to herein as "conductive channels"), which may have similar properties to semiconductor materials, to fabricate vertical 3D transistors. For example, certain materials, when combined with oxygen, may form new materials that exhibit semiconductor properties (e.g., the material(s) can turn "OFF" with low off-state leakage current, or can become highly conductive under certain circumstances, etc.). Some examples of N-type conductive channels include $In_2O_3$, $SnO_2$, InGaZnO, and ZnO. One example of a P-type conductive channel is SnO.

Dielectric materials used herein can be any material or materials having low electrical conductivity, such as for example one millionth of a mho/cm. Dielectric materials can include, for example, silicon dioxide, silicon nitride, nanoporous silica, hydrogensilsesquioxanes (HSQ), Teflon-AF (Polytetrafuoethene or PTFE), Silicon Oxyflouride. Dielectric materials can also include, for example, ceramics, glass, mica, plastics and oxides of various metals.

High-K dielectric can refer to any material with a higher dielectric constant as compared to the silicon dioxide. For example, high-k dielectric can include hafnium silicate, zirconium silicate, hafnium dioxide, zirconium dioxide, and others.

As described briefly above, the process flows described herein can utilize such conductive channels to from the 3D channel regions of NMOS and PMOS devices without using epitaxial growth. Accordingly, devices fabricated using these techniques can be stacked on any existing vertically stacked devices, thereby greatly increasing the number of stacked transistors N (e.g., 2, 3, 4, 5 10, 20, 50, 100, or more) for high-density logic. At least one implementation is directed to a metal-first layer for fabricating transistors with conductive oxide layers. Such techniques can utilize pre-aligned masks to improve etching the central trench to fabricate the devices. Larger trench masks can be used to reduce litho-misalignment issues. Another technique, whereby solid-filled metal layers are formed prior to etching the central trench, may also be used to reduce alignment issues. However, an etching process that is capable of etching through metal can be used.

Further, various techniques may be implemented to form the high-k barrier between the conductive channels and the gate electrode. One such technique utilizes a gate-recessing technique to provide a uniform layer of doped conductive oxide material, along with a selective deposition of a high-k dielectric to form the transistor gates. Another, similar technique provides a non-selective deposition of the high-k dielectric, in conjunction with self-aligned directional etching. These techniques may also be implemented to fabricate stacked transistors of the same type by utilizing the same conductive oxide for two or more transistor layers. These and other aspects are described in further detail herein.

Reference will now be made to the figures, which for the convenience of visualizing the 3D fabrication techniques described herein, illustrate a substrate undergoing a process flow in both top and cross-sectional views. Unless expressly indicated otherwise, each Figure represents one (or a set) of fabrication steps in a process flow for manufacturing the devices described herein. In the top and cross-sectional views of the Figures, connections between conductive layers or materials may be shown. However, it should be understood that these connections between various layers and masks are merely illustrative, and are intended to show a capability for providing such connections, nor should they be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, although most of the figures show various layers in a circular (ring) configuration, other shapes are also contemplated, and indeed the techniques described herein may be implemented in any shape or geometry. In addition, examples in which two transistors or devices are shown stacked on top of one another are shown for illustrative purposes only, and for the purposes of simplicity. Indeed, the techniques described herein may provide for one to nay number N stacked devices. Further, although the devices fabricated using these techniques are shown as transistors, it should be understood that any type of electric electronic device may be manufactured using such techniques, including but not limited to transistors, variable resistors, resistors, and capacitors.

Referring now to FIGS. 1-7, an example of vertically-integrated 3D capacitor-based memory cell is described along with a number of steps used to form the memory cell. At a high level, FIGS. 1-7 are directed to a hollow core ALD metal/liner approach for creating a vertically integrated 3D capacitor-based memory cell, such as for example a DRAM cell. A hollow core ALD metal/liner approach can utilize, for example, a self-aligned scheme for metal deposition without usage of lithography-based techniques.

By combining and stacking a vertical 3D transistor with a vertical 3D capacitor, higher circuit density of capacitor-based memory cells can be achieved. Features by using this approach can include the fact that the bit lines and/or the word lines of individual memory cells can be routed from any angle (i.e., 360 degree extension from a cylinder infra-structure), which can provide added flexibility with various applications and designs. The present solution can include a hollow core metal/liner approach self-aligned configuration and process for adding a capacitor on top of (i.e., in vertical alignment with) a transistor, such as a transistor implemented using steps illustrated in co-pending U.S. patent application Ser. No. 17/524,668 filed on Nov. 11, 2021, titled 3D High Density Compact metal First Approach for Hybrid Transistor Designs without Using Epitaxial Growth, the contents of which are incorporated herein in their entirety. Each of the FIGS. 1-7 generally refer to one or more process steps in a process flow for creating a 3D vertically-integrated DRAM cell. It is understood that the same, similar or different materials that were used for fabrication of a transistor in connection with the above-identified co-pending U.S. Patent Application can also be used for the fabrication of a memory cell that utilizes a capacitor integrated with the transistor, such as dielectrics, metals, and/or doped semiconductors. For example, FIGS. 1-7 illustrate a vertical channel structure that utilizes epitaxial silicon instead of conductive oxide or 2D materials, although as will be appreciated by one of ordinary skill in the art, these techniques can be used interchangeably for forming a vertical transistor device. As with the other Figures described herein, for the purposes of simplicity and ease of visualization, some reference numbers may be omitted from some Figures.

Referring to FIG. 1, illustrated are a top view 100 and a cross-sectional view 102 of a structure and steps for fabricating a 3D vertically stacked memory cell. Cross-sectional view 102 shows a cross-section of a cavity or column-shaped opening 250 that can be formed, such as by performing one or more directional etching or coring processes inside of one or more layers of material. The column-shaped opening, also referred to herein as a column 250 may be formed and be vertically oriented with respect to a base layer 104 substrate. The cavity or column 250 can extend from a top surface of the structure to the base layer 104. The cavity or column-shaped opening 250 can be formed to have any geometrical shape, such as an elongate cavity having any shape cross-section, including circular (as in a cylinder), oval, rectangular, square, triangular, hexagonal, decagonal, or any other cross section known or used in the industry.

A vertically oriented transistor 260, such as a transistor fabricated using steps associated with the above-identified co-pending U.S. Patent Application, can be located, formed, and positioned in the cavity or column 250. A vertical capacitor (later also sometimes referred to as a capacitor 270) can be formed and be vertically-aligned with the transistor 260 to form a single-bit DRAM cell. The illustrated example transistor 260 can be either an NPN or a PNP transistor, unless indicated otherwise. Likewise, a source/drain structure of the transistor 260 can be either a source or a drain structure, depending on the configuration. The transistor 260 can be a field effect transistor ("FET") whose length along which a source, gate, and drain structure are formed can be oriented vertically with respect to a surface plane of the base layer 104, such as a silicon substrate. When so oriented, the vertical transistor 260 can sometimes be referred to as a vertical FET ("VFET").

Referring to the cross-sectional view 102 of FIG. 1, the base layer 104 can support thereon the vertical transistor 260. The vertical transistor 260 device can include any device created using steps that are the same or similar to those described in connection with the above-identified co-pending U.S. Patent Application. The vertical transistor 260 can include a layer of Silicon Germanium (SiGe) 218 disposed above and in contact with the base layer 104 with a doped silicon (Si) 214 layer grown thereupon. It is understood that a transistor 260 can also be formed in any number of other doped semiconductor materials. For example, layer of SiGe 218 can include doped germanium, gallium arsenide and/or other doped semiconductors that can be used for forming transistors. In this implementation, layer 218 is epitaxially grown on semiconductor base layer 104 and provides a surface for layer 214 to be epitaxially formed, SiGe 218 layer can have a width that is the width of the transistor 260, and therefore can be surrounded by other materials, such as one or more dielectrics. The source, gate and the drain of the transistor can each be connected to three metal leads 110, illustrated as extending orthogonally to the VFET from either left side, the right side, or both. Each metal 110 can be separated from other metals 110 by a layer of dielectric material 106 that, among others, can provide electrical insulation.

In the example illustrated in FIG. 1, a first layer of dielectric 106 is disposed on top of a base layer 104. The dielectric 106 first layer can adjoin the transistor 260 from all sides. Above the dielectric 106 is a first layer of metal 1 (in the legend shown as metal 110), which can form the source/drain contact at the lower end part of the transistor. The contact can be a source or a drain, depending on whether the transistor is N- or P-type. The first layer of metal 110 can include a contact line for providing power to the source/drain contact, where the contact line can contact the source/drain of the transistor from any of the 360 degree angles around the transistor. On top of the first metal layer of metal 110, a second layer of dielectric 106 can be disposed. As presented in the later Figures, the second layer of dielectric 106 can include the same material, such as the dielectric 106 in this case, or different dielectric materials, as desired, and can adjoin the transistor 260 from all sides. On top of the second dielectric layer 106, a second metal layer, which may form a gate structure or contact, can be disposed. The second metal layer can use metal 110 or other electrically conductive materials, as will be described with respect to some structures later. As with the first metal layer 110, the second metal layer 110 can also include or be in contact with an electrical contact line, which can reach the gate from any of the 360 degree directions. At the gate of the transistor 260, between the doped Si layer 214 that forms the VFET 260 and the second layer of metal 110, is a layer of high-K 216 material. Above the second metal layer 110, a third layer of dielectric 106 can be disposed. As with the prior dielectric layers, the third layer can also include the same or different dielectric as the first and/or second dielectric 106. The third dielectric layer, can also adjoin the transistor 260 from all sides. On top of the third dielectric layer a third metal layer 110 can be disposed and form the other source/drain contact for the transistor 260. As would be understood by a person skilled in the art, whether this contact is a source or a drain can depend on whether the transistor is N or P type. Above the third layer of metal 110 is a fourth layer of dielectric 106 that can be disposed. This layer of dielectric 106, which can include the same or different dielectric materials as those used in the prior dielectric layers, can be substantially thicker than the prior dielectric layers. On top of the fourth dielectric layer, a fifth dielectric layer, of a dielectric 2 (in the legend indicated as 212), can be disposed. Dielectric 212 can be the same or a different than dielectric 106, and just as dielectric 106, the dielectric 212 can include any dielectric used in the industry for semiconductor devices, such as those described herein.

At the step illustrated in FIG. 1, a device mask can be used to complete a directional etch from the top surface of the structure and downward through the dielectric layers 212 and 106. The transistor 260 can be constructed using doped Si layer 214 on a base layer 104. The base layer 104 can be a silicon substrate, or any other substrate for fabricating memory. Transistor can be fabricated by epitaxial growth of SiGe 218 and doped Si 214. The dielectric or other material in the cavity or column 250 above the transistor 260 can be removed by an etching process or any other technique for forming an aligned space in the dielectric layers, such as dielectrics 212 and 106. The etched out space above the transistor 260 in the cavity (when empty) or column (when filled) 250 can be used to form or otherwise fabricate a capacitor.

Figure 2:
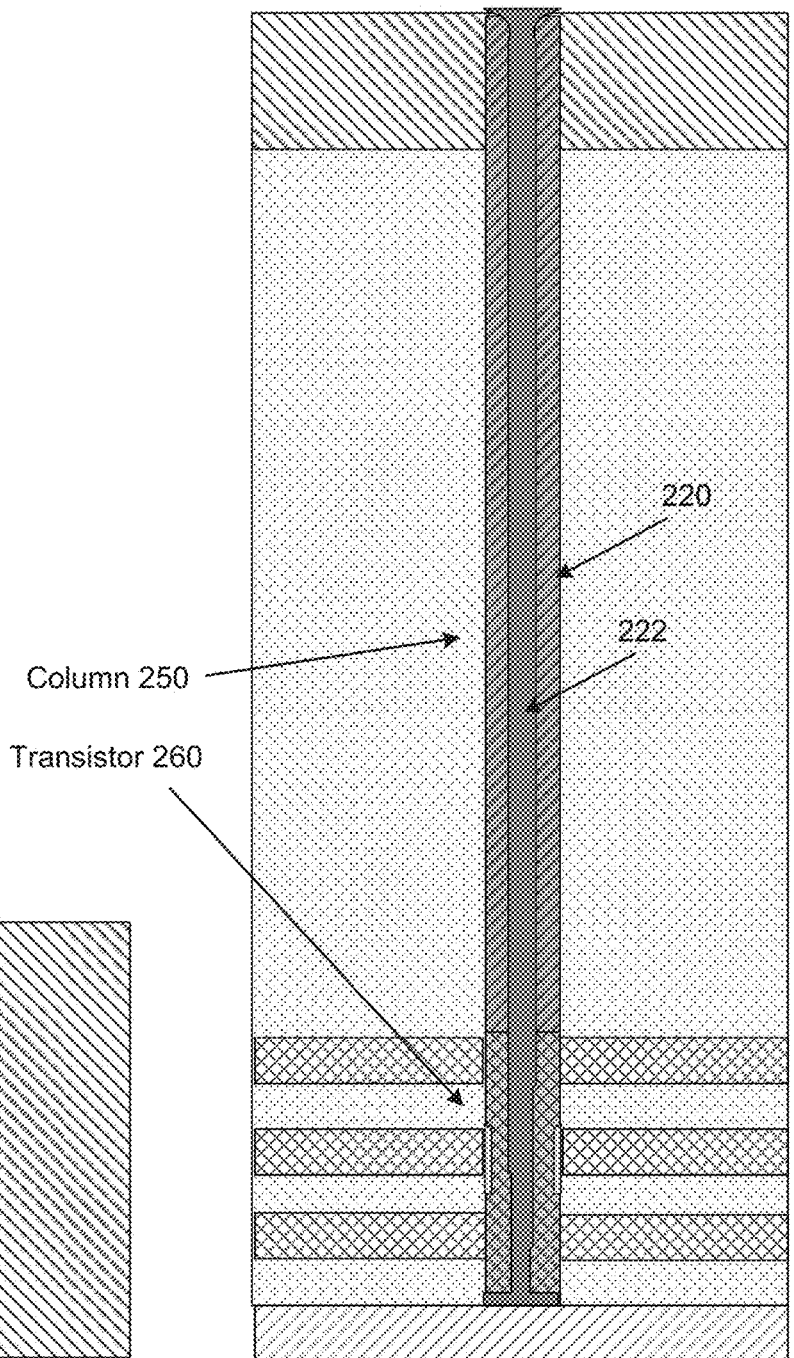

Referring to FIG. 2, illustrated is a top view 200 and a cross-sectional view 202 of the next stage of the process flow in which an ALD process can be used to add a layer of dielectric 3 (identified in the legend as layer 220) at the interior surface of the cavity or column 250. Dielectric 220 can be layered on the inner exposed surfaces of the column 250 above the transistor 260.

After ALD deposition of the dielectric 220, the lining of the dielectric 220 on the walls of the column 250 can serve as a protecting layer, providing a hole through which directional etching can take place downward and through the VFET 260. Because an ALD deposition can produce a layer of material on the sides of the column 250, ALD deposited dielectric 220 can leave an opening that is directed downward through the center of the column 250 that is not covered by the dielectric 220. The vertically aligned opening created by dielectric 220 layer can extend through the column 250 and to the top of the transistor 260. The vertically aligned opening thereby allows for a naturally self-aligned hole through which etching can be implemented directionally downward and through the center of the cross-section of the transistor 260.

Directional etching downward and through the opening the doped silicon 214 of the vertical transistor 260 can be implemented through the vertical length of the doped silicon 214. Directional etching can further be continued through the SiGe 218 (FIG. 1) beneath the transistor 260. The etching step can include any techniques to etch out the SiGe 218 material underneath the transistor 260.

Still referring to FIG. 2, after the SiGe 218 is etched out, a dielectric 4 material (identified in the legend as a dielectric 222), can be deposited through the etched opening defined by the layer of dielectric 220. Dielectric layer 222 can then fill in the entire space that was etched out and/or left empty after etching dielectric layer 220. Accordingly, dielectric 4 222 can fill the interior of the space beneath the transistor 260 and or the base layer 104 that was previously occupied by SiGe 218. Dielectric 222 can also fill the interior of the etched out space in the doped silicon 214. Dielectric 222 can also fill the interior of the space in the column 250 that is above the transistor 260 and that is surrounded by dielectric layer 220. As dielectric 222 can be an electrically insulating dielectric material, depositing the dielectric 222 in the space previously occupied by SiGe 218 can electrically insulate the source/drain at the bottom of the transistor 260 from the base layer 104 to prevent the transistor 260 from shorting to the base layer 104. The dielectric 222 can make the source/drain of the transistor 260 near the base layer 104 electrically insulated from the base layer 104. Once dielectric 222 fills in the gap produced by etching to a top surface of the dielectric 2 222, a CMP process can be done to polish the exposed portions of the dielectric 220 and dielectric 222 on the top surface of the structure.

Referring now to FIG. 3, illustrated is a top view 300 and a cross-sectional view 302 of the next stage of the example process flow, in which dielectric layers 220 and 222 can be selectively etched out. While the dielectric layers 220 and 222 can be etched from inside of the cavity or column 250 above the transistor 260, a portion of the dielectric layer 222 that can be left is the dielectric 222 deposited inside of and beneath the transistor 260. Depending on the characteristics of the dielectric 220 and dielectric 222, different methodologies and etching techniques can be used to selectively remove the dielectrics 220 and 222 without removing or otherwise affecting any other materials, including, for example, doped silicon 214, dielectric 106, dielectric 212, metal 110, or base layer 104.

As dielectric 222 is etched out above the transistor 260, the etching may be tailored to leave a slight recess at a region 262 at the top of the transistor 260, where etching takes out a small part of the dielectric 222 towards the top of the transistor 260. This slight recess at region 262 can leave some of the doped silicon 214 exposed. Leaving the doped silicon 214 exposed via the recess at region 262 can facilitate a stronger electrical contact between the source/drain at the top of the transistor 260 and the electrical contact for the capacitor to be fabricated above the transistor 260.

Referring to FIG. 4, illustrated is a top view 400 and a cross-sectional view 402 of the next stage of the process flow, in which the ALD is used to add a layer of metal 2 (shown in the legend as metal 224). Metal 224 can be added via ALD deposition to form a thin film or a layer on the exposed surfaces inside the cavity or column 250 that is left by the preceding etching steps of dielectrics 220 and 222 in connection with FIG. 3. Because a recess was left exposed at or near the top of the transistor 260, ALD deposited metal 224 can form a layer of metal making an electrical contact with the source/drain portion of the transistor 260 towards the top of the transistor 260. The ALD deposition of the metal 224 can line up the interior walls of the column 250 with a layer of metal 224, while leaving the center of the cavity or column 250 unfilled or open. The deposited layer of metal 224 can serve as one of the two pieces of electrically conductive material storing the charge in a capacitor of the DRAM cell.

Referring to FIG. 5, illustrated is a top view 500 and a cross-sectional view 502 of the next stage of the example process flow, in which an annealing technique can be used to form a layer of silicide 226 at or near the recess left by steps performed in connection with FIG. 3. Annealing can form the silicide 226 between the doped silicon 214 and the metal 224. Silicide layer between the doped silicon 214 and the metal 224 can form an improved ohmic junction between the source/drain of the material and the metal 224 and improve the performance of the memory cell.

Alternatively, not illustrated here, the silicide 226 can be formed by a two-metal deposition, in which one metal deposition can include a metal, such as a metal 224 or metal 110, that can be used for silicidation, and another metal, such as a metal 224 or metal 110, that is not usable for silicidation. In such instances, silicidation metal layer interfacing with the doped silicon 214 can form the layer of silicide 226. The silicide 226 layer formed by deposition of one or more metals for silicidation can include, for example, nickel silicide or titanium silicide.

Referring to FIG. 6, illustrated is a top view 600 and a cross-sectional view 602 of the next stage of the example process flow, in which the ALD is used to add a layer of high-k2 material, indicated as 228. High-k2 228 can be the same or different material than high-k 216. High-k2 228 can include electrically insulating materials so as to prevent charge transfer between the two capacitor plates. High-k2 228, depending on the configuration, can include other dielectric materials instead, including, for example, dielectrics 106, 212, 220, and/or 222. High-k2 228 can form a layer of dielectric electrical insulator between the metal 2 224 and the other metal electrode of the capacitor to be added in the next step. The ALD deposition of the high-k2 228 material can provide a layer of high-k2 228 material on top of the layer of metal 224, while leaving the center of the column hollow or open for the next metal deposition.

Figure 7:
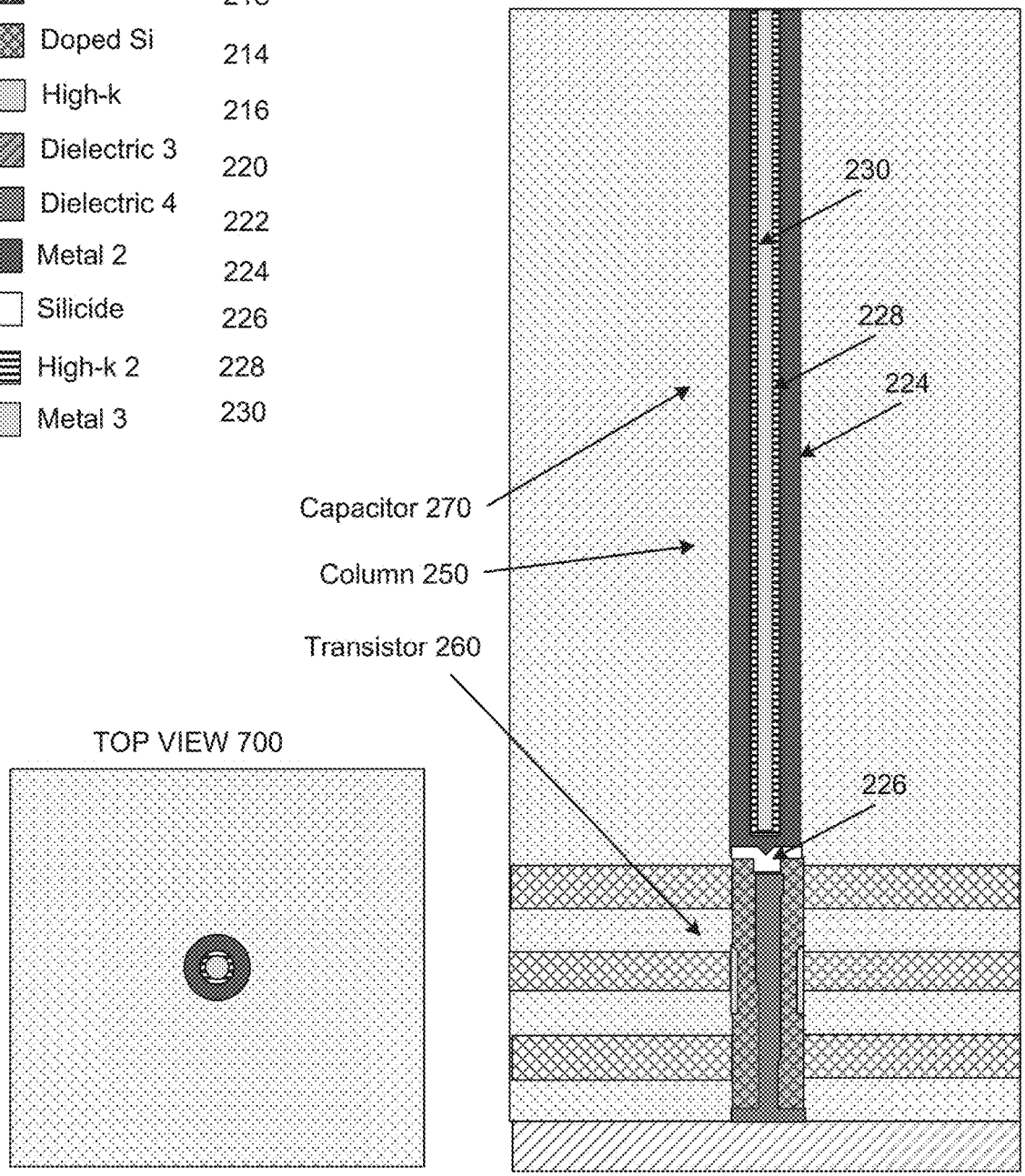

Referring to FIG. 7, illustrated is a top view 700 and a cross-sectional view 702 of the next stage of the process flow, in which the deposition of metal 3, identified as metal 230, can be used fill the remainder of the column 250 within a center column of the high-k2 228. Deposition of metal 230 can be implemented using ALD deposition or any other metal deposition technique. The deposition of metal 230 can fill the center of the column 250, thereby leaving no more open space therein. CMP can be used on the top surface to remove any residual metal 230, high-k2 228 or any other remaining materials, including the entire layer of dielectric 212.

With further regard to FIG. 7, the illustrated structure shows an example of a completed 1-bit memory cell that includes a vertically oriented capacitor 270 vertically aligned and configured with a vertically oriented transistor 260 as part of a vertically oriented cavity or column 250. The capacitor 270 can include the metal 224 outer layer deposited on the outer surface of the cavity or column 250 within which is the deposited thin film layer of the high-k2 228 providing an electrical insulation between the metal 224 and metal 230 the high-k2 228 being extended along the metal 224. The metal 230 deposition can form an elongate and rod-shaped metal 230 that can be disposed inside of the elongate and vertically aligned interior cavity of the metal 224. In some implementations, a dielectric material insulating layer can be used instead of a high-k2 228 layer, such as, for example, a layer of dielectric 106, 212, 220 or 222.

The resulting structure shown in FIG. 7 forms a single-bit memory cell, such as a single-bit DRAM memory cell, that can be formed inside of a vertical cavity or column 250 that includes the transistor 260 and the capacitor 270. The capacitor 270 includes an elongate and vertically oriented metal 224 part that includes an interior cavity that is also elongate and vertically oriented (i.e., aligned along the axis of the vertical transistor 260 and the column 250). The capacitor 270 can also include a second metal part that can be formed by metal 230. The second metal part is an elongate structure that is disposed within the interior cavity of the metal part formed by metal 224. Inside the interior cavity of the metal part formed by metal 224, a layer of high-k2 228 can be disposed to provide electrical insulation between the two metal parts of the capacitor. The transistor 260 can have a drain/source doped Si 214 region, which can be at the top of the VFET and in an electrical contact with the capacitor 270 part formed by metal 224 (e.g., outer column of the capacitor) either directly or via a silicide 226.

Referring now to FIGS. 8-12, an example of a process flow for fabrication of a memory cell using a hollow core metal fill approach is illustrated. The hollow core metal fill approach can implement a same, similar memory cell as the one illustrated in FIG. 7 using a self-aligned process and configuration to etch metal without the usage of lithography. By using a self-aligned process and configuration for etching metal, different fabrication process steps can be implemented to create the same or similar structure to the one illustrated and/or described in connection with FIG. 7.

Referring now to FIG. 8, including its top view 800 and its cross-sectional view 2102, an example process flow illustrated in FIGS. 8-12 can begin after the steps of fabrication described and illustrated in connection with FIG. 3 are completed. Particularly, instead of implementing the ALD of metal 2 layer (shown as metal 224 in the legend) as described in connection with FIG. 4, a metal filling of the metal 224 can be done instead. Metal 224 filling process can result in the entire available space in the vertical cavity or column 250 above the transistor 260 being filled with metal 224. As such, the entirety of the cavity 250 that was not filled with other material can be filled with metal 224

Following the metal 224 filling, the structure in FIG. 8 can be annealed in order to form a silicide 226 between doped silicon 214 and the metal 224. As with the example in FIG. 4, metal 224 filling can include two metals, one of which can be a silicidation metal to form the silicide layer. Following these steps, the resulting structure includes the metal 224, which may be a solid metal that fills the column 250 above the transistor 260 and silicide layer 226 between the doped silicon 214 and the metal 224.

Referring now to FIG. 9, illustrated is a top view 900 and a cross-sectional view 902 of the next stage of the example process flow, a CMP process can be implemented on the top surface in order to remove the surplus of metal 224 on top of dielectric 212. Following the CMP, a top surface of the metal 224 can be briefly isotropically etched to open a small amount of space or recess 252 at the top of the column or cavity 250 to create a height difference between the top surface of dielectric 212 and the top surface of metal 224. Depending on the implementation, different techniques could be used to create the recess 252 of the metal 224 deposition in the cavity 250. The difference in height formed by the recess 252 can be used to create a self-aligned trench for directionally etching metal 224 down the column or cavity 250.

Referring to FIG. 10, illustrated is a top view 1000 and a cross-sectional view 1002 of the next stage of the example process flow, an ALD deposition of a thin dielectric 212 layer can be applied on top of the already present dielectric 212 layer and metal 224. Once a thin layer of dielectric 212 is deposited on top of dielectric 106, a directional etching of the newly deposited dielectric layer 212 can form an opening on top of the recess 252 that was formed in connection with the steps described in FIG. 9. Directional etching through the thin layer of dielectric 212 above the recess 252 can create an opening 254 through the dielectric 212 at the top surface of the metal 224. The opening 254 can have a smaller diameter than the diameter of the cavity or column 250 that is filled with metal 224. The smaller diameter of the opening 254 can be used to directionally etch out a hollow core, or a hollow interior cavity, inside of the metal 224.

Referring to FIG. 11, illustrated is a top view 1100 and a cross-sectional view 1102 of the next stage of the example process flow. A directional etching of metal 224 down through the hole in the dielectric 212 formed in the steps in connection with FIG. 10 above can be used to etch the metal 224 downward and form a hollow cavity in the metal 224.

For instance, once a directional etch from the top surface and directly down through the opening 254 can etch through the middle of the metal 224 that fills the column 250, the opening 254 in the dielectric 212 top layer can be made so as to substantially align with or at the center of the metal 224 column's top surface. Directional etching of metal 224 can then proceed through the opening 254 until the metal 224 filling inside the cavity 250 is hollowed out.

An ALD deposition of a high-K 2 layer 228 may be disposed on the top surface of the structure and on the interior walls of the column 250 to electrically insulate metal 224 and serve as a liner for the capacitor 270 formed with the metals 224 and 230 later in FIG. 12. High-k2 228 layer can be deposited inside of the interior cavity that is formed by etching the metal 224.

Figure 12:
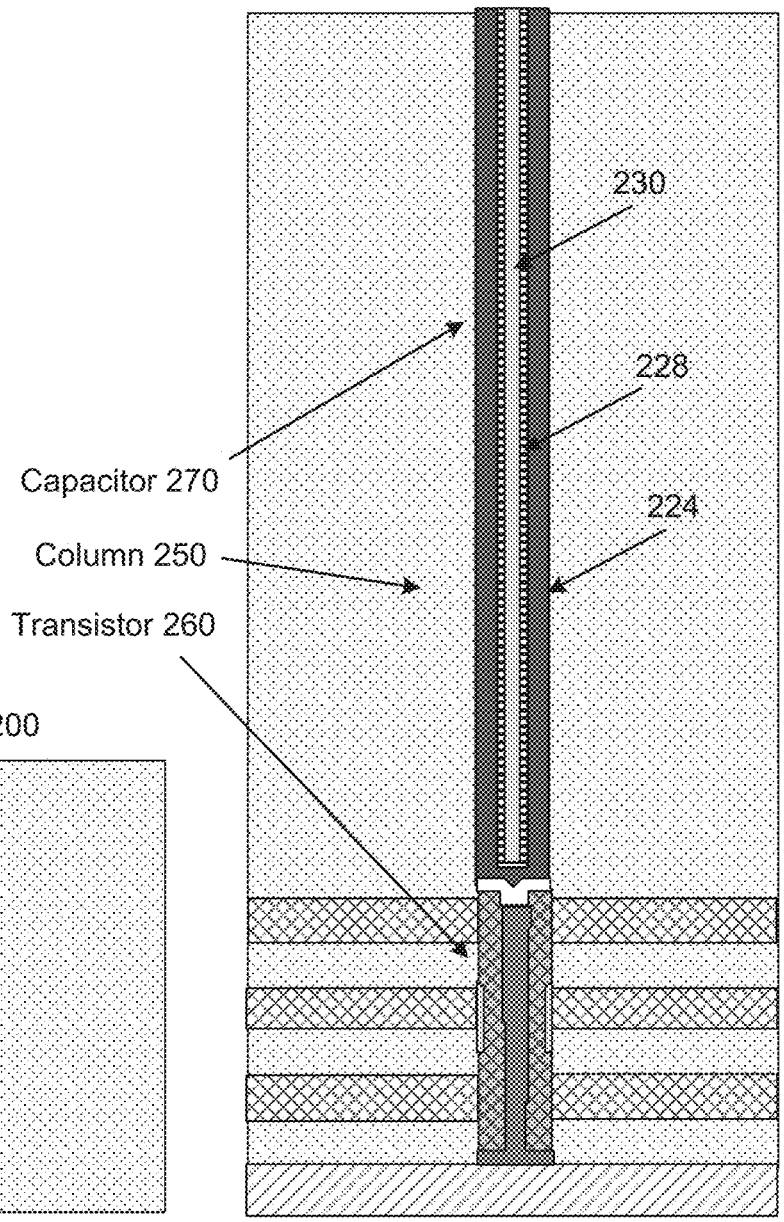

Referring to FIG. 12, illustrated is a top view 1200 and a cross-sectional view 1202 of the next stage of the process flow, in which the deposition of metal 230 can be performed on top of the high-k2 228 layer and used to fill the space inside of the interior cavity of the metal 224. Metal 230 can also fill the remainder of the column 250. Deposition of metal 230 can be implemented using ALD deposition or any other metal deposition technique. The deposition of metal 230 can fill the center of the column 250 including remaining gaps in the column or cavity 250. Once this deposition of metal 230 is completed, a CMP can be used on the top surface to remove any residual metal 230, high-k2 228 or any other remaining materials, including the entire layer of dielectric 212.

The structure provided in FIG. 12 can include the same or similar structure as in FIG. 7. The resulting memory cell can include a vertical column or cavity 250 that includes a transistor 260 above which a capacitor 270 is to be stacked. As in FIG. 7, the capacitor 270 of FIG. 12 can include metal 224 outer layer column forming a first metal part of the capacitor 270 and an elongate metal 230 that can be located inside of the interior cavity of metal 224. The metal 224 and metal 230 can be separated from each other by a high-k2 228 layer that keeps the two metal parts from creating a short circuit with each other, thereby maintaining the capacitance. As with the structure from FIG. 7, in some implementations, an electrically insulating dielectric material other than high-k2 228 can be used for the insulating layer, such as a dielectric 106, 212, 220, and/or 222. The transistor 260 can therefore have a drain/source doped Si 214 region that can be at the top of the VFET and in an electrical contact with the metal 224 (e.g., outer column of the capacitor) either directly or via a silicide 226. The structure in FIG. 12 can therefore be functionally and/or physically the same or similar to the structure in FIG. 7.

Referring now to FIGS. 13-16, an example of a hollow core doped-silicon-metal capacitor approach for creating a vertically integrated 3D capacitor-based memory cell is illustrated. Using this approach, a functionally same or similar structure to the one described in connection with FIGS. 7 and 12 can be implemented, whereby one of the two metal parts acting as the capacitive parallel plates can be used instead of the metal material and include a silicon or any other doped semiconductor can be included.

Referring now to FIG. 13, a top view 1300 and a cross-sectional view 1302 of a memory cell is shown. An example process flow illustrated in FIGS. 13-16 can begin by following the process described in connection with a structure illustrated in FIG. 1. From that point, using epitaxial growth of doped silicon 214 can be continued to a point that is close to the top of the surface of dielectric 106 and just beneath the dielectric 212 layer. Doped silicon 214 can therefore be disposed in or otherwise fill most of the column 250. It is understood that instead of the doped silicon 214, depending on the implementation, any other doped semiconductor that can be grown epitaxially in its stead, including any suitable doped materials described herein or known in the art may be utilized.

Referring to FIG. 14, illustrated is a top view 1400 and a cross-sectional view 1402 of the next stage of the process flow, an ALD deposition of dielectric 220 can be used to create a liner for a self-aligned hollow core to trench. The ALD deposition can be done at the top of the column 250, above the doped silicon 214 layer. ALD deposition at that location can be implemented in a similar fashion as described in the steps in connection with FIG. 2. As in FIG. 2, a dielectric 220 can form a layer around the interior cavity of the column 250. However, this time the layer is formed further upwards in the column 250, above the doped silicon 214 layer. The thickness of the dielectric 220 can control the diameter of the hollow core to be created through etching. Because an ALD deposition can produce a liner that leaves an opening or a gap through the middle of the etched column 250, the liner does not fill or seal the column 250. This liner production process can, in turn, allow for a naturally self-aligned hole through the center of the column of cavity 250 from the top of the column 250 to the top of the transistor 260. The self-aligned hole defined by the liner can then be used for directionally etching further down through the center of the transistor 260.

Directional etching through the column of doped silicon 214 via the opening at the top part of the column 250 provided by the ALD deposited layer of dielectric 220 can enable a straight etch through the doped silicon 214 of the transistor 260 and through the SiGe 218 beneath the transistor. Following etching out of the transistor 260, a dielectric 222 can be deposited through the etched out hole in the transistor 260. Dielectric 222 can then fill in the etched out interior of the space that was previously occupied by SiGe 218. As dielectric 222 can be an electrically insulating dielectric material, depositing the dielectric 222 in the space previously occupied by SiGe 218 can electrically insulate the source/drain at the bottom of the transistor 260 from the base layer 104. In addition, dielectric 222 can fill in the interior of the transistor 260 as well as the interior of the entirety of the column 250 above the transistor that was left open by the dielectric 220. At the end, a CMP can be done to polish the exposed portions of the dielectric 220 and dielectric 222.

Referring to FIG. 15, illustrated is a top view 1500 and a cross-sectional view 1502 of the next stage of the example process flow, in which dielectric layer 222 is selectively etched out from the interior of the cavity or column 250 above the transistor 260. In an embodiment, the only part of the dielectric 222 that can remain is the dielectric 222 layer that is slightly protruding above the transistor 260, as well as all of the dielectric 222 at and below the transistor 260 (i.e., the dielectric 222 in the transistor 260 and beneath the transistor 260 in the space that used to be occupied by SiGe 218). Depending on the characteristics of the dielectric 222, different methodologies can be used to selectively remove dielectric 222 without removing or affecting any other materials, including doped silicon 214, dielectric 106, dielectric 212, metal 110, dielectric 220, or the base layer 104

Figure 16:
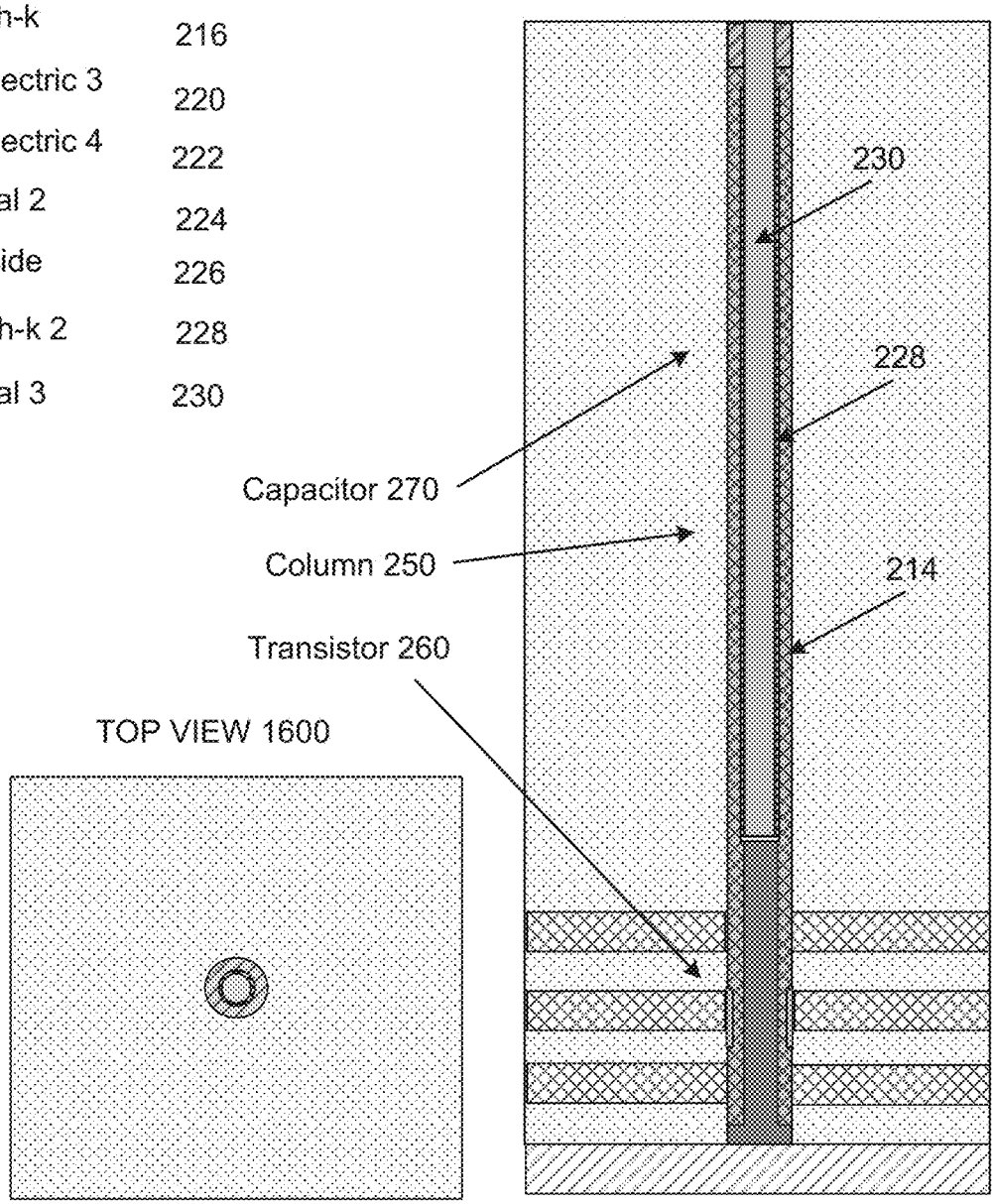

Referring to FIG. 16, illustrated is a top view 1600 and a cross-sectional view 1602 of the next stage of the example process flow in which the construction of the vertical capacitor 270 can be finalized. The process steps in connection with FIG. 16 can include an ALD deposition of high-k2 228 material to form an insulating layer over the exposed doped silicon 214 material left by the etching of dielectric 222. ALD depositing a thin layer of high-k2 228 material can provide an electrically insulating layer between the doped Si 214 and a metal 230 to be deposited on top of the high-k2 228. The process can be completed by a metal deposition of the metal 230 following the ALD deposition of high-k2 228. In some implementations, this process steps completed in this task can include the same or similar steps as described in connection with FIGS. 6 and 16 to deposit the high-k2 228 thin film, followed by a metal 230 deposition. The process steps completed here can also include the same or similar steps as described in connection with FIG. 12. In some implementations the deposition of high-k2 228 material can also be done using a dielectric material, such as dielectric 106, 212, 220, and/or 222. The deposition of the metal 230 can be followed by a CMP to polish the top surface.

Figures 17A, 17B:
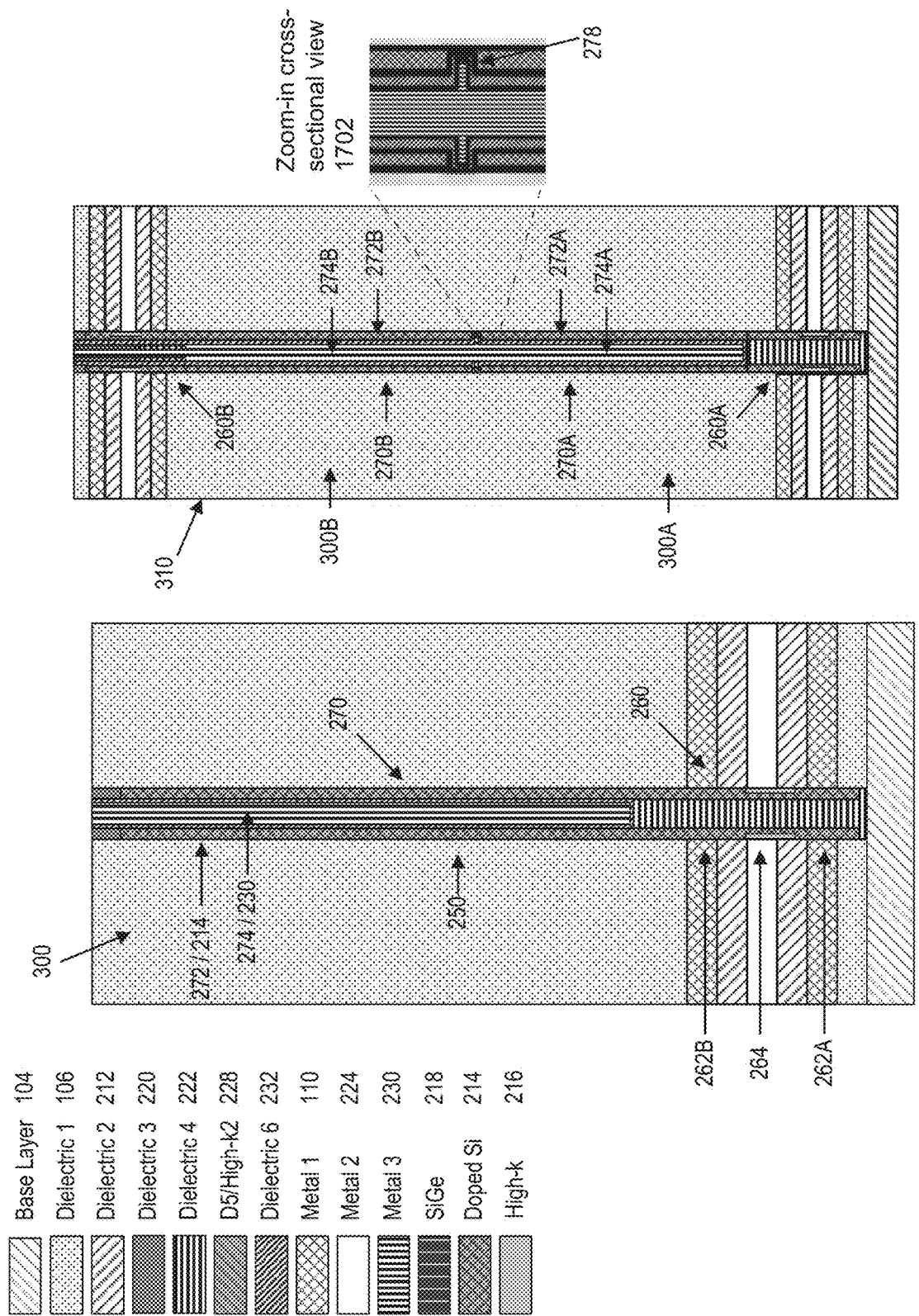

Referring to FIGS. 17A-17B, examples of structures of a single memory cell 300 and a dual memory cell 310 are illustrated. In particular, FIG. 17A shows a single-bit memory structure 300 that can be implemented using, for example, process flow steps and techniques described in connection with FIGS. 13-16. The structure of FIG. 17B can therefore include the structure that is the same or similar to the one illustrated and described in FIG. 16. The illustration in FIG. 17A includes a metal contact 224 for the gate of the transistor 260 instead of the metal 110 in FIG. 16. It is understood however that various metal lines can be used for any contacts of transistors 260.

FIG. 17A illustrates a memory cell 300 along with several of its components and features. A cavity 250 is etched into a material stack including dielectrics and metals and inside of the cavity 250, at its lower end a transistor 260 is formed. On top of transistor 260, a capacitor 270 may be formed. Transistor 260 includes a source/drain 262A, a gate 264 and the second source/drain 262B, which can include the features and functionalities of gates, sources, and drains as previously described herein. In addition, FIG. 17A illustrates a capacitor 270 that can include an outer electrode 272 and an interior electrode 274. The outer electrode 272 can refer to the outer electrically conductive part of the capacitor 270, whereas inner or interior electrode 274 can refer to the interior electrically conductive part of the capacitor 270. Electrode 274 that can be inserted or deposited into a cavity of as defined by electrode 272, so as to be surrounded or enveloped by the outer electrode 272.

FIG. 17B including its zoom-in cross-sectional view 1702B, illustrates an example structure of a multi-bit memory cell 310. While a multi-bit memory cell 310 can include any number of memory cells 300 to form multi-bit memory, the memory cell 310 illustrated in FIG. 17B includes only two memory cells 300A and 300B (collectively 300). A multi-bit memory cell 310 includes a memory cell 300A that is same or similar to the one illustrated in FIG. 17A at the lower part of the cavity 250. Above the memory cell 300A is another memory cell 300B at the upper part of the cavity. Memory cell 300B can include the same or similar memory cell structure and/or functionality as the memory cell 300A and can be vertically and/or axially aligned with the memory cell 300A. In this case, memory cell 300B is inverted with respect to memory cell 300A.

In FIG. 17B, the first memory cell 300A can include a first transistor 260A that can be disposed on the base layer 104 and a first capacitor 270A vertically integrated on the transistor 260A. The capacitor 270A can include an outer electrode 272A and an inner or interior electrode 274A that can be formed in accordance with any of the techniques described herein. The second memory cell 300B can include a second capacitor 270B that can be vertically aligned with the first capacitor 270A. The second capacitor 270B can include the second outer electrode 272B and a second interior electrode 274B. In some aspects, the memory cell 300A and the memory cell 300B share the same interior electrode 274, which can comprise a single piece of material for both capacitors 270A and 270B, thereby making the electrode 274 a common electrode for both capacitors 270A and 270B. The outer electrodes 272A and 272B can be vertically aligned with each other. The inner electrodes 274A and 274B can comprise a single electrically conductive piece of material. In some implementations, both the first memory cell 300A and the second memory cell 300B can share the same interior electrode 274, which can extend through both capacitors 270A-B and both transistors 260A-B of the dual-bit memory cell. On top of the second memory cell 300B is the second transistor 260B. The capacitors 270A and 270B may be electrically separated from one another by disposing a dielectric in a gap 278, as more clearly shown in zoom-in cross-sectional view 1702B in which outer electrode 272A of capacitor 270A is separated from outer electrode 272B of capacitor 270B by an intervening dielectric layer that is disposed or otherwise formed between capacitors 270A and 270B, more specifically between the outer electrodes 272A and 272B. Gap 278 may be filled with dielectric high-k2 228, for example, or other intervening dielectric, such as for example dielectric 232.

At a high level, FIG. 17 memory cells 300A-B can appear similar and mirror images of each other. However, they can include differences due to different constraints in manufacturing the two vertical structures while ensuring that their functional operation is substantially similar or equivalent.

Any of the process steps used for fabricating a multi-bit memory cell 310, such as the one illustrated in FIG. 30B or anywhere else herein, can include any process flow steps, features, or techniques described or illustrated in connection with the patent application titled "Method of Making of Plurality of 3D Vertical Logic Elements Integrated with 3D Memory" which is concurrently filed as a non-provisional application herewith having Ser. No. 17/558,490 (TEL0006-US/210125); the contents of which are hereby incorporated by reference herein in their entirety (hereinafter "Related Patent Application").

Referring now to FIGS. 18A-18D, an example of a process flow for creating memory cells 300 is illustrated. In FIG. 18A, a layer of dielectric 106 can be disposed on a base layer 104. A metal layer 110 can be disposed thereon for an electrical contact to source/drain 262 of a transistor 260. The next layer disposed on the metal layer 110 can include a dielectric 212, on top of which a layer of metal layer 224 can be disposed for connecting to a gate 264. In some implementations, a gate metal line can be omitted, or can be replaced by a dielectric material or a semiconductor doped material. The next layer disposed on the metal layer 224 can include a second layer of the dielectric 212, on top of which can be another layer of metal 110 for an electrical contact to the remaining one of the drain/source 262 of the transistor 260, and on top of which can be a thick layer of dielectric 106. The thick layer of dielectric 106 can include the thickness that is greater than the thickness of all the aforementioned layers, and can be two or more times thicker than all of them together.

Shown in FIG. 18A is doped Si 214 material which can be grown or otherwise disposed in cavity 250 to form a transistor 260. As described in more detail in FIGS. 13-16, a doped Si 214 can be grown in the cavity 250. FIG. 18B can refer to process steps in connection with a description relating FIG. 14, in which a dielectric liner can be created around inner surface of the cavity 250 by a dielectric 220 in order to create an opening for a self-aligned etch downward through the cavity 250. For this purpose, a dielectric 220 is coated at the top of the cavity 250 in FIG. 18B and an etch is performed within a central region of the doped Si 214 and of the SiGe 218, after which a layer of dielectric 222 can be deposited in the etched out regions. FIG. 31C depicts an etch process in which dielectric 222 can be removed from the cavity 250 above the transistor 260, in order to create the space for materials to form the capacitor 270. FIG. 18D depicts steps of depositing the high-k layer 228 to provide an electrical insulating liner between the inner electrode 274 and the outer electrode 272. FIGS. 18A-18D therefore relate to steps and techniques described in connection with FIGS. 13-16.

Figure 19G:
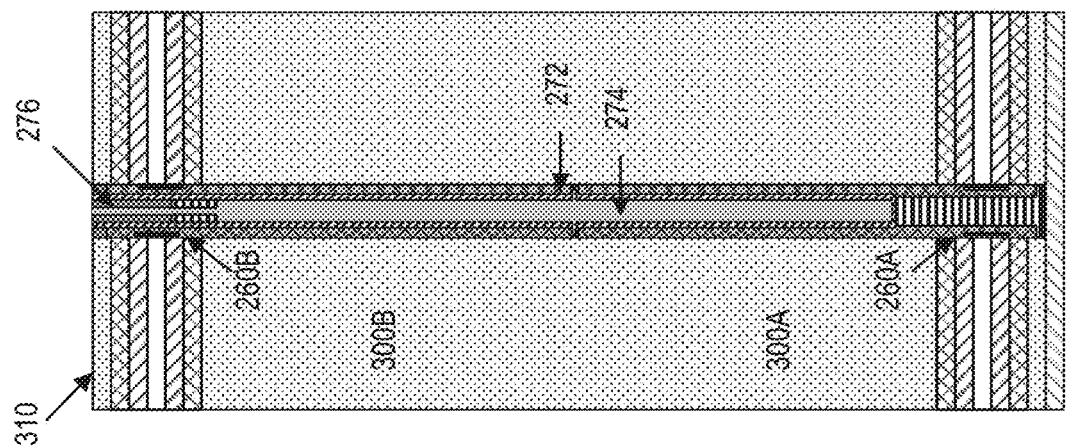

Referring now to FIGS. 19A-19G, an example process flow for making a 3D stacked vertically oriented 2-bit memory cell 310 is illustrated. In FIG. 19A, a layer of epitaxially grown doped Si 214 can be formed within a cavity 250 that is sufficiently deep so as to can accommodate two memory cells 300A and 300B. Techniques described in connection with FIG. 13 can be used to implement for doped Si 214 application through both memory cells 300. A doped N-type epitaxial material can be applied starting from beneath the first (lower) source/drain area of the first transistor 260A the doped N-type epitaxial material can continue through the transistor 260A and upwards towards capacitor 270A area and into and through the capacitor 270B area and into and through the transistor 260 near the top of the cavity 250. However, between the capacitor 270A and 270B, Si 214 can be stopped and a thin layer of SiGe 218 can be applied. SiGe 218 can also be applied to a layer beneath the transistor, before doped Si 214 application begins.

In the event that the transistor 260A is an NPN transistor, an N-type doped material can be used around the first (lower) source/drain contact 262 and then around the gate area 264 a slightly doped P-type epitaxial layer can be applied. The epitaxial layer can then be reversed into an N-type dopant for the second source/drain contact 262, which remains the unchanged dopant through the areas for capacitors 270A, 270B and into the transistor 260B for the first (lower) source/drain of capacitor 260B. At that point, assuming the transistor 260B is N-type also, the doped Si can include a slightly P-type doped material until the gate 264 of transistor 260B is complete Thereafter, the dopant becomes N-type again until the epitaxial layer completes the remaining source/drain for the transistor 260B. In the event of a PNP configuration, a reversed dopant order from the NPN dopant described above, can be completed for the entire doped Si 214 application.

When an electrode 272 is formed with a doped Si by making the Si with the same type dopant as the source/drain to which the Si connects, the electrode can remain in an electrical contact with the outer electrode of the capacitor. Thus, the electrode 272 can be integrated with the capacitor and so when a ground-connected electrode 274 is brought in its proximity to form a capacitor, the resulting circuit can include a transistor and a capacitor DRAM cell 300.

SiGe 218 material layers allow for creation of electrical open circuits, or electrical insulations, between various electrically conductive components. Therefore, in order to allow a subsequent electrical insulation between the capacitors 270A and 270B, a thin layer of Si 214 can be applied in between two applications of doped Si 214, allowing for subsequent selective etching of SiGe 218, while keeping the doped Si 214 intact. This allows for separations between two pieces of electrically conductive doped Si 214 structures. Therefore, while applying doped Si 214, the doped Si 214 application can be stopped to implement a layer of SiGe 218, after which Si 214 can continue being grown until it completes the structure as illustrated in FIG. 19A. The SiGe 218 provides electrical isolation between the two capacitors 270A and 270B. Similarly, a layer of SiGe 218 can be applied to the base of the transistor, before the Si 214 growth starts or anywhere else where an electrical insulation inside the cavity 250 is needed.

FIG. 19B illustrates an example of process flow steps described in connection with FIG. 14 as the steps apply to multiple memory cells 300 being implemented. As described in a greater detail in connection with FIGS. 2 and 14, FIG. 19B illustrates the steps of etching directionally downward through a hole created by a layer of dielectric material that is ALD deposited. For example, a layer of dielectric 220 can be ALD deposited around the interior of cavity 250 after which a directional etch can be implemented down through the opening created by the film of material on the side walls of the cavity 250. In doing so, a self-aligned hollow core to trench the cavity 250 can be implemented. Based on the thickness of the ALD deposition, a particular diameter through-hole for etching can be made, and so the diameter of the etch can be controlled.

The doped Si 214 as well as the SiGe 218 can then be etched through the opening created by the dielectric 220 liner. The etch removes the central part of the doped Si 214 in the center of the cavity 250, leaving un-etched the parts of the doped Si 214 that are abutting the walls of the interior cavity 250. SiGe 218 can be etched entirely during this process.

As a result, the portion of cavity 250 that is etched out can then be filled with dielectric 222.

Then the surplus of the dielectric 222 can be etched out, leaving only the dielectric 222 in the central portion of the transistor 260A at the base of the cavity 250 and some small amount of dielectric 222 just above the transistor 260A.

FIG. 19C illustrates an example of process flow steps that were previously described in connection with FIG. 15 as the steps apply to a multi-bit memory cell fabrication. In FIG. 19C the etched out part of the cavity 250 can be aligned with a high-k2 228 liner forming a thin film of insulating material between the doped Si that was not etched (i.e., the outer electrode 272 of the capacitor 270) and the inner electrode 274 to be built in the upcoming steps with a metal deposition on top of the liner. Steps or techniques done in FIG. 19C can be done using the same or similar steps or techniques implemented in FIG. 16.

An electrode for a capacitor can have its capacitance affected by surrounding electrical signals. For example, an electrode 274 inside the transistor 260B of the memory cell 300B can be susceptible to surrounding signals and/or their electric fields, including for example signals from a source/drain 262 or a gate 264. To prevent any such interferences, an electrode 274 inside of a transistor 270B can be thinned out so that the electrode 274 maintains the electrical contact needed for its operation, but by a reduced cross-section, reduces interference from the coupled surrounding electrical signals. Addressing this issue in FIGS. 19D-19F, process flow steps are provided that can protect the capacitors 270 from interferences from surrounding circuits or features.

At FIG. 19D, the metal electrode in the upper (second) transistor 260B can be etched down and as described in connection with FIGS. 2 and 14. The depth of the metal etch from the top surface of the cavity 250 can be controlled so as clear the transistor 260B and etch the metal out to just beneath transistor 260B. After clearing out the metal 230 from the transistor 260B, a layer of high-k2 228 liner can be ALD deposited, thereby providing an electrical insulation layer.

This particular high-k2 228 liner can be substantially thicker in this ALD deposition than along other parts of the capacitor 270 structure. For example, the thickness of high-k2 228 deposition in the cavity left out by the etched out metal 230 in FIG. 19D can be 2, 3, 4, 5, 6, 7, 8, 9, 10, 11, 12, 13, 14 or 15 times the thickness of the high-k2 228 liner between the 272B and 274B electrodes of a capacitor 270B. In some implementations, the thickness of the high-k2 228 deposition at this step in the process can be anywhere between 2 and 20 times thicker than the thickness of the high-k2 228 liner disposed between electrodes 272 and 274 in the capacitor 270 structure. For example, if a high-k2 228 liner between the two electrodes of a capacitor is normally 10 nm thick, then the high-k2 228 liner in the cavity where from the metal was removed in FIG. 19D can be between 30-200 nm thick, such as for example, 40 nm, 50 nm, 60 nm, 80 nm, 100 nm, 150 nm or 200 nm.

Also, the thickness of the high-k2 228 liner can also be significantly thicker as compared to the gate high-k 216 at the gate of the transistor. For example, the high-k2 228 liner in FIG. 19 can be 6, 8, 10, 12, 15 or 20 times thicker than the high-k 216 film at the transistor gate. Creating a relatively thicker layer of insulating material in the transistor 260B, can help reduce the electrical interference impact on the inner electrode 274.

Figure 19F:
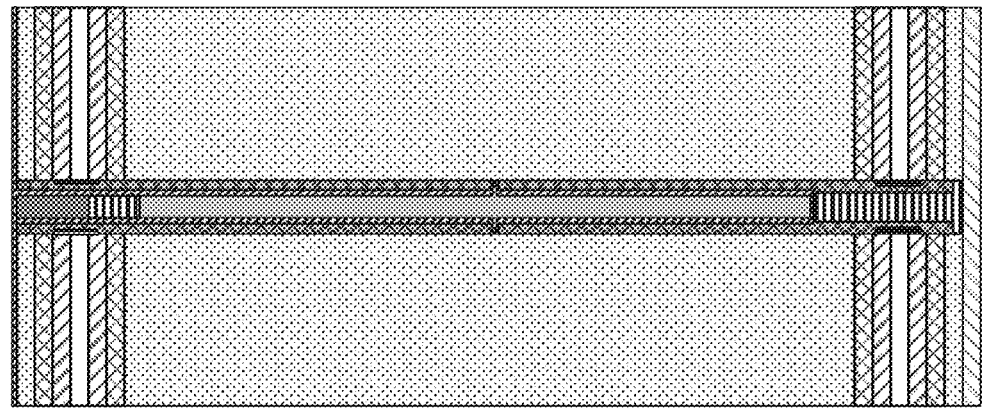
Figure 19E:
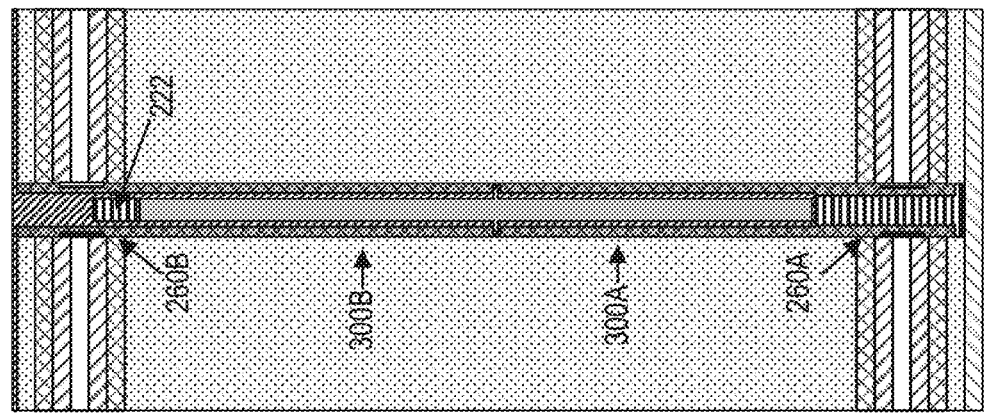

FIG. 19E illustrates an example of process flow steps for depositing a layer of dielectric 222 on top of the electrode 274 whose portion in the transistor 260B had been etched out. The thickness of the dielectric layer 222 deposited can be such that the top of the deposited layer can clear the lower source/drain of the transistor 260B. The deposition of the dielectric layer 222 can be complete when the layer reaches near or at the gate 264 of the transistor 260B.

FIG. 19F illustrates an example of process flow steps for directionally etching using a self-aligning opening created by an ALD deposition of a dielectric 220, such as for example the one provided in FIG. 2. Using the technique illustrated there, an opening for self-aligning of an etch can be created above the dielectric 222 so as to enable a downward etch of a diameter that is substantially smaller than either the cross-section of the electrode 274 inside the capacitor 270 or the cavity 250. The narrower opening created by the etch can then be used to provide a reduced diameter electrical contact for the electrode 274 to the ground signal, the power signal or any other signal desired by the design. In the case of a standard DRAM cell, that can be a ground contact.

FIG. 19G illustrates an example of process flow steps for ALD deposited dielectric liner technique described in connection with FIGS. 2 and 14. For example, an ALD deposition of dielectric 220 can be implemented so as to coat the exposed surfaces in the cavity 250 above the deposited dielectric 222. The opening that is created by the ALD depositions of dielectric 220 can then be used to directionally etch and create a self-aligned hollow core to trench through dielectric 222 a reduced diameter contact 276 for the capacitor electrode 274. The reduced diameter contact 276 can pass through the etched narrow openings in dielectrics 220 and 222 that have a diameter that is a fraction of the diameter of the electrode 274 that is coupled with an electrode 274 to form a capacitor 270. For example, the reduced diameter opening can have a diameter that is up to 90%, 80%, 70%, 60%, 50%, 40%, 30%, 20%, 10%, 5% or 1% of the diameter of the cavity 250 or of the electrode 274 inside of the capacitor 270.

FIG. 19G illustrates an example of process flow steps for filling with metal the reduced diameter contact 276 to create an electrical contact with the electrode 274. By filling in the reduced diameter contact 276 with metal, the interior electrode 274 for both the first and the second capacitors 270A-270B can now be connected through the top surface of the structure, to a power line, a common or a ground, without being vulnerable to interference from signals of transistor 260.

FIGS. 19A-19G show an example process flow, steps and techniques for creating a 2-bit capacitor-based memory cell 310 using 3D VFET structures integrated with vertical capacitors. For example, a multi-bit DRAM memory cells can be implemented using a first transistor 260A at the bottom of a stack on top of which a vertical capacitor 270A can be integrated, thus forming a memory cell 300A. The memory cell 300A can then be integrated with the memory cell 300B on top of it by integrating a vertical capacitor 270B of the memory cell 300B on top of the capacitor 270A of the transistor 270A. On top of the capacitor 270B, the second transistor 270B can be integrated. This design however can include one or more steps for reducing effects of surrounding electrical signals on the shared interior electrode 274 by positioning transistor 260B on top of the capacitor 270B. Such effects can be reduced by thinning out the cross-section of the shared interior electrode 274 as the electrode 274 passes through transistor 270B.

Referring now to FIGS. 20-24, an example of a hollow core ALD metal/liner approach for creating a vertically integrated 3D capacitor-based single-bit memory cell 300 is illustrated. Using this approach, 3D stacked DRAM with 3D vertical design for single-bit memory cells 300 can be achieved using self-aligned scheme for metal deposition without lithography. For example, the same or similar approach that was described in connection with FIGS. 1-7 herein, can also be used for fabrication of single-bit memory cells 300. It is understood that other approaches for fabrication of vertical transistors, capacitors, or memory cells 300 described in the Related Patent Application can also be used as alternatives to this example, including all structures, techniques, process flows, methods of fabrication, and any other subject matter presented therein.

Figure 20:
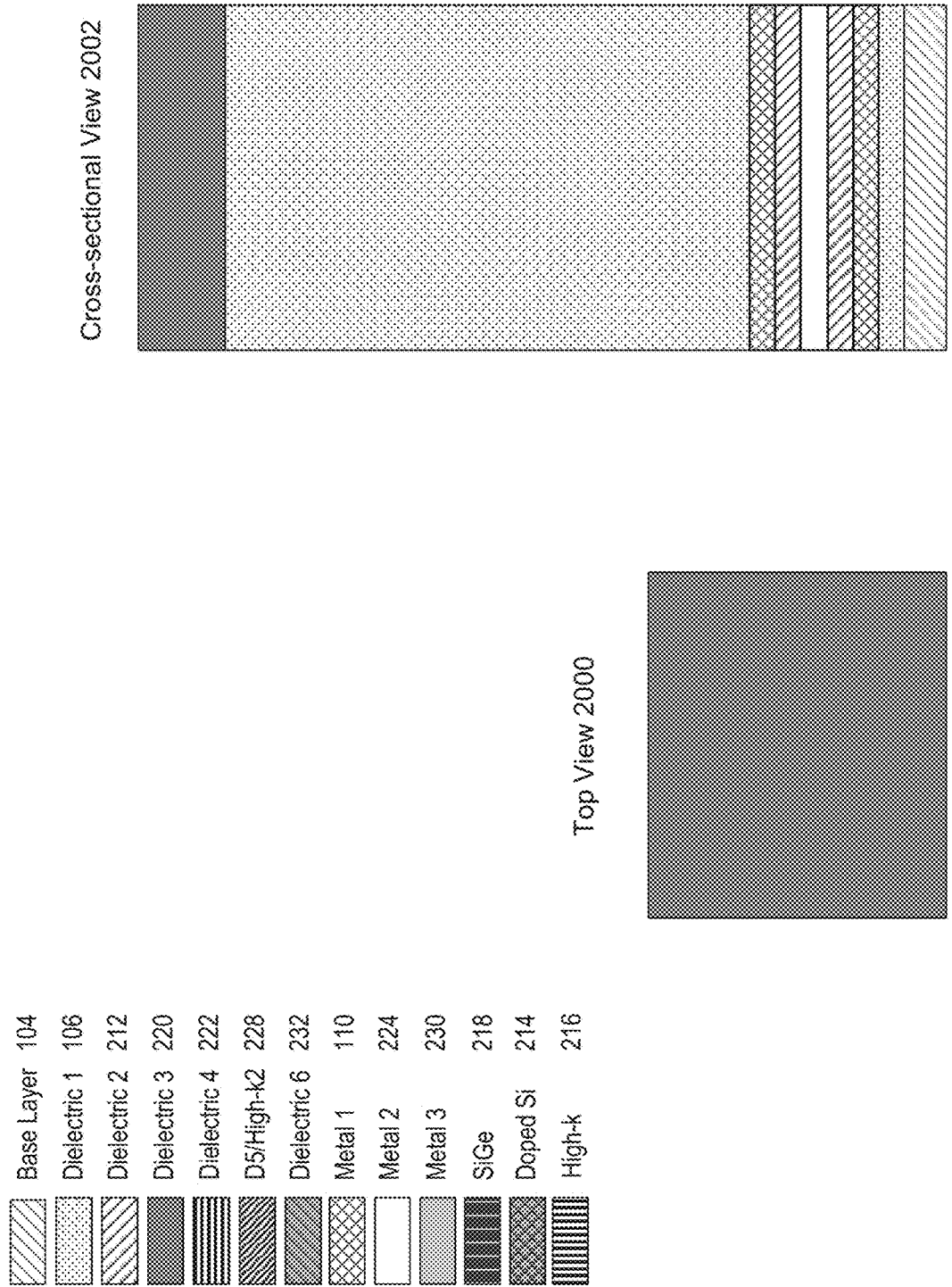

Referring now to FIG. 20, including its top view 2000 and its cross-sectional view 2002, illustrated is an example material stack in which memory cells 300 can be fabricated. In brief overview, FIG. 20 shows a base layer 104, which can include any substrate, including a semiconductor substrate, such as a silicon substrate, a glass substrate, a metal substrate, or any other material on which dielectric 106 can be disposed. Dielectric 106 can be a first layer of material disposed on base layer 104. The next layer of material thereon can include a metal 110 layer, which can include metal leads or contacts for transistors 260, such as to a source/drain 262. The next layer can include dielectric 212, on top of which a layer metal 2 (in the legend indicated as metal 224) can be disposed. Metal 224 can form an electrically conductive contact to the gate 264. Above metal 224, the next layer can include dielectric 212, on top of which can be a layer of metal 110 for an electrical contact to the top source/drain 262. On top of that, there can be a layer of dielectric 212 on top of which can be a layer of dielectric 106, which can be at least as thick as or 2, 4, 6, 8, 10, 15, 20, 30, 50 or more times thicker than any of the prior layers of material. At the top of dielectric 106 layer, a layer of dielectric 220 can be disposed.

It is understood that the layers of dielectric materials can each include or be replaced with, any other dielectric layers or material described herein. It is likewise understood that any metal layers described herein can include or be replaced with any other metal layers or materials described herein. It is also understood that any metal layers of materials can include or be replaced with any doped semiconductor described herein, and vice versa.

Figure 21:
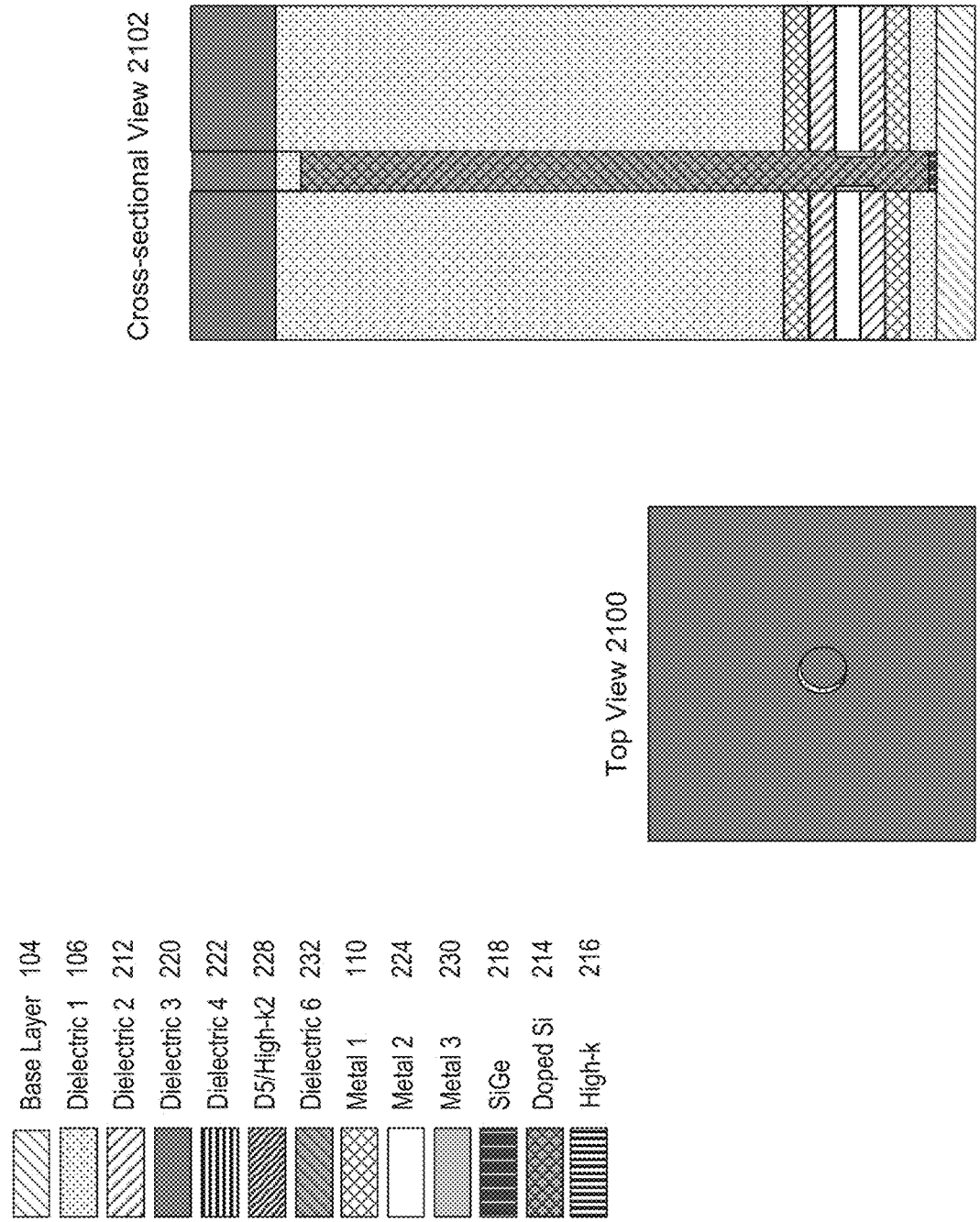

Referring to FIG. 21, illustrated is a top view 2100 and a cross-sectional view 2102 of the structure and the next stage of the example process flow in which device mask can be used to directionally etch the dielectric layer for epitaxial growth of the doped silicon 214. The epitaxial growth can include the growth of SiGe 218 and Si 214. The doped device can be fabricated by epitaxial growth of SiGe 218 and doped Si 214 on silicon substrate 104, or any other substrate described herein. Doped Si 214 can be grown, for example, using techniques described in connection with FIG. 13

Referring to FIG. 22, illustrated is a top view 2200 and a cross-sectional view 2202 of the structure and the next stage of the example process flow in which an ALD deposition of dielectric 220 can be deposited on the interior surface of cavity/column 250 and directionally etched to create self-aligned hollow core to trench the device as, for example, described in connection with FIG. 2 or 14. The etching can form a core in the central portion of the doped silicon 214 and remove the SiGe 218. Following these steps, the etched out space can be filled with dielectric 222, followed by a CMP step.

Figure 23:
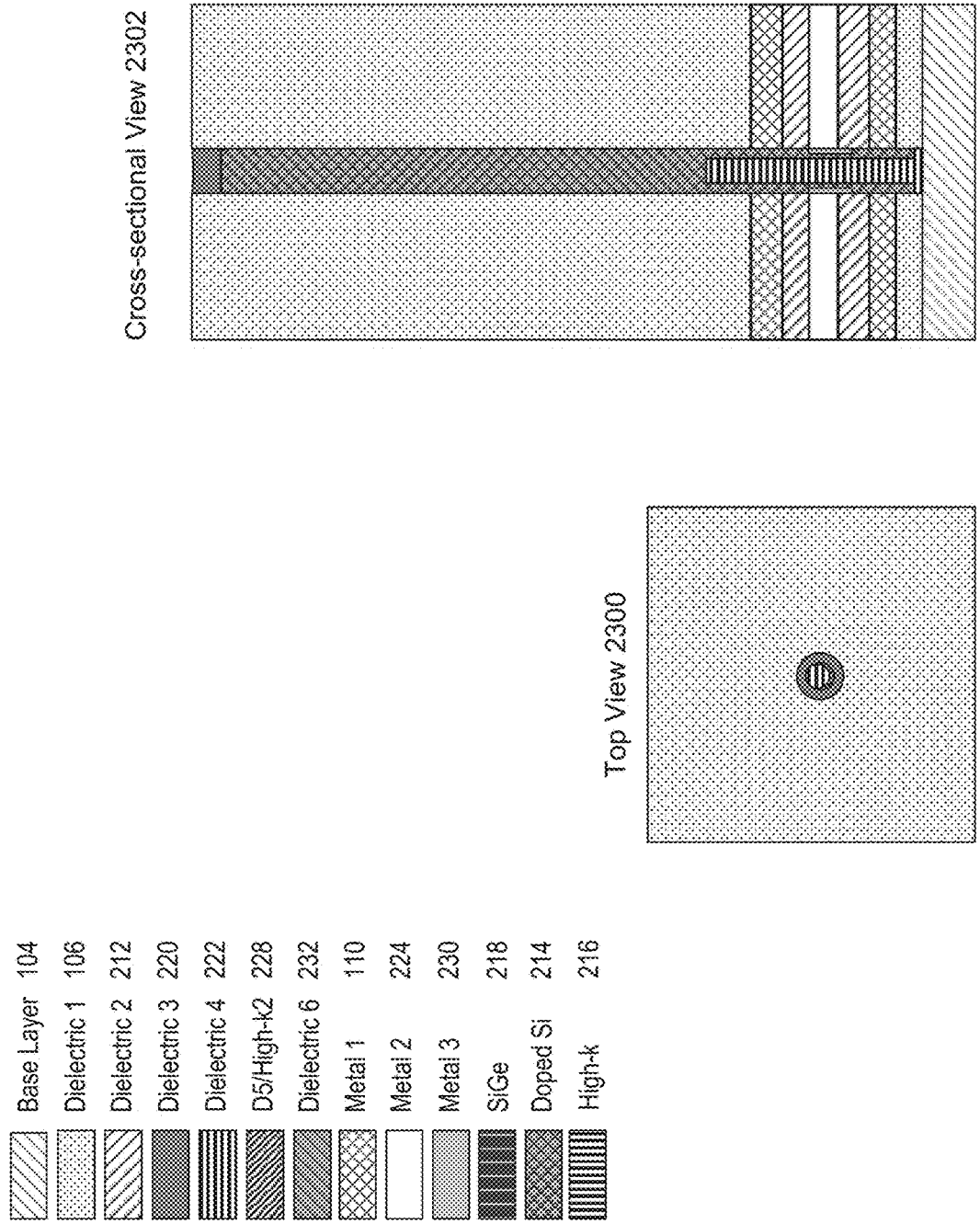

Referring to FIG. 23, illustrated is a top view 2300 and a cross-sectional view 2302 of the structure and the next stage of the example process flow, in which etching of dielectric 222 can be done selectively until dielectric 222 is etched to an area that is slightly protruding from the transistor 260. The hollow space would be used for capacitor fabrication. This step could be implemented, for example, by techniques described in connection with FIG. 15.

Referring to FIG. 24, illustrated is a top view 2400 and a cross-sectional view 2402 of the structure and the next stage of the example process flow, in which the ALD of high-k2 228, the cap dielectric liner is deposited and metal 230 is filled. Following this step, a CMP can be completed. This step can be implemented by using, for example, steps and techniques described in connection with FIGS. 6-7.

Referring now to FIGS. 25-31, illustrated is an example of a hollow core ALD metal/liner approach for creating vertically integrated, 3D capacitor-based 2-bit memory cells 310. Using this approach, a 2-bit memory cell 310 can be fabricated using self-aligned process for metal deposition without lithography. For example, the same or similar hollow core ALD metal/liner approach that was described in connection with FIGS. 1-7 for fabrication of a single memory cell 300. However, it is understood that the same techniques can also be used for fabrication of the multi-bit memory cells 310. It is also understood that other approaches for fabrication of vertical transistors, capacitors or memory cells 300 described in the Related Patent Application can also be used as alternatives to this example, including all structures, techniques, process flows, methods of fabrication, and any other subject matter described therein.

Figure 25:
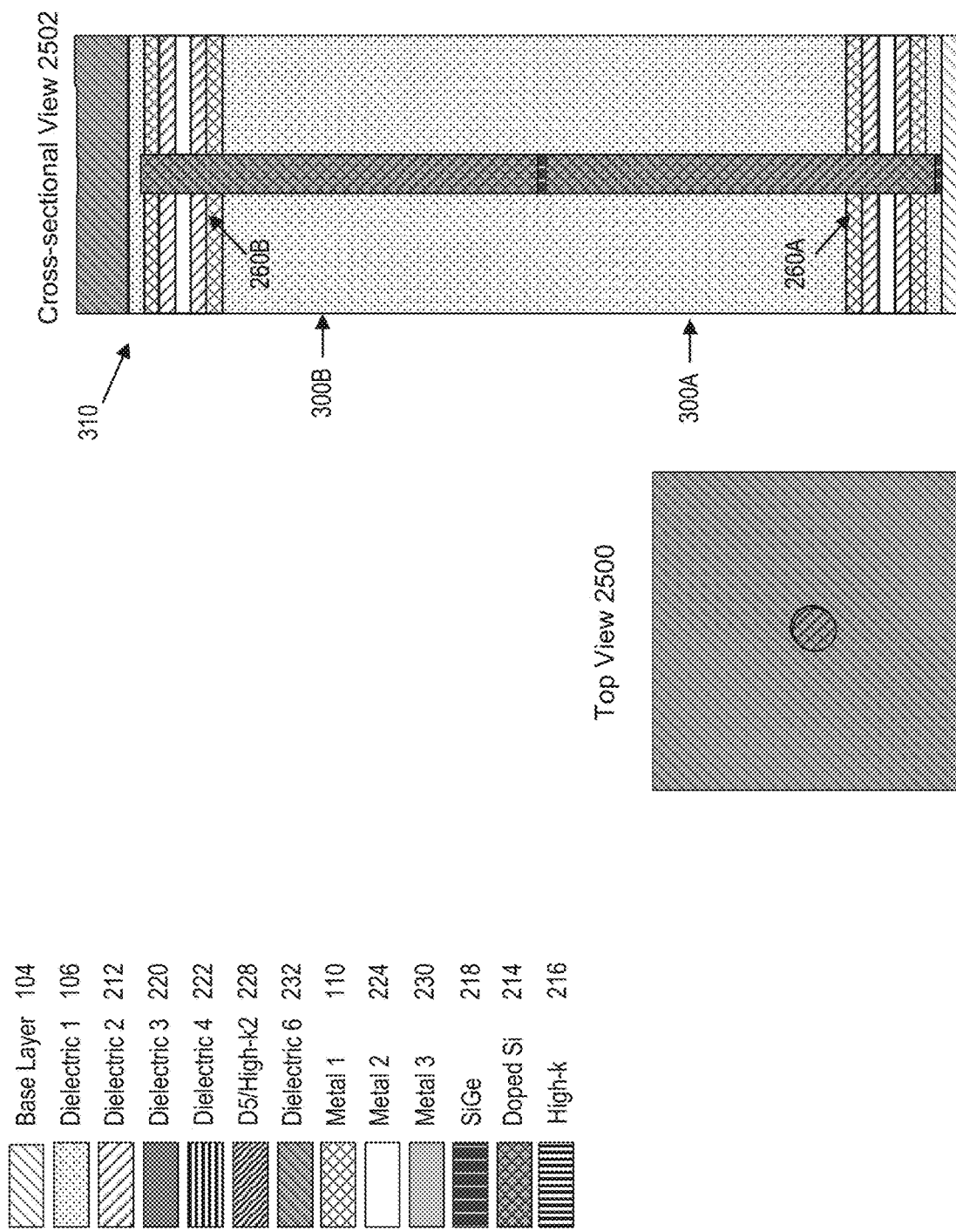
FIGS. 25-31 are top, cross-sectional, and perspective views of an example structure and process flow to form a N=2 memory cell using hollow core ALD metal/liner approach, according to an embodiment.

Referring to FIG. 25, illustrated is a top view 2500 and a cross-sectional view 2502 of the structure and the next stage of the example process flow in which layers of material for fabricating two memory cells 300A and 300B to form a 2-bit memory cell 310, is illustrated. In order to form a multi-bit memory cell 310 of FIG. 25, the layers of materials deposited in connection with a single memory cell 300 in FIG. 21 can be doubled into a mirror image in order to form a double material stack for two the memory cells 300A-B.

Still referring to FIG. 25, by starting from the material stack in connection with FIG. 21, an additional thick layer of dielectric 106 can be added on top of the thick dielectric 106 layer. The added layer 106 can have the same thickness as the dielectric 106 added in FIG. 21. On top of added dielectric layer 106, a layer of metal 110 can be disposed for providing electrical contact to the first (i.e. lower) of the two source/drain contacts 262 of the transistor 260B. Mirroring the same or similar material stack thereafter, after the metal 110 layer, a layer of dielectric 212 can be deposited, on top of which a layer of metal 224 can be deposited to provide electrical contact for a gate 264B. On top of that layer, a layer of dielectric 212 can be deposited, followed by metal 110, for electrical contacts for the remaining source/drain of the transistor 260, which can then be followed by dielectric 106 on top and finally a thick layer of dielectric 232 on top.

The cavity/column 250 of the 2-bit memory cell 310 can be about as twice as long as the memory cell 300 was for the single bit memory cells 300. In the cavity 250, a doped Si can be grown using steps similar to those described in connection with FIG. 19A, including from the SiGe 218 layer of material beneath the first (lower) transistor 260A, all the way through the transistor 260A, through the space in which capacitors 270A and 270B are to be formed, and into the and through the transistor 262B. As described in FIG. 19B, doped Si 214 material can have its dopant switched for source/drain and gate regions, depending on the NPN or PNP configurations.

Figure 26:
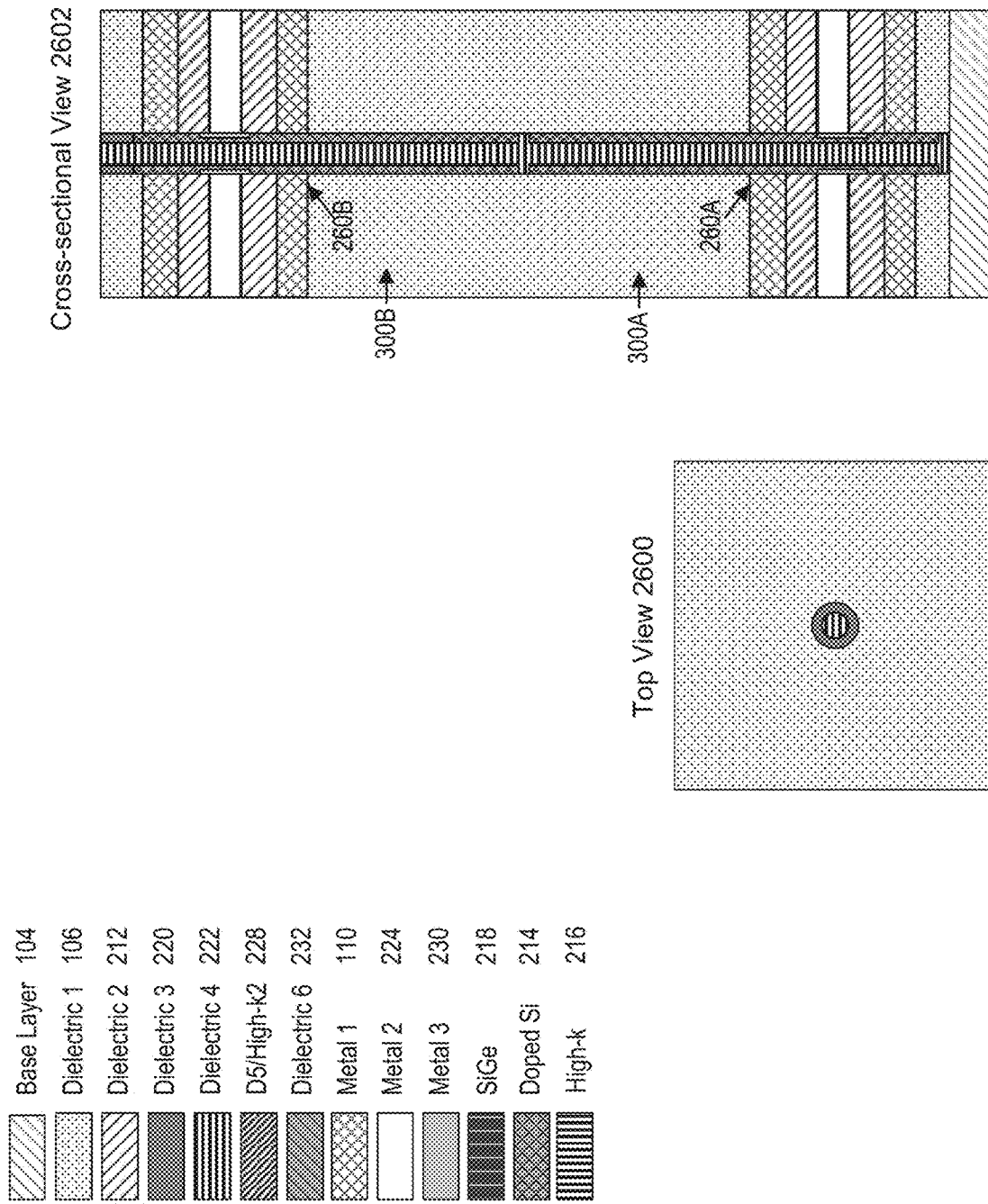

Referring to FIG. 26, illustrated is a top view 2600 and a cross-sectional view 2602 of the structure and the next stage of the example process flow in which the procedure and techniques as explained in FIG. 22 can be implemented to deposit an ALD layer of dielectric 220 and using the coated layer form an opening for directionally etching downward a self-aligned hollow core to etch out the central portion of the doped silicon 214 and all of SiGe 218, leaving only the sides of the doped Si 214. After that, the etched out portion can be filled with dielectric 222 and a CMP can be performed.

This step can leave the structure in FIG. 26 with a cavity 250 in which the walls on the interior surface of cavity are coated with a layer of doped Si 214 and the center of the cavity 250 is filled with dielectric 222. The SiGe 218 layers would be etched out and filled with dielectric 222.

Figure 27:
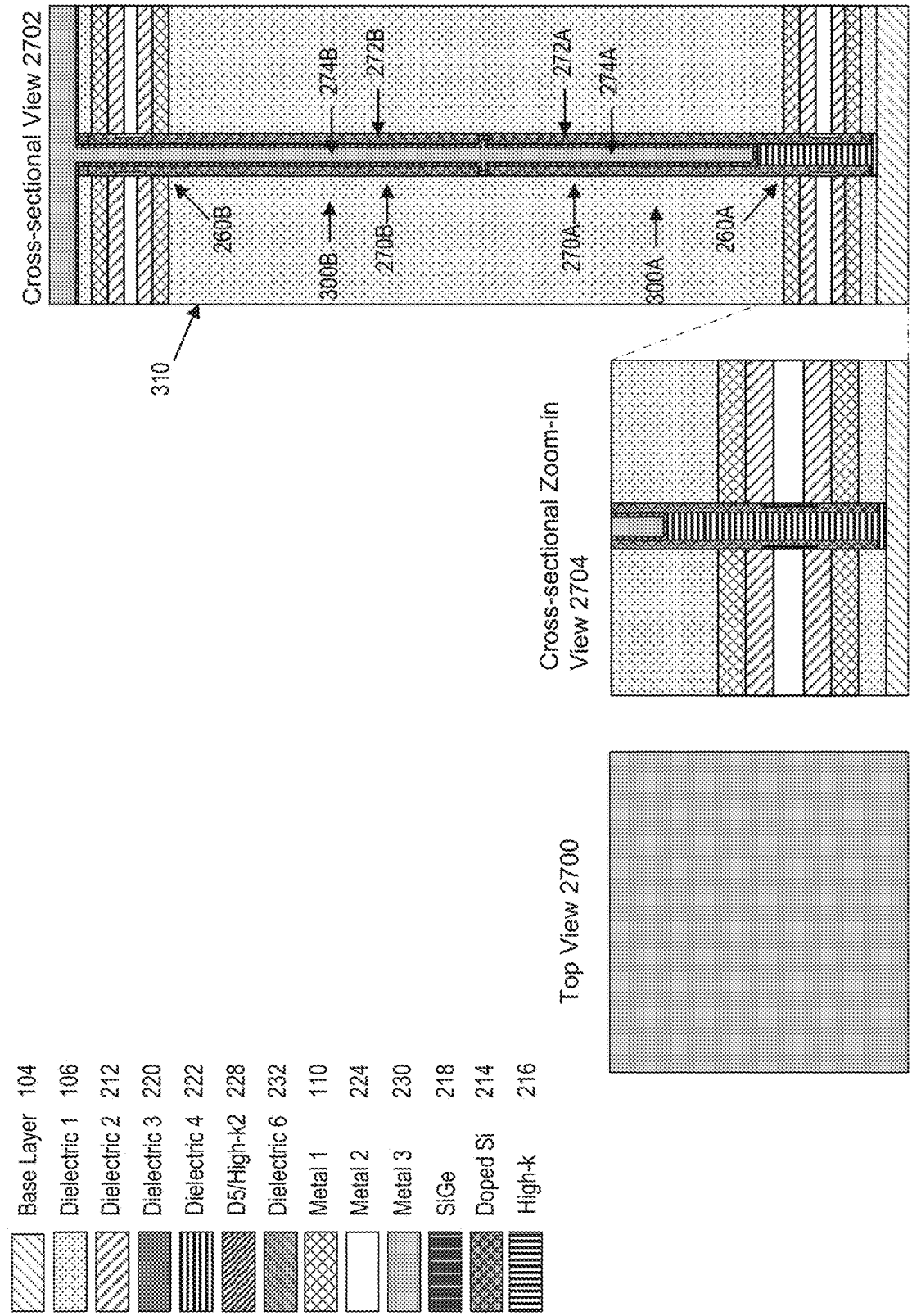

Referring to FIG. 27, illustrated is a top view 2700, a cross-sectional view 2702 and a cross-sectional zoom-in view 2704 of the structure and the next stage of the example process flow in which the dielectric 222 can be selectively etched out, leaving dielectric 222 present only in the transistor 260A, beneath the transistor 260A, where a layer of SiGe 218 used to be, and in a small recessed height slightly above the transistor 260A. The dielectric 222 would be etched out from the entirety of areas in which capacitors 270A and 270B are to be built and out of the transistor 260B.

Following this step, a layer of high-k2 228 can be ALD deposited to coat the etched out portions inside the cavity 250. ALD of high-k2 228 can provide an electrically insulating liner between the remaining layer of doped silicon 214 while still remaining on the interior surface of cavity 250 and a metal material to be deposited on top of the high-k2 228 liner. The remaining layer of doped silicon 214 can act as an outer electrode 272 of the capacitors 270A and 270B.

Following this step, a deposit fill of metal 230 can be implemented to create the interior electrode 274. The interior electrode 274 can be a single piece of metal extending through both the capacitor 270A and 270B. Interior electrode 274 can be shared by both capacitors 270A and 270B. The high-k2 228 liner can act as an electrical insulator for both capacitors 270A and 270B. The outer electrode 272A of the capacitor 270A can be electrically separated by the outer electrode 272B of the capacitor 270B by an etched out layer of SiGe 218 that had severed the doped Si 214 of the capacitor 270A from the doped Si 214 of the capacitor 270B.

Figure 28:
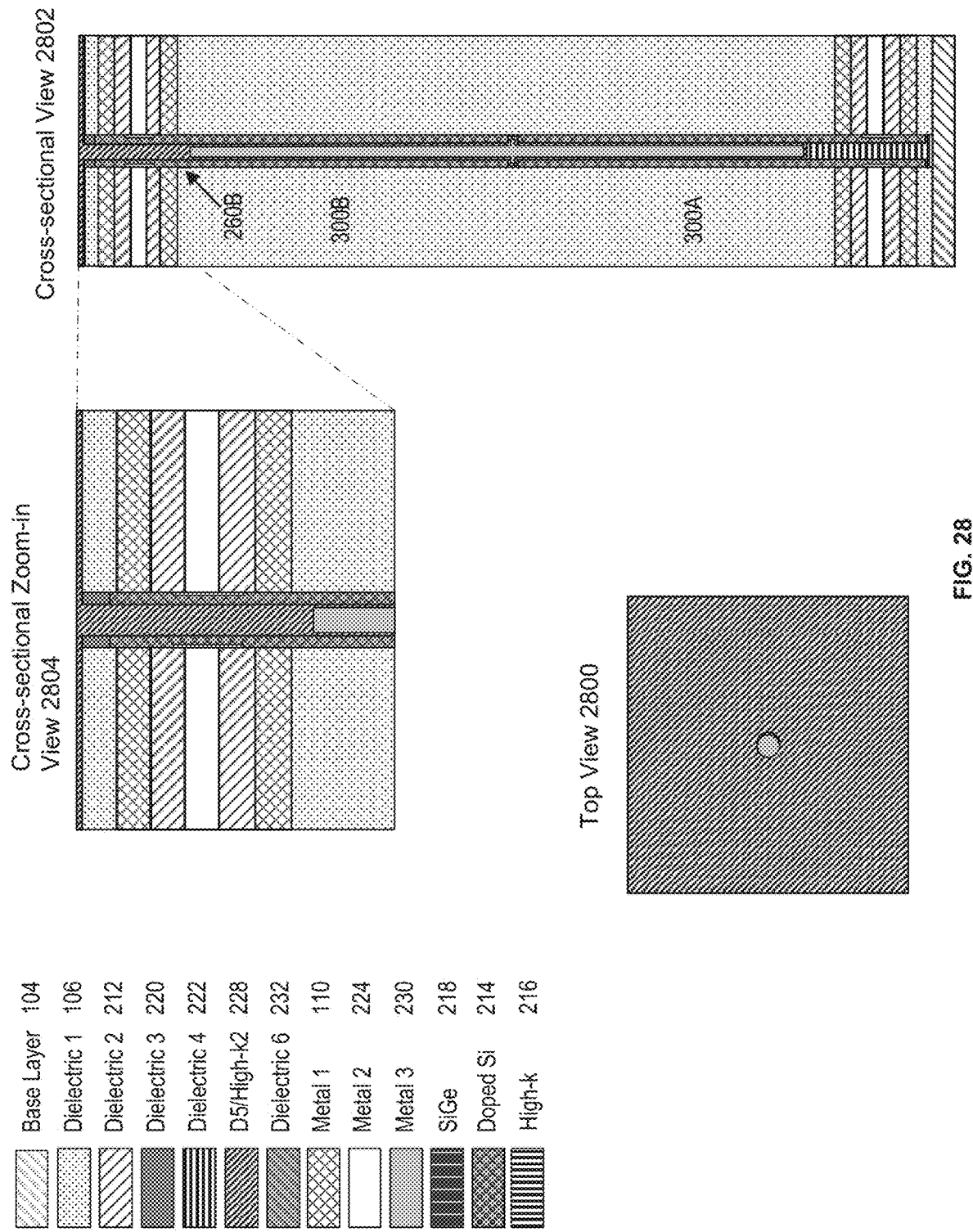

Referring to FIG. 28, illustrated is a top view 2800, a cross-sectional view 2802, and a cross-sectional zoom-in view 2804 of the structure and the next stage of the example process flow, in which after a CMP is completed metal 230 can be etched selectively passed the transistor 260B. For example, the metal 230 can be etched to clear out all the metal 230 from the top surface and through the transistor 260B, stopping the etch once the transistor 260 has been etched. To ensure this etching is complete, the etch can be stopped some distance past the metal contact of the second (lower) source/drain of the transistor 260B.

The act of selective etching of metal 230 can be done using the technique with atomic layer etching ("ALE") of dielectric 220 to create a self-aligned directional etch, as, for example, described in connection with FIGS. 2 and 14.

Figure 29:
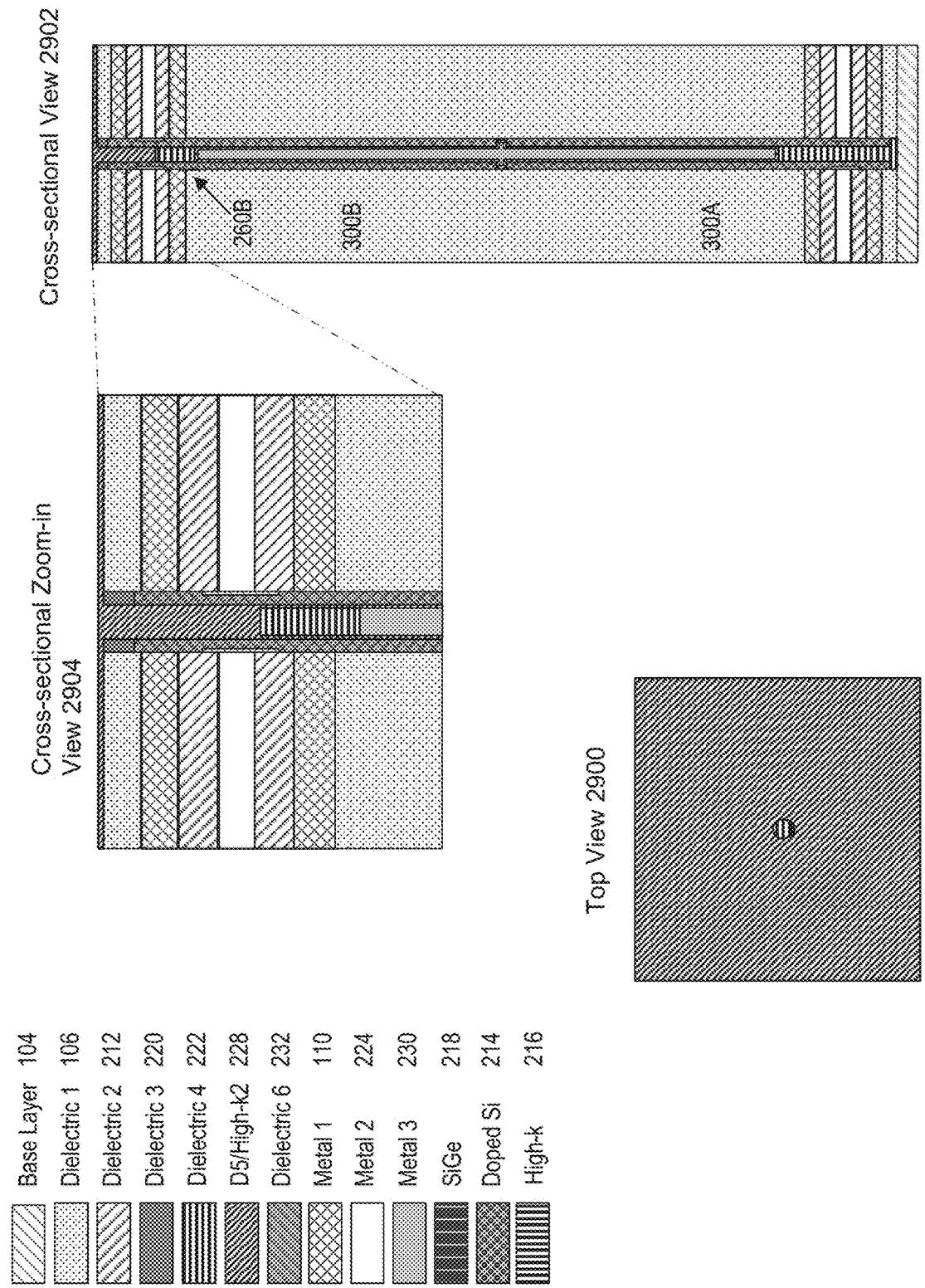

Referring to FIG. 29, illustrated is a top view 2900, a cross-sectional view 2902 and a cross-sectional zoom-in view 2904 of the structure and the next stage of the example process flow in which an ALD deposition of a layer of high-k2 228 can be applied. The layer of high-k2 228 can be thicker than the layer of high-k2 228 applied earlier in connection with FIG. 27. In some implementations the layer of high-k2 228 can be up to 2, 3, 4, 5, 6, 7, 8, 9, 10, 12, 15, or 20 times thicker than the layer of high-k2 228 applied in connection with the steps described in FIG. 40. A CMP can be performed after the high-k2 228 deposition.

Following the above step a layer of dielectric 222 can be deposited at the bottom of the remaining opening by the etching in the prior step. Dielectric 222 can be deposit filled inside the etched out opening to create a self-aligned smaller diameter path through which a thinner or narrower electrical contact can be made to the inner electrode 274 beneath the transistor 260B. Dielectric 222 can be deposited from the location where electrode 274 metal and high-k2 228 liner was left off and to the height that is at or around the level of dielectric 212 between the metal 110 and the metal 224 of the lower source/drain. In some implementations the dielectric 222 can be deposited to the height of the gate metal 224.

Figure 30:
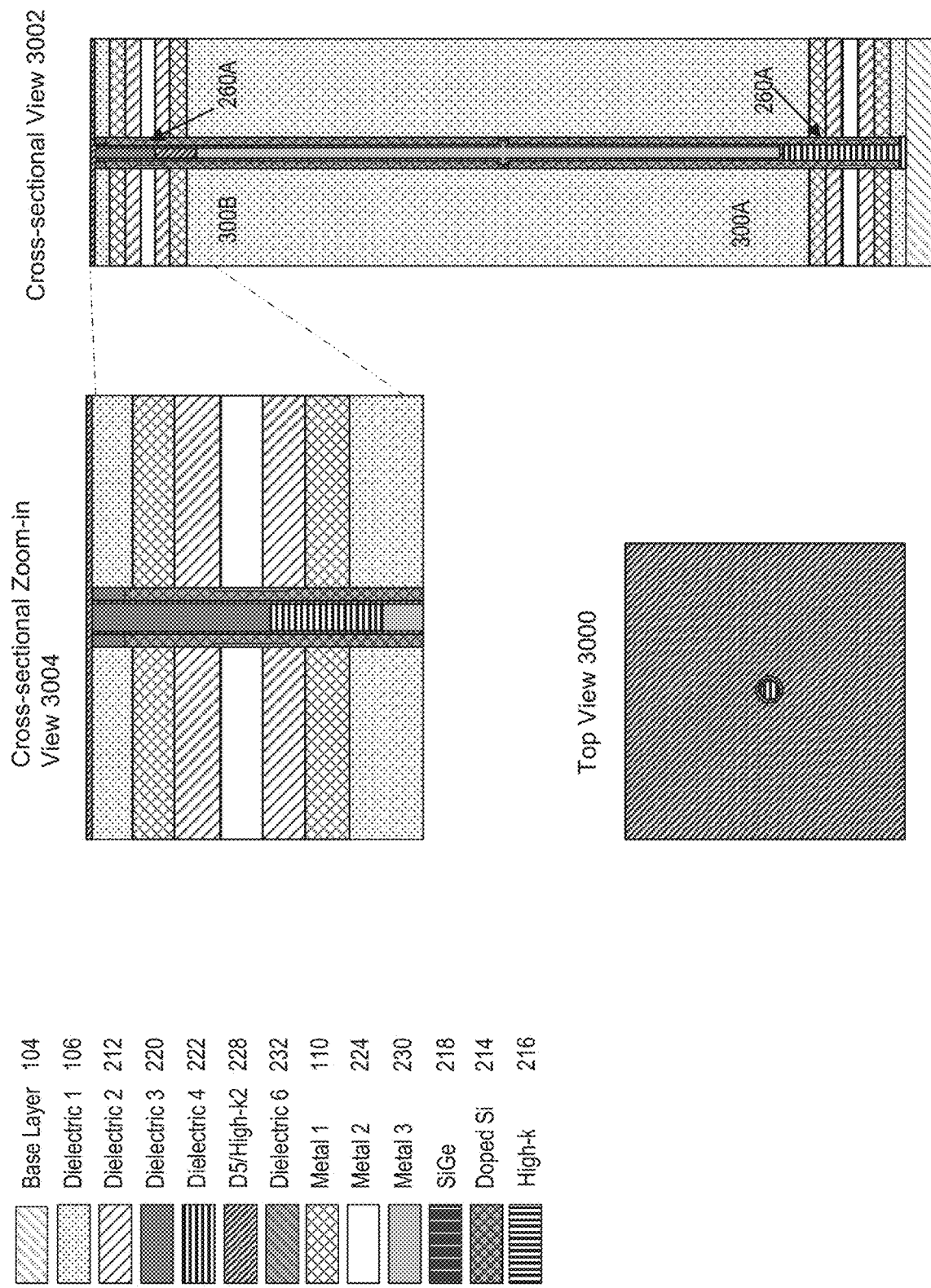

Referring to FIG. 30, illustrated is a top view 3000, a cross-sectional view 3002 and a cross-sectional zoom-in view 3004 of the structure and the next stage of the example process flow in which ALD deposition of dielectric 220 spacer can be made in order to create a self-aligned hole through which a directional downward etch through the central portion of the dielectric 222 layer can be made to reach the top of the electrode 274 beneath the dielectric 222. Techniques described in connection with FIGS. 2, 10-11 and 14 can be used to perform the etch through dielectric 222 using the self-aligned opening created by ALD deposition of dielectric 220.

The diameter of the etched hole though the layers 220 and 222 through which an etch to the electrode 274 can be made can be smaller than the diameter of the inner electrode 274. For example, the diameter of the etched hole can be up to 90%, 80%, 70%, 60%, 50%, 40%, 30%, 20%, 10%, 5% or 1% of the diameter of the electrode 274. The etched hole can be vertical and can extend through dielectrics 220 and 222 and to the metal 230, or any other electrically conductive material, of the electrode 274.

Figure 31:
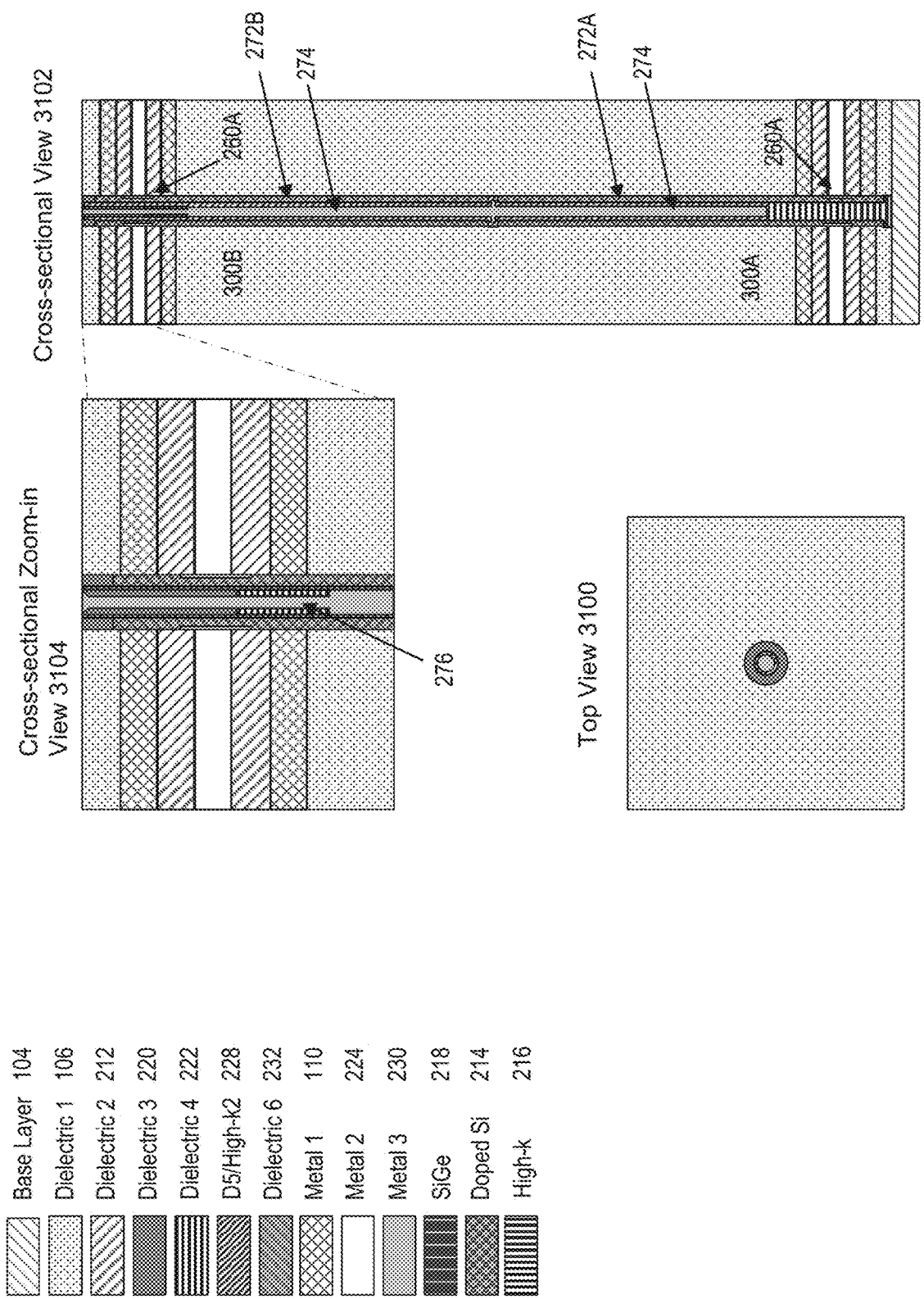

Referring to FIG. 31, illustrated is a top view 3100, a cross-sectional view 3102 and a cross-sectional zoom-in view 4204 of the structure and the next stage of the example process flow in which metal 230 can be deposit filled through the narrow diameter hole that is etched out in the earlier step. Filling that narrow hole with metal 230, a reduced diameter contact 276 can be made from the top surface of the material to the inner electrode 274. The reduce diameter contact 276 can therefore provide an electrical contact to the inner electrode 274. As described above, the diameter of the reduced diameter contact 276 can be up to 90%, 80%, 70%, 60%, 50%, 40%, 30%, 20%, 10%, 5% or 1% of the diameter of the electrode 274. Following this step, a CMP can be performed.

Referring now to FIGS. 32-41, an example of a hollow core ALD metal/liner approach for creating vertically integrated 3D capacitor-based 4-bit memory cells 310 is illustrated. Using this approach, a 4-bit memory cell 310 can be fabricated using self-aligned scheme for metal deposition without lithography. For example, the same or similar hollow core ALD metal/liner approach that was described in connection with FIGS. 1-7 and FIGS. 20-24 for fabrication of a single memory cell 300, can also be used for fabrication of multi-bit memory cells 310. Likewise, techniques described in connection with FIGS. 25-31 for fabrication of a 2-bit memory cells 310 can also be used for fabrication of 4-bit or any other size of memory cells 310. It is understood that other approaches for fabrication of vertical transistors, capacitors or memory cells 300 described in the Related Patent Application can also be used as alternatives to this example, including all structures, schemes, process flows, methods of fabrication and any other subject matter described therein.

Figure 32:
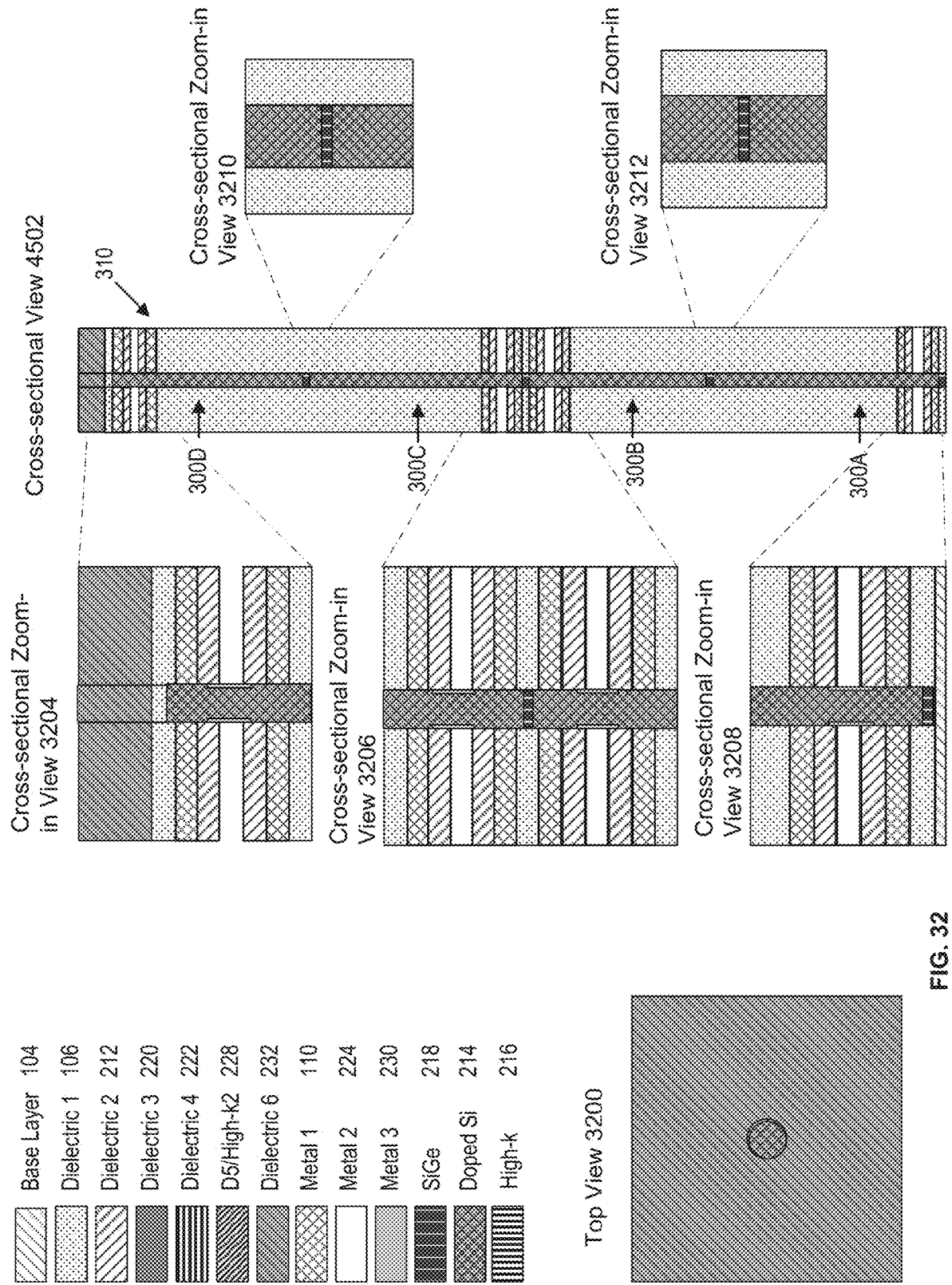
FIGS. 32-41 are top, cross-sectional, and perspective views of an example structure and process flow to form a N=4 memory using a hollow core metal/liner approach, according to an embodiment.

FIG. 32 provides an example structure and the next stage of the example process flow for fabricating a 4-bit memory cell 310. FIG. 32 includes a top view 3200, a cross-sectional view 3202, a cross-sectional zoom-in view 3204, a cross-sectional zoom-in view 3206, a cross-sectional zoom-in view 3208, a cross-sectional zoom-in view 3210 and a cross-sectional zoom-in view 3212. FIG. 32 illustrates the steps and the structure of an example material stack in which 4-bit memory cell 310 can be fabricated. The material stack in which the multi-bit memory cell 310 can be implemented can include added material stacks.

A 4-bit memory cell 310 can include four material stacks same or similar to the ones described in connection with FIGS. 1 and 20, for example. Likewise, a 4-bit memory cell 310 can include doubling of a 2-bit memory cell 310 material stack that was described in connection with FIG. 25. For example, a material stack for a 4-bit memory cell 310 can include two material stacks described in FIG. 25, where one of them is arranged on top of the other, except for a layer of dielectric 232 that can be removed from the top of the bottom material stack, but not removed from the top material stack. By arranging four separate material stacks in this way, materials for fabricating memory cells 300A-300D can be created.

The 4-bit memory cell 310 can include four memory cells 300A-D, where the memory cell 300A is at the bottom, followed by 300B above it, which is then followed by 300C above that one and a 300D at the top. The procedure of arranging layers can be explained in the description relating FIG. 25. The 1-bit or 2-bit structures may be formed on separate wafers or dies which may then be direct bonded or hybrid bonded to other 1-bit and/or 2 bit structures thereby forming stacks of structures N bits high. Another process of forming a 4-bit structure over a single wafer or die is described with reference to FIG. 32. This structure could likewise be direct or hybrid bonded to other 1-, 2-, and/or 4-bit structures.

FIG. 32 illustrates the cavity 250 that extends through four memory cells 300A-D and shows doped Si 214 that can be epitaxially grown or otherwise disposed in the cavity 250.

A thin layer of SiGe 214 beneath the lower transistor 260A can be disposed, and Si 214 can continue being disposed through the cavity 250, filling up the areas for memory cells 300A, 300B, 300C and 300D, until about just above memory cell 300D. The application of the doped Si 214 can be done using techniques and steps described in connection with FIG. 25.

Figure 33:
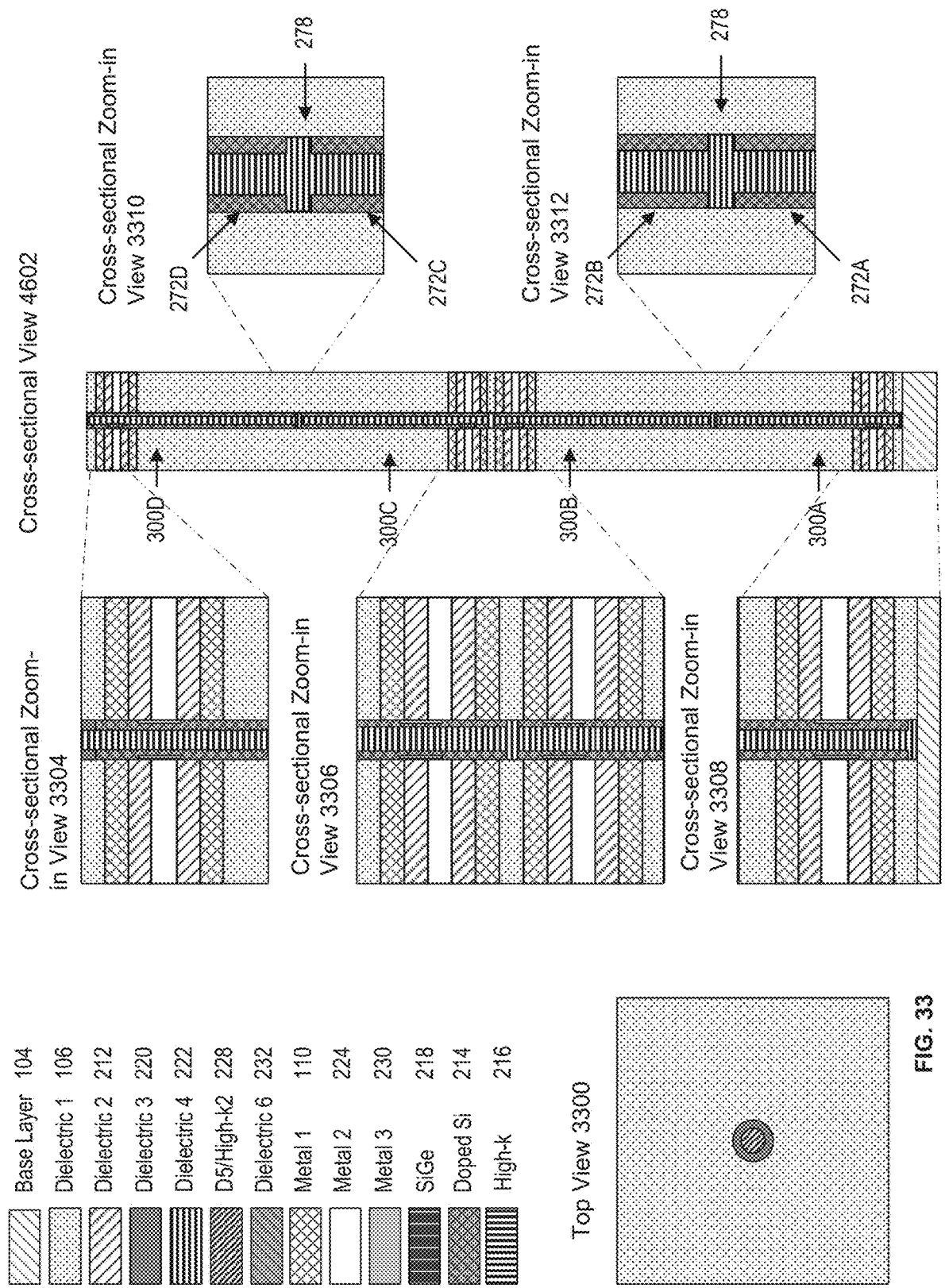

FIG. 33 provides an example structure and the next stage of the example process flow for fabricating a 4-bit memory cell 310. FIG. 33 includes a top view 3300, a cross-sectional view 4602, a cross-sectional zoom-in view 4604, a cross-sectional zoom-in view 3306, a cross-sectional zoom-in view 3308, a cross-sectional zoom-in view 3310 and a cross-sectional zoom-in view 3312. FIG. 33 illustrates the procedure as explained in connection with FIG. 22 in which a hollow trench is fabricated to etch out the SiGe 218. As shown in the FIG. 33, at this step SiGe 218 can be etched out and the central portion of the doped Si 214 is trenched out, leaving intact the sides of the doped Si 214 on the interior surface of the cavity 250. The etched out cavity can be filled in with dielectric 222. This process can be implemented using the steps and techniques described in connection with FIG. 26.

As more clearly shown, for example, in cross-sectional zoom-in views 3310 and 3312, outer electrodes 272 of the capacitors 270 of each of the memory cells 300A-D can be electrically separated by gaps 278. For example, in zoom-in view 3312, electrodes 272A and 272B are electrically separated from each other by a gap 278. Similarly, in zoom-in view 3310, electrodes 272C and 272D are electrically separated from each other by another gap 278. As illustrated for example in FIG. 17B, the gap 278 can be filled, comprise or be formed with a liner of a dielectric material between the electrodes 272 to provide electrical insulation between them.

Figure 34:
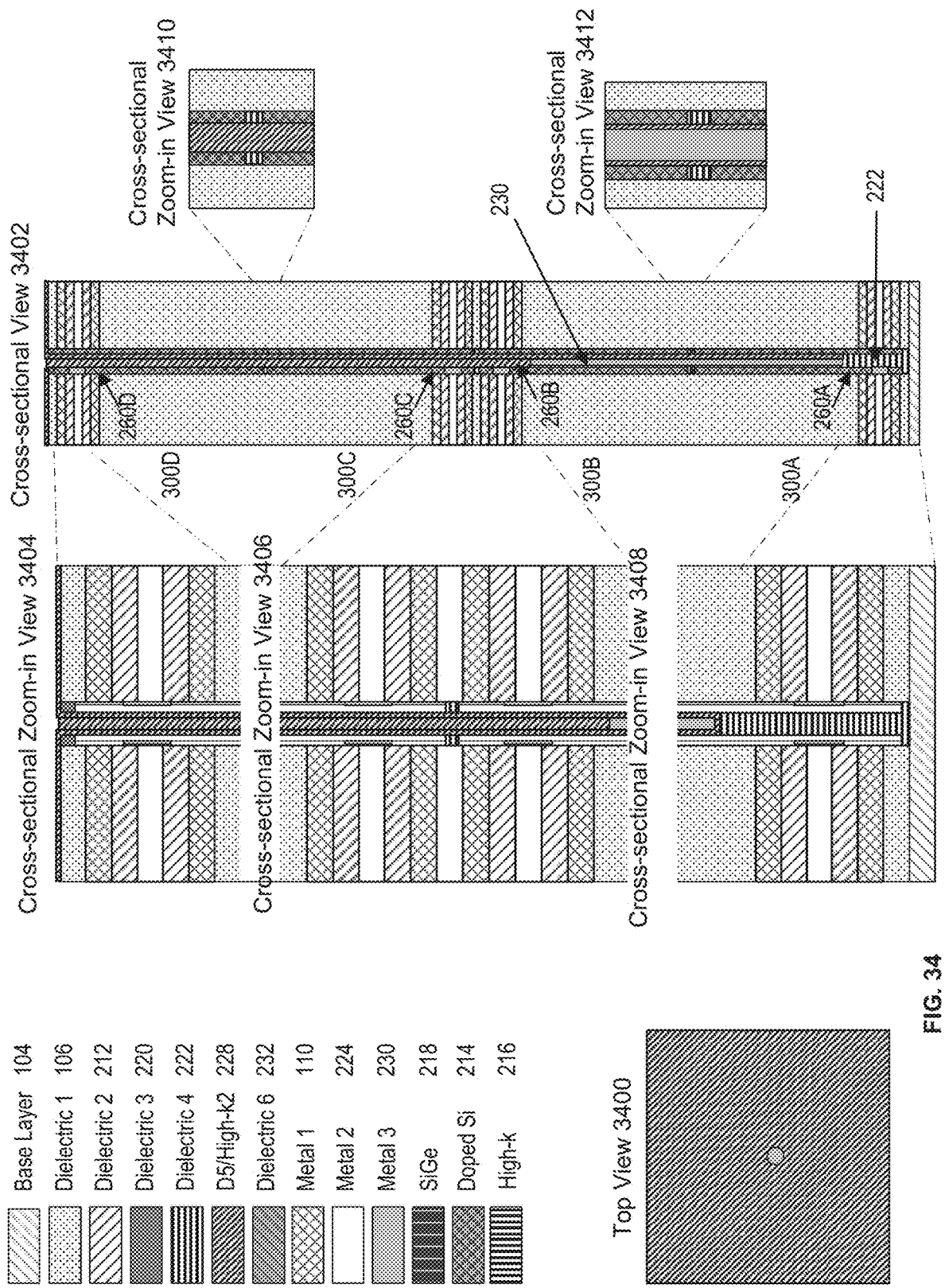

FIG. 34 provides an example structure and the next stage of the example process flow for fabricating a 4-bit memory cell 310. FIG. 34 includes a top view 3400, a cross-sectional view 3402, a cross-sectional zoom-in view 3404, a cross-sectional zoom-in view 3406, a cross-sectional zoom-in view 3408, a cross-sectional zoom-in view 3410 and a cross-sectional zoom-in view 3412. FIG. 34 illustrates the steps where dielectric 222 is etched out from the cavity 250 areas in which capacitor electrodes 274A-274D are to be built and then those areas are filled with metal 230 to build the electrodes 274. This process can be accomplished using steps and techniques described above in connection with FIG. 27.

For example, illustrated in FIG. 34 dielectric 222 is etched out in the entire cavity 250 from the top up until above the transistor 260A in the 300A cell at the bottom of the memory cell 310. Then, the metal 230 is deposited in the cavity 250 from that point and up until just underneath the transistor 260B. This process can be accomplished using steps and techniques described above in connection with FIG. 28.

Figure 35:
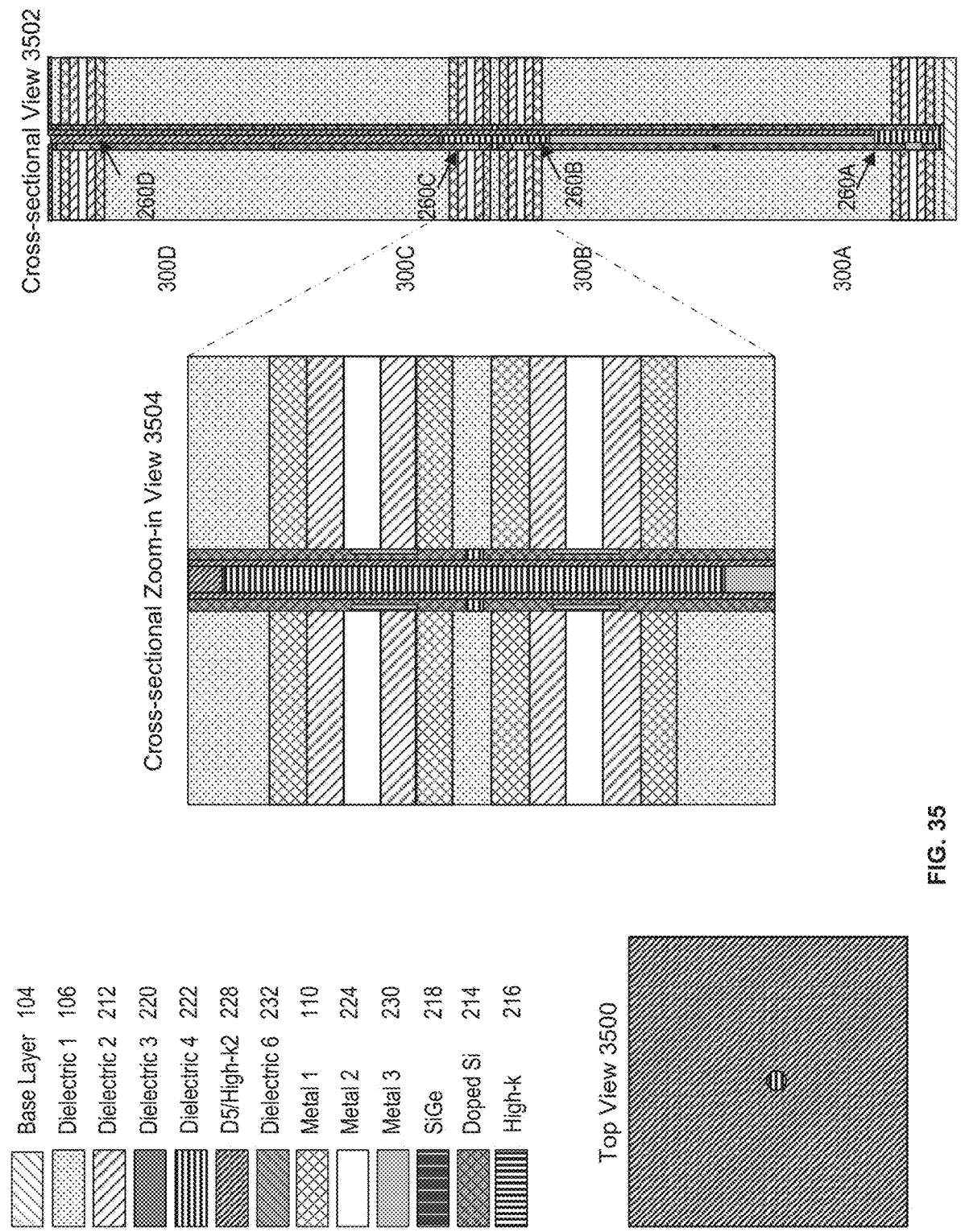

FIG. 35 provides an example structure and the next stage of the example process flow for fabricating a 4-bit memory cell 310. FIG. 35 includes a top view 3500, a cross-sectional view 3502, a cross-sectional zoom-in view 3504 of deposit fill by dielectric 222 of the remaining opening in the interior cavity 250 that runs through transistors 260B and 260C. The deposited dielectric 222 can begin from just underneath the transistor 260B all the way up until just above transistor 260C. Following this deposition of dielectric 222, a CMP can be performed. This can be accomplished using steps and techniques described above in connection with FIG. 29.

Figure 36:
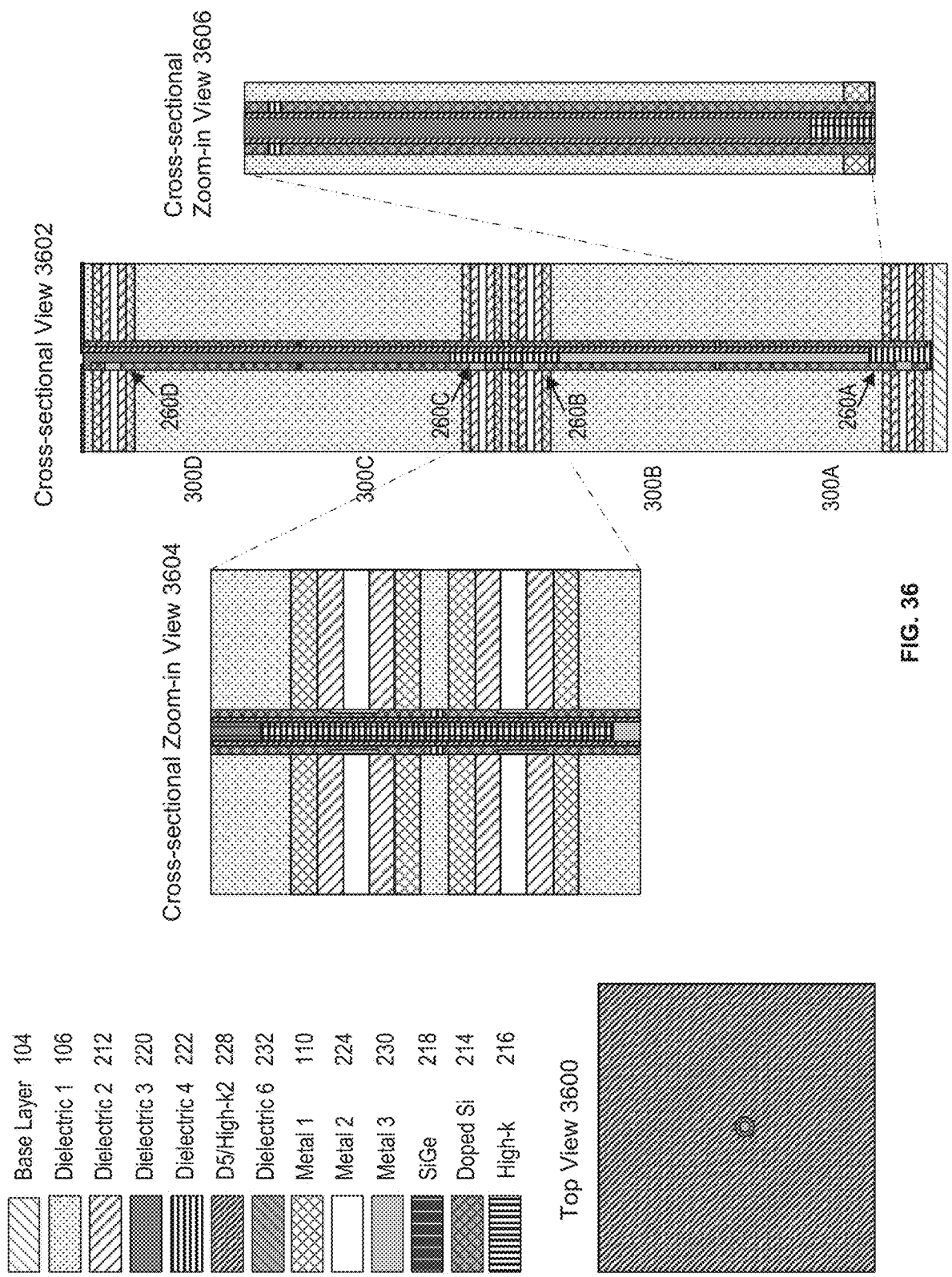

FIG. 36 provides an example structure and the next stage of the example process flow for fabricating a 4-bit memory cell 310. FIG. 36 includes a top view 3600, a cross-sectional view 3602 and a cross-sectional zoom-in view 3604. FIG. 36 illustrates the strategy as explained in connection with FIG. 30 to create an ALD deposition of a dielectric 220 and use it as a spacer for directionally etching a small diameter passage through the dielectric 222 to create a small diameter ground connection to the interior electrode 274. The etching has to be completed through the dielectric 222 to reach to metal 230 of the interior electrode 274. This process can be accomplished using steps and techniques described above in connection with FIG. 43. As described in FIG. 30, the interior diameter of the etched hole through the dielectric 222 can be significantly smaller than the diameter of the interior electrode 274B inside the capacitor 270B.

Figure 37:
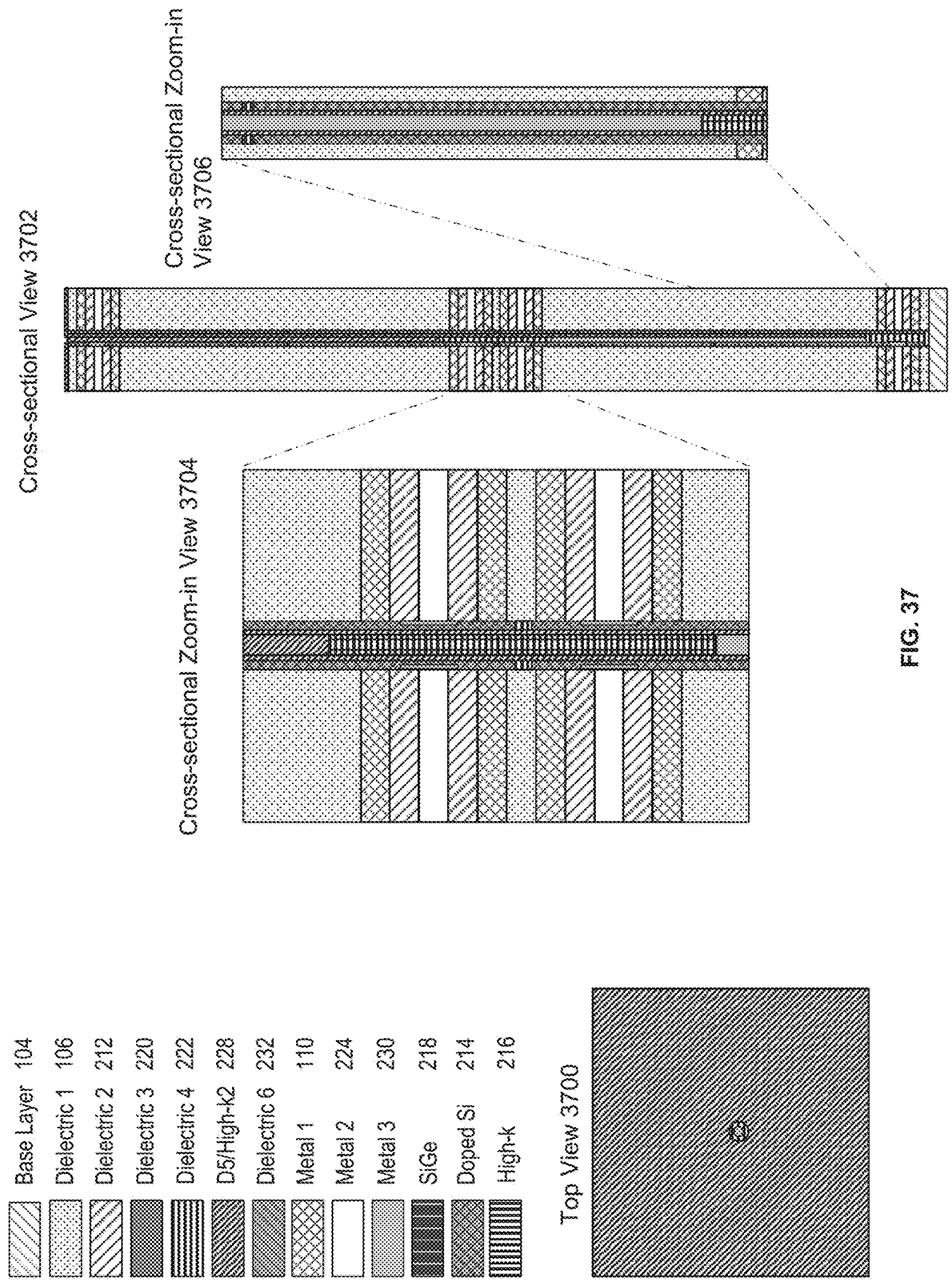

FIG. 37 provides an example structure and the next stage of the example process flow for fabricating a 4-bit memory cell 310. FIG. 37 includes a top view 3700, a cross-sectional view 3702 and a cross-sectional zoom-in view 3704. FIG. 37 illustrates the techniques by which the dielectric 222 can be etched isotopically to form a reduced diameter through-hole through transistors 260B and 260C to form a reduced diameter contact 276 in the reduced diameter through-hole. This can be accomplished since that whole area above and below these two transistors can include larger diameter capacitors and larger diameter electrodes 274 whose capacitance can be interfered with by the surrounding transistor signals. For example, the two access devices for which reduced diameter through hole can be made is devices 260C and 260D.

Figure 38:
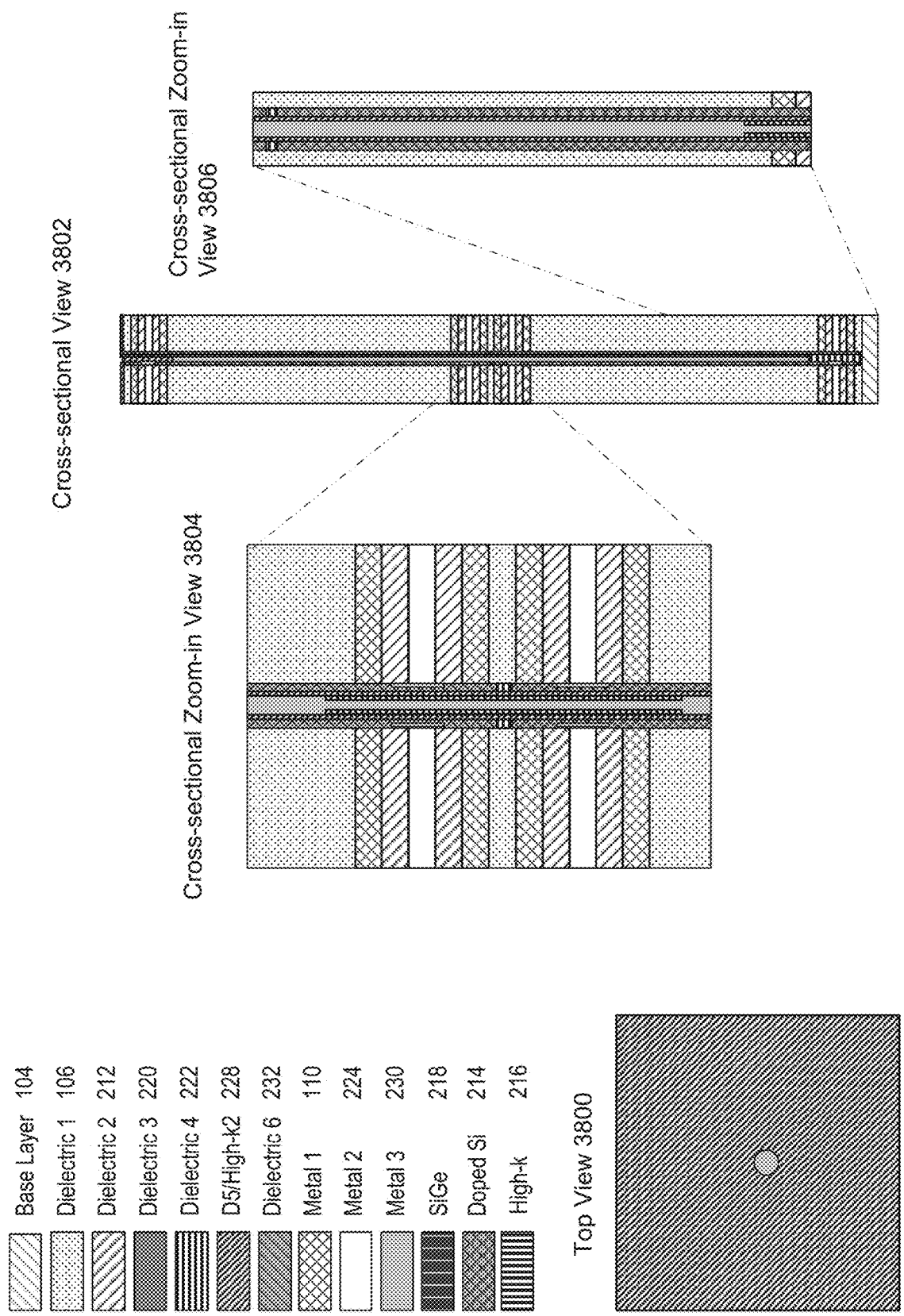

FIG. 38 provides an example structure and the next stage of the example process flow for fabricating a 4-bit memory cell 310. FIG. 38 includes a top view 3800, a cross-sectional view 3802 and a cross-sectional zoom-in view 3804. FIG. 38 illustrates filling of metal 230 into the small diameter hole etched in connection with steps described in FIG. 36-37 to form a reduced diameter contact 276. This can be accomplished using steps and techniques described above in connection with FIG. 31. By filling the metal 230, the metal will fill both the reduced diameter contact 276, but also the interior electrode 274 for capacitors 270C-270D. Following this step, a CMP can be performed.

Figure 39:
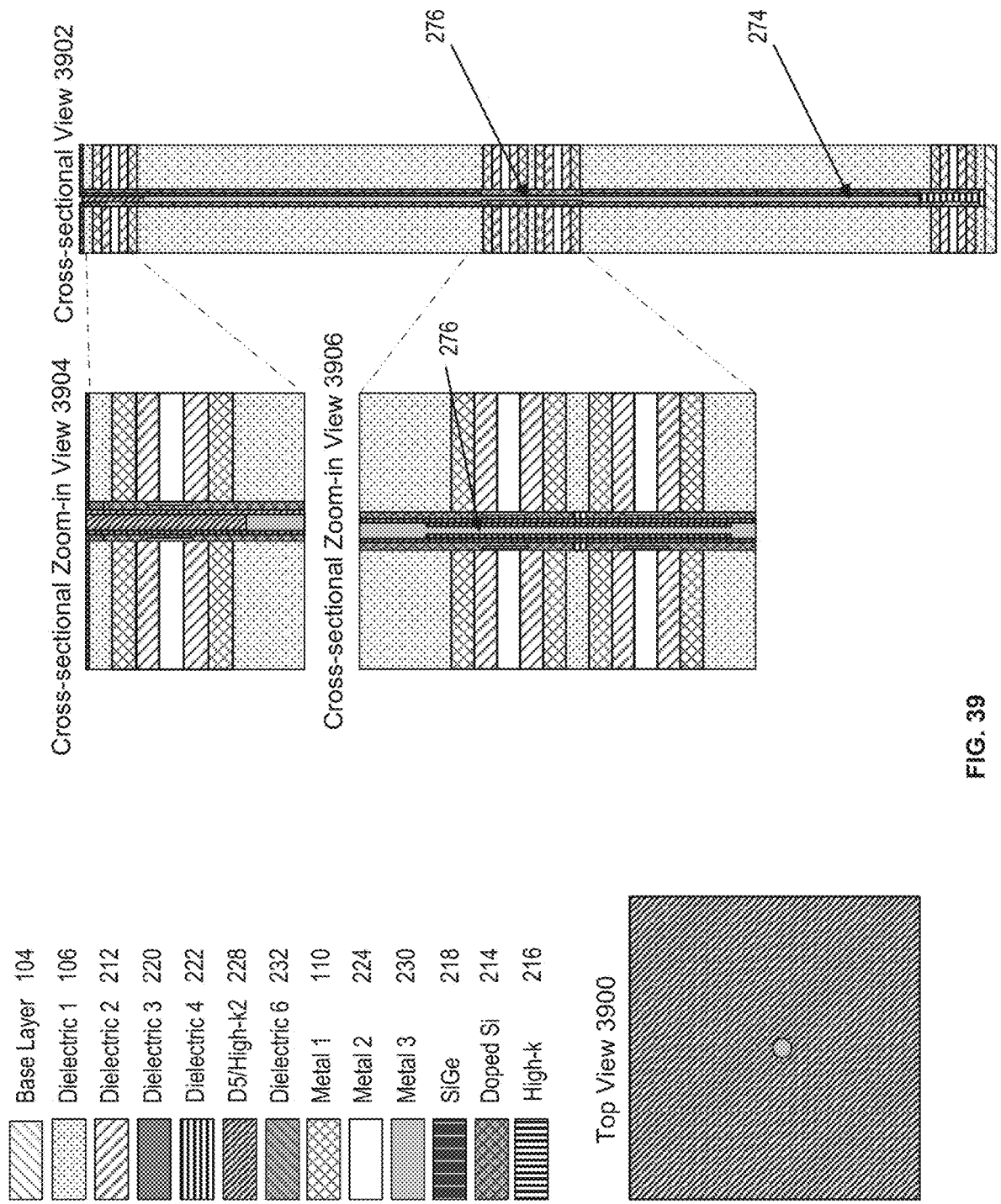

FIG. 39 provides an example structure and the next stage of the example process flow for fabricating a 4-bit memory cell 310. FIG. 39 includes a top view 3900, a cross-sectional view 3902, a cross-sectional zoom-in view 3904 and a cross-sectional zoom-in view 3906. FIG. 39 illustrates etch metal 230 can be etched from the top until just below the top access device, which is the transistor 260D. This etching process can be accomplished using steps and techniques described above in connection with FIG. 28.

Figure 40:
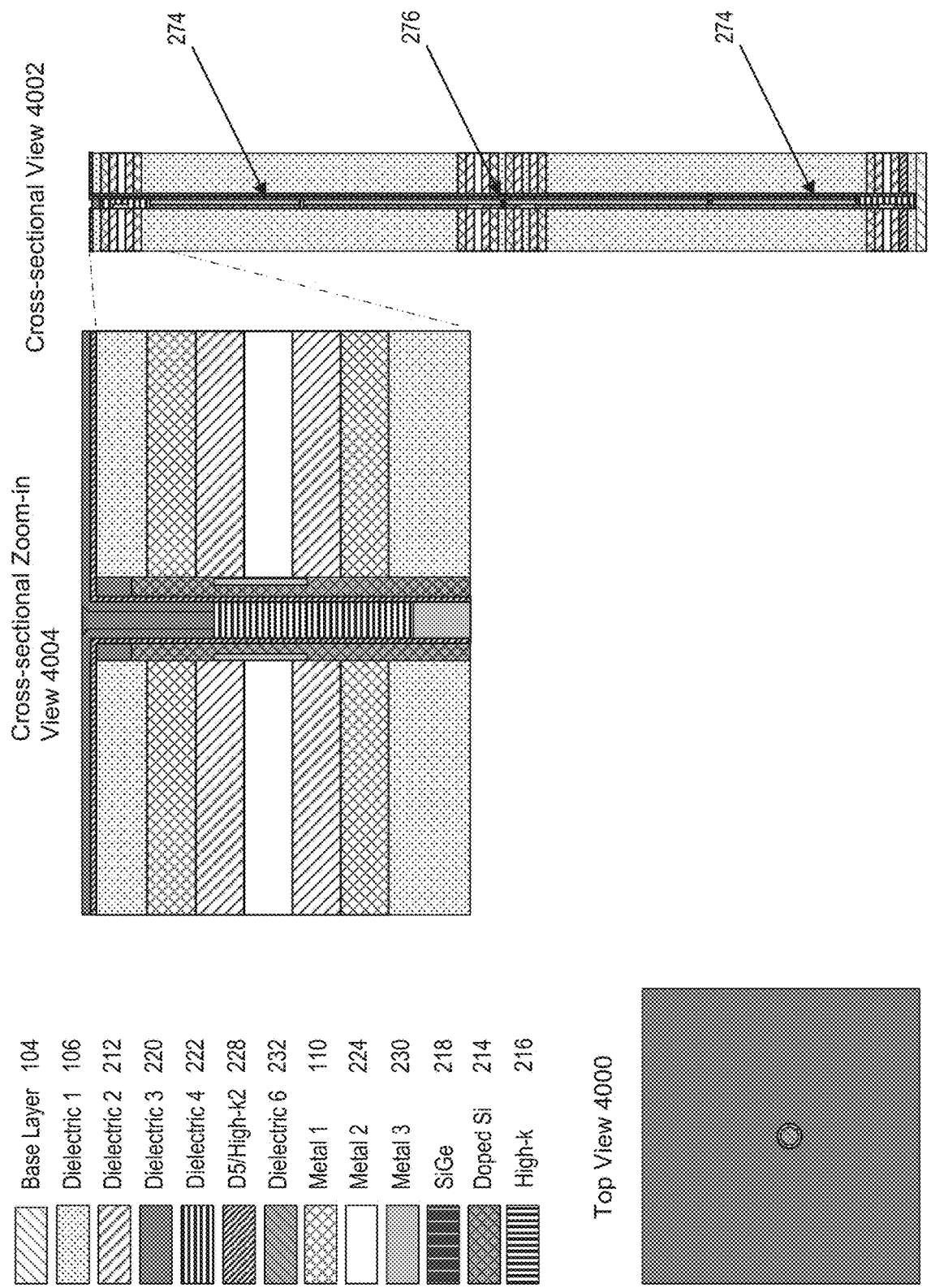

FIG. 40 provides an example structure and the next stage of the example process flow for fabricating a 4-bit memory cell 310. FIG. 40 includes a top view 4000, a cross-sectional view 4002 and a cross-sectional zoom-in view 4004. FIG. 40 illustrates the steps relating the deposition of dielectric 222 up to about a gate of the transistor 260D. This deposition of dielectric 222 can be followed by an ALD deposition of a dielectric 220 to create self-aligned hole for etching smaller diameter through-hole for making a connection with the metal 230 of the electrode 274 beneath the transistor 260D. This through-hole formation process can be accomplished using steps and techniques described above in connection with FIGS. 30 and 36.

Figure 41:
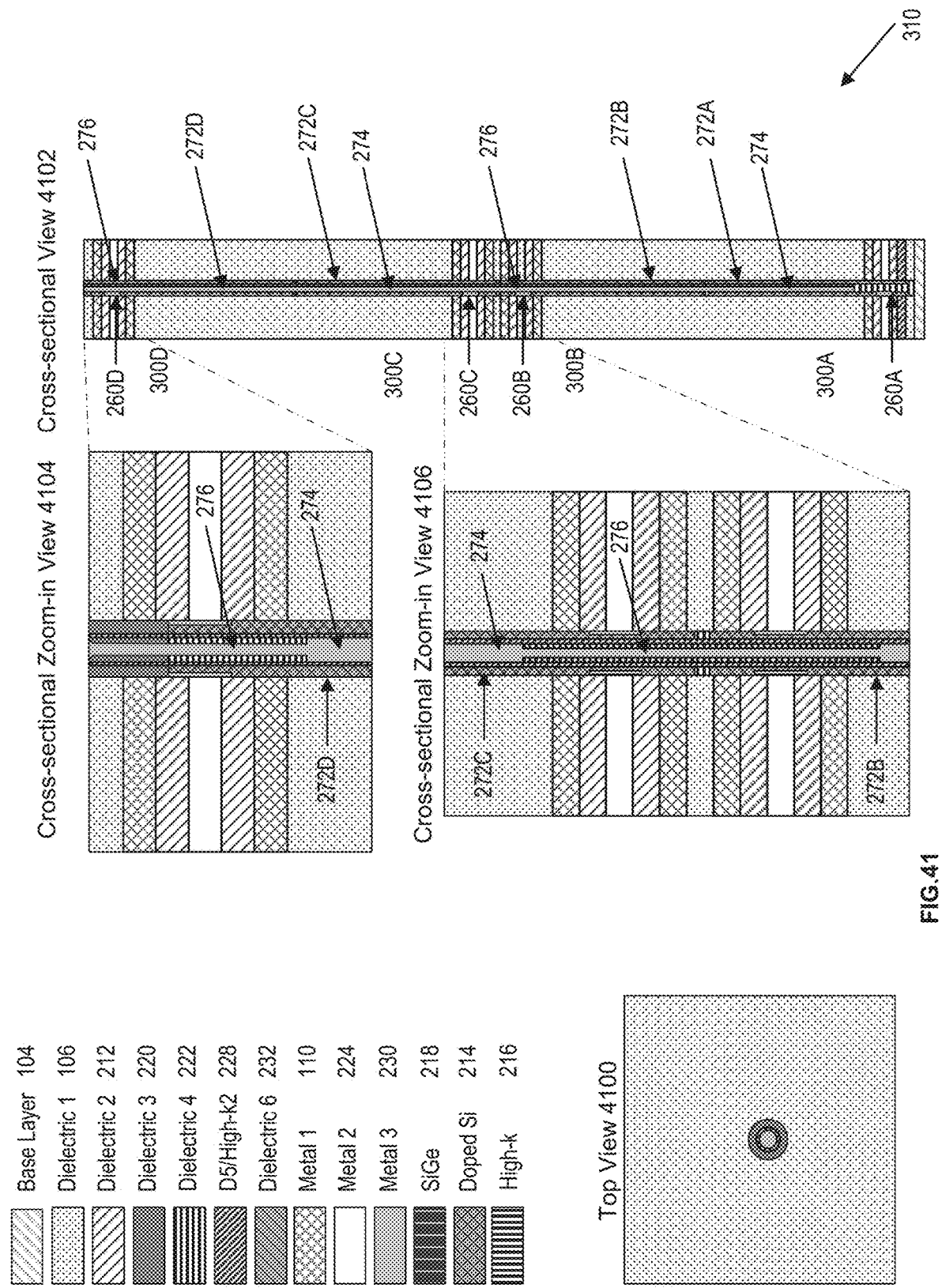

FIG. 41 provides an example structure and the next stage of the example process flow for fabricating a 4-bit memory cell 310. FIG. 41 includes a top view 4100, a cross-sectional view 4102, a cross-sectional zoom-in view 4104, and a cross-sectional zoom-in view 4106. FIG. 41 illustrates example of a directional etching using dielectric 220 for creating self-aligning hole for etching through dielectric 222 to reach to metal 230 through a narrow diameter etched hole. The through hole made can be used for a reduced diameter contact 276 through the transistor 260D. This process can be accomplished using steps and techniques described above in connection with FIGS. 30, 31, 36 and 37. This etched hole can then be filled by metal 230 and a CMP can be done with respect to dielectric 106. This deposition of metal 230 can complete the example steps for the fabrication of a 4-bit vertically integrated DRAM memory cell 310.

Figure 42:
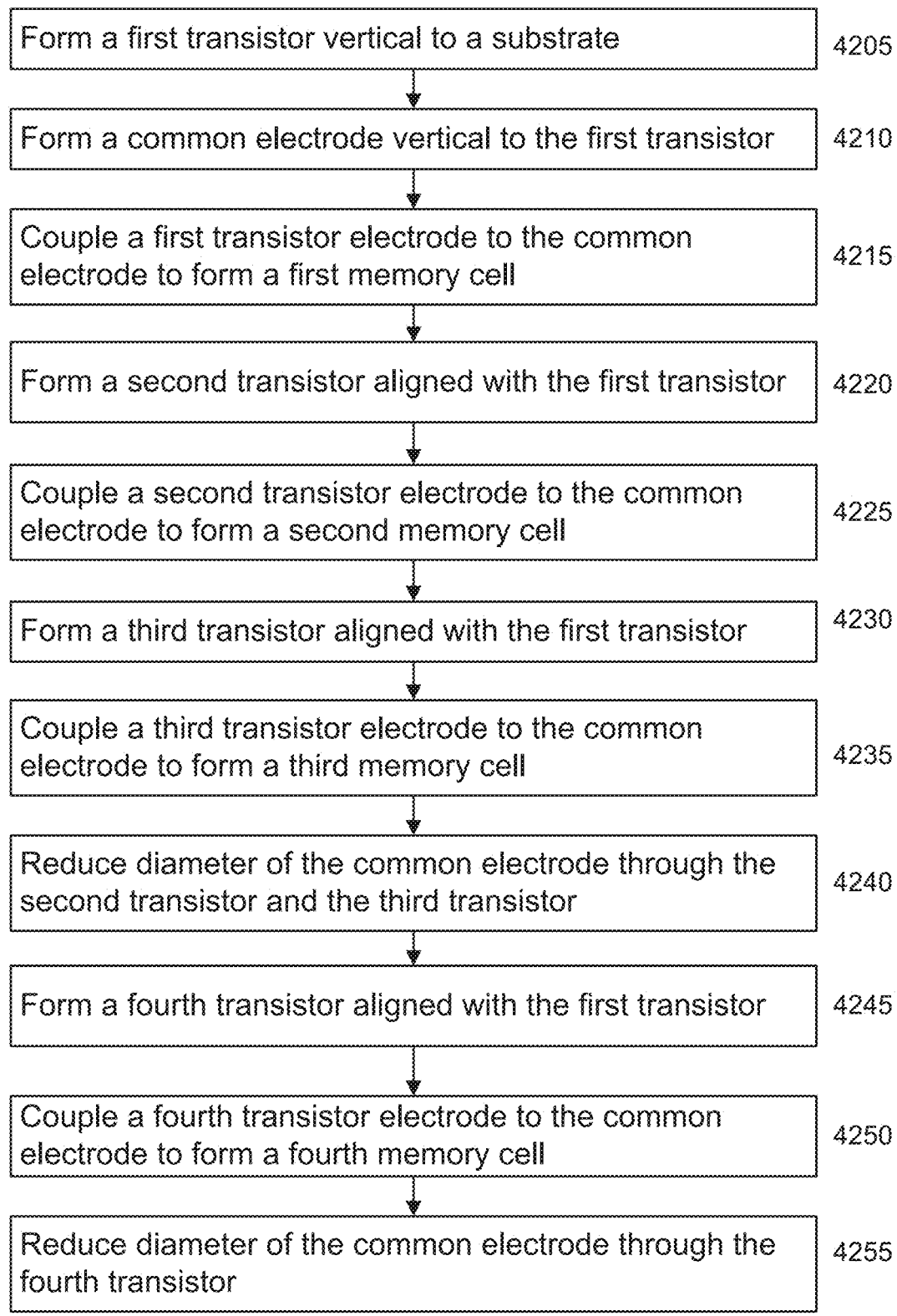
FIG. 42 is a flow diagrams of example methods for fabricating multi-unit memory cells using the process flows described in connection with FIGS. 1-41, according to one or more embodiments.

Referring now to FIG. 42, a flow diagram of an example method 4200 for fabricating multi-bit memory cells is illustrated. In some aspects, the method 4200 relates to fabricating two-bit or four-bit DRAM memory cells in 3D vertical configuration for both the transistors and their corresponding capacitors. In some aspects, the method corresponds to forming a multi-bit DRAM memory cell 310 that can include four vertically integrated single-bit DRAM memory cells 300, each of which can include a vertically oriented capacitor 270 that can be vertically integrated with a vertically oriented transistor 260.

In a brief overview, example method 4200 includes a series of steps from 4205 to 4255. Step 4205 can include forming a first transistor that is oriented vertically to the substrate. Step 4210 can include forming a common electrode that is vertical to the first transistor. Step 4215 can include coupling a first transistor electrode to the common electrode to form a first memory cell. Step 4220 can include forming a second transistor aligned with the first transistor. Step 4225 can include coupling a second transistor electrode to the common electrode to form a second memory cell. Step 4230 can include forming a third transistor aligned with the first transistor. Step 4235 can include coupling a third transistor electrode to the common electrode to form a third memory cell. Step 4240 can include reducing diameter of the common electrode through the second transistor and the third transistor. Step 4245 can include forming a forth transistor aligned with the first transistor. Step 4250 can include coupling a fourth transistor electrode to the common electrode to form a fourth memory cell. Step 4255 can include reducing diameter of the common electrode through the fourth transistor.

Step 4205 can include forming a first transistor that can be oriented vertically with respect to a substrate on which it is built. The first transistor can include a transistor 260A, such as the one described in FIGS. 17A-41. The first transistor can be fabricated inside of a hollow cavity that can be etched inside of one or more layers of material, including dielectrics, semiconductors, metals, plastics, ceramics, glass and others. The cavity or column can be formed on or in a substrate. The first transistor can be implemented as a DRAM memory cells with a 3D vertical design, such as a VFET or any other vertical transistor described herein.

The first transistor can include a first source/drain, a gate and a second source/drain. The first transistor can be formed to have electrical contacts to the first source/drain, the gate and the second source/drain. The source/drain regions can include doped regions to form p-n junctions therein. The gate region can also include dopants, which can be different from those in the source/drain regions. The gate can include a layer of dielectric material with a high dielectric factor kappa (high-k).

The first transistor can have a length that is longer than its width and can be oriented such that its length is oriented vertically with respect to the substrate. The first transistor can be vertically oriented with respect to a top surface of a material in which the cavity is formed. The first transistor length can be coaxially aligned with the vertical axis of the cavity in which it is disposed. The first transistor can be located at the lower part of the cavity and a capacitor can be stacked on top of it in the upper part of the cavity.

The first transistor can be formed by epitaxial growth, ion implantation at varying depths or any other application of dopants to a semiconductor in the semiconductor industry. Transistor can include material in which it is formed. The material forming the transistor can include silicon, gallium arsenide, or any other semiconductor. The material can be epitaxially grown in the cavity. The transistor can be formed using process flow steps similar to those described herein above in connection with FIGS. 21-25, or any other way described herein or in the Related Patent Application.

Step 4210 can include forming a common electrode. The common electrode can include an electrode 274, as shown or described in connection with FIGS. 17A-41. The common electrode can be formed to include an electrically conductive material, such as a metal or a doped semiconductor material. The common electrode can include a layer of material disposed using by ALD deposition, metal filling or other metal lay applications described herein in connection with FIGS. 1-16. The common electrode can be formed with doped semiconductor, such as a doped silicon, which can be implemented using the steps for growing doped silicon described earlier herein in connection with FIGS. 13-14. The common electrode can be formed using any doped semiconductor. The common electrode formed by doped semiconductor can be shaped into any shape using etching processes, such as those described in FIGS. 22, 23, 27 and 30.

The common electrode can be disposed in the cavity 250 and can be axially aligned with the vertical axis of the cavity 250. The common electrode can be vertical to the first transistor and/or be axially aligned with the vertical axis of the first transistor. The common electrode can be elongate and can have its length longer than its width. The common electrode can have its length oriented along the length of the cavity. The common electrode can be axially aligned with the cavity. The common electrode can be shaped as an elongate rod that can have any shaped cross-section, including: circular, triangular, quadrilateral, square, rectangular, pentagonal, hexagonal, octagonal or any other polygon. The common electrode can be shaped as, or include, a flat plate. The common electrode can be shaped as, or include, a curved plate. The common electrode can be shaped so as to be vertically disposed down a side of a cross-section of a cavity, or down the middle of the middle of the cross-section of the cavity. The common electrode can include a hollow cavity. The hollow cavity can have a depth that extends 10%, 20%, 30%, 40%, 50%, 60%, 70%, 80%, 90% or 100% of the electrode's length. The hollow cavity can be a through-hole through the length of the electrode.

The common electrode can be in electrical contact with the ground. The common electrode can be in electrical contact with a power source or a power line. The common electrode can be in electrical contact with a signal line. The common electrode can be in electrical contact with a common line or a common node. The common electrode can be formed to be in electrical contact with the transistor. The common electrode can be in electrical contact with a source of a transistor. The common electrode can be in electrical contact with a drain of a transistor. The common electrode can be in an electrical contact with a gate of a transistor.

Step 4215 can include coupling a first transistor electrode to the common electrode to form a first memory cell. A first transistor electrode can include an outer electrode 272, such as those described in connection with FIGS. 17A-41. The first transistor electrode can be formed as an electrically conductive component that is in electrical contact with one of a source or a drain of the first transistor, and can be implemented using any methodologies described in connection with FIGS. 1-19G. The first transistor electrode can include any features of the electrode in step 4210. The first transistor electrode can be formed using metal or doped semiconductor and can form a part of a capacitor.

The first transistor electrode can be coupled to the common electrode to form a capacitor as illustrated and described in FIGS. 1-41, including for example in FIGS. 18D and 27. The first transistor electrode can be coupled to the common electrode as a parallel plate or two parallel pieces of material to form a capacitor. For example, the electrode 274 can be connected to the ground, while the first transistor electrode 272 can be connected to the source/drain of the first transistor 260A, as described in FIGS. 18A-41, thus forming a first memory cell 300A, as illustrated in FIGS. 1-41.

Step 4220 can include forming a second transistor that is vertically aligned with the first transistor. For example, the second transistor can be a transistor 260B that can be vertically aligned with first transistor 260A along their common vertical axis, as illustrated for example in FIGS. 18A-41. The second transistor can include all the functionality, features and arrangement of the first transistor in step 4205. The second transistor can be vertically aligned with the first transistor. The second transistor can be axially aligned with the first transistor. The order of the source, gate and drain of the second transistor can be reversed from the order of source gate and drain of the first transistor. The order of the source gate drain of the second transistor can match the order of the source gate and drain from the first transistor. The second transistor can include an opening or a passage through the second transistor for a portion of the common electrode, such as the electrode 274, to be disposed or passed through the second transistor. The second transistor can have a portion of the common electrode from step 4210 running through the second transistor. The second transistor can include a reduced diameter 276 of the common electrode 274 disposed through the second transistor.

Step 4225 can include coupling a second transistor electrode to the common electrode to form a second memory cell. A second transistor electrode can include an electrode of a capacitor that is integrated with the second transistor and can include all the functionality of the first transistor electrode described in connection with step 5515 or the electrode described in step 5510. The second transistor electrode can include an outer electrode 272B, such as the one described in connection with FIGS. 17A-41. The second transistor electrode can be formed as an electrically conductive component that is in electrical contact with one of a source or a drain of the second transistor. The second transistor electrode can be implemented using any methodologies described in connection with FIGS. 1-41 including for example FIGS. 18B-19G and FIGS. 25-31. The first transistor electrode can be formed using metal or doped semiconductor and can form a part of a capacitor.

The second transistor electrode can be coupled to the common electrode to form a capacitor in accordance with descriptions concerning FIGS. 1-41, including, for example, in FIGS. 18D and 27. The second transistor electrode can be coupled to the electrode as a parallel plate or two parallel pieces of material to form a capacitor. For example, the common electrode 274 can be connected to the ground, while the second transistor electrode 272B can be connected to the source/drain of the second transistor 260B, as described in FIGS. 17A-41, thus forming a second memory cell 300B, as illustrated in FIGS. 1-41. By coupling a transistor-connected electrode to a capacitor, a DRAM memory cell can be formed.

Step 4230 can include forming a third transistor that can be vertically aligned with the first transistor. The third transistor can be a transistor 260C that can be aligned along the vertical axis with the first transistor 260A and/or second transistor 260B, as illustrated in FIGS. 32-41. The third transistor can include all the functionality, features and arrangement of the first transistor in step 4205 and of the second transistor in step 4220.

The order of the source, gate and drain of the third transistor can be reversed from the order of source gate and drain of the first transistor and/or the second transistor. The order of the source gate drain of the third transistor can match the order of the source gate and drain from the first transistor and/or the second transistor. The third transistor can include an opening through the third transistor for a portion of common electrode, such as the electrode 274, to be disposed or pass through the third transistor. The third transistor can have a portion of the common electrode from step 4210 running through the third transistor. The third transistor can include a reduced diameter 276 of the common electrode 274 disposed through the second transistor.

Step 4235 can include coupling a third transistor electrode to the common electrode to form a third memory cell. A third transistor electrode can include all the functionality of the first transistor electrode described in connection with step 4215, second transistor electrode described in connection with step 4225, and/or the electrode described in step 4210. The third transistor electrode can include an outer electrode 272C, such as those described in connection with FIGS. 17A-41. The third transistor electrode can be formed as an electrically conductive component that is in electrical contact with one of a source or a drain of the third transistor, and can be implemented using any methodologies described in connection with FIGS. 1-41 including for example FIGS. 18B-32G and FIGS. 41-42. The third transistor electrode can be formed using metal or doped semiconductor and can form a part of a capacitor. By coupling a transistor-connected electrode to a capacitor, a DRAM memory cell can be formed.

The third transistor electrode, such as a 272C can be coupled to the common electrode 274 to form a capacitor of the transistor 260C as illustrated and described in FIGS. 1-41, including for example in FIGS. 32-41. The first transistor electrode can be coupled to the electrode as a parallel plate or two parallel pieces of material to form a capacitor. For example, the common electrode 274 can be connected to the ground, while the third transistor electrode 272C can be connected to the source/drain of the third transistor 260C, as described in FIGS. 18A-41, thus forming a third memory cell 300C, as illustrated in FIGS. 32-41.

Step 4240 can include reducing diameter of the electrode through the second transistor and/or through the third transistor. The electrode 274 can have a reduced diameter contact 276 running through, or traversing through, the second transistor and/or the third transistor, such as, for example, described in connection with FIGS. 19A-G, and 28-31. The reduced diameter contact 276 can be formed as a thin wire or a line whose diameter is smaller than the diameter of the electrode 274. Reduced diameter contact 276 can be a part of the common electrode 274 that has its diameter reduced as the common electrode 274 traverses the interior of the second transistor 260B and/or the third transistor 260C.

Step 4245 can include forming a fourth transistor that can be vertically aligned with the first transistor. The fourth transistor can be vertically aligned with the first transistor, the second transistor, and/or the third transistor. The fourth transistor can include a transistor 260D that can be aligned along the vertical axis with the first transistor 260A, the second transistor 260B and/or the third transistor 260C, as illustrated in FIGS. 32-41. The third transistor can include all the functionality, features and arrangement of the first transistor in step 4205 and of the second transistor in step 4220 and of the third transistor in step 4230.

The order of the source, gate and drain of the fourth transistor can be reversed from the order of source gate and drain of the first transistor, second transistor and/or the third transistor. The order of the source gate drain of the fourth transistor can match the order of the source gate and drain from the first transistor, the second transistor and/or the third transistor. The fourth transistor can include an opening through the fourth transistor for a portion of common electrode, such as the electrode 274, to be disposed or pass through the fourth transistor. The fourth transistor can have a portion of the common electrode from step 4210 running through the third transistor. The third transistor can include a reduced diameter 276 of the common electrode 274 disposed through the second transistor.

Step 4250 can include coupling a fourth transistor electrode to the common electrode to form a fourth memory cell. A fourth transistor electrode can include the functionality of the first transistor electrode described in connection with step 4215, second transistor electrode described in connection with step 4225, third transistor electrode described in connection with step 4235, and/or the electrode described in step 4210. The fourth transistor electrode can include an outer electrode 272D, such as those described in connection with FIGS. 17A-41. The fourth transistor electrode can be formed as an electrically conductive component that is in electrical contact with one of a source or a drain of the fourth transistor, and can be implemented using any methodologies described in connection with FIGS. 1-41 including, for example, FIGS. 18B-19G and FIGS. 40-41. The fourth transistor electrode can be formed using metal or doped semiconductor and can form a part of a capacitor. By coupling a transistor-connected electrode to a capacitor, a DRAM memory cell can be formed.

The fourth transistor electrode, such as a 272D can be coupled to the common electrode 274 to form a capacitor of the transistor 260D as illustrated and described in FIGS. 1-41, including for example in FIGS. 32-41. The fourth transistor electrode can be coupled to the electrode as a parallel plate or two parallel pieces of material to form a capacitor. For example, the common electrode 274 can be connected to the ground, while the fourth transistor electrode 272D can be connected to the source/drain of the fourth transistor 260D, as described in FIGS. 18A-41, thus forming a third memory cell 300D, as illustrated in FIGS. 32-41.

Step 4255 can include reducing diameter of the ground electrode through the fourth transistor. The electrode 274 can have a reduced diameter contact 276 running through, or traversing through, the fourth transistor, such as for example described in connection with FIGS. 19A-G, and 28-31. The reduced diameter contact 276 can be formed as a thin wire or a line whose diameter is smaller than the diameter of the electrode 274. Reduced diameter contact 276 can be a part of the common electrode 274 that has its diameter reduced as it traverses the interior of the fourth transistor 260D.

Using these techniques a 4-bit memory cell 310 can be accomplished. By simply repeating the same processes as technique as described above in connection with FIGS. 32-41, but simply doubling the material stack and the structure from four to eight transistors and capacitors, an 8-bit memory cell 310 can be accomplished. Similarly, by following the same pattern any number of memory cells 300 can be stacked to form a multi-bit memory cell 310 of any size, including a 16-bit, a 32-bit, 64-bit, 128-bit, 256-bit, 512-bit, 1024-bit or any other number of memory cells 300 to form any size of a 3D vertically stacked memory cell 310.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features described only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A memory, comprising:
   a column-shaped opening extending through layers formed above a substrate, the column-shaped opening comprising:
   a first portion including a first transistor;
   a second portion including a first capacitor electrically coupled to and extending from the first transistor;
   a third portion including a second capacitor; and
   a fourth portion including a second transistor electrically coupled to and extending from the second transistor,
   wherein the second and third portions are vertically adjacent to one another, the first portion is below and adjacent to the second portion, and the fourth portion is above and adjacent to the third portion.

2. The memory of claim 1, wherein each of the first and second transistors include:
   a first source/drain structure extending horizontally from the column-shaped opening;
   a gate structure above the first source/drain structure and extending horizontally from the column-shaped opening;
   a second source/drain structure above the gate structure and extending horizontally from the column shaped opening,
   each of the structures being separated by at least one dielectric; and
   a semiconductor material extending from the first source/drain structure to the second source/drain structure.

3. The memory of claim 1, wherein the first transistor and first capacitor form a first memory cell, and wherein the second transistor and second capacitor form a second memory cell.

4. The memory of claim 1, wherein:
the first capacitor includes a first electrical conductor, a second electrical conductor, and a dielectric disposed between the first and second electrical conductors, the first and second electrical conductors of the first capacitor extending within the column-shaped opening;
the second capacitor includes a first electrical conductor, a second electrical conductor, and a dielectric disposed between the first and second electrical conductors, the first and second electrical conductors of the second capacitor extending within the column-shaped opening; and
wherein the first electrical conductors of the first and second capacitors are electrically connected to one another, and wherein the second electrical conductor of the first and second capacitors are electrically isolated from one another.

5. The memory of claim 4, wherein the first and second electrical conductors have circular profiles.

6. The memory of claim 4, wherein the first electrical conductor is metal and the second electrical conductor is metal.

7. The memory of claim 4, wherein the first electrical conductor is metal and the second electrical conductor is doped silicon.

8. The memory of claim 4, wherein:
the first electrical conductor of the first and second capacitors extend along a central axis of the column-shaped opening;
the second electrical conductor of the first and second capacitors form a lining along the column-shaped opening;
the first electrical conductor of the first and second capacitors is electrically connected to an electrical common line;
the second electrical conductor of the first capacitor is in electrical contact with the first transistor; and
the second electrical conductor of the second capacitor is in electrical contact with the second transistor.

9. The memory of claim 8, wherein the second electrical conductor of the first capacitor and the second electrical conductor of the second capacitor are separated by a second dielectric.

10. The memory of claim 9, wherein the dielectric and second dielectric are different materials from one another.

11. A method of fabricating a memory having a portion formed as a column-shaped opening, the method comprising:
forming a column-shaped opening extending through layers formed above a substrate,
forming a first transistor in the column-shaped opening to form a first portion of the column;
forming a first capacitor electrically coupled to and extending from the transistor in the column-shaped opening to form a second portion of the column;
forming a second transistor in the column-shaped opening to form a third portion of the column; and
forming a second capacitor electrically coupled to and extending from the transistor in the column-shaped opening to form a fourth portion of the column,
wherein forming the first and the second capacitors comprises:
forming a first electrical conductor of the first and second capacitors;
forming an interior cavity in the first electrical conductor; and
forming a second electrical conductor at least partly formed inside of the interior cavity.

12. The method of claim 11, wherein forming the first and second transistors include:
forming first source/drain structures of the first and second transistors extending horizontally from the column-shaped opening;
forming gate structures of the first and second transistors and extending horizontally from the column-shaped opening;
forming second source/drain structures of the first and second transistors and extending horizontally from the column-shaped opening, wherein each of the structures are separated by at least one dielectric; and
forming a semiconductor material extending from the first source/drain structure to the second source/drain structure of each of the first and second transistors.

13. The method of claim 11, further comprising forming a layer of electrically insulating material disposed between the first electrical conductor and the second electrical conductor.

14. The method of claim 13, wherein:
forming the first electrical conductor includes forming a first metal conductor; and
forming the second electrical conductor includes forming a first doped silicon conductor.

15. The method of claim 11, wherein:
forming the first capacitor includes forming a first electrical conductor, a second electrical conductor, and a dielectric disposed between the first and second electrical conductors, the first and second electrical conductors of the first capacitor being elongated and extending within the column-shaped opening;
forming the second capacitor includes forming a first electrical conductor, a second electrical conductor, and a dielectric disposed between the first and second electrical conductors, the first and second electrical conductors of the second capacitor being elongated and extending within the column-shaped opening; and
wherein forming the first electrical conductor of the first and second capacitors includes electrically connecting the first electrical conductors of the first and second capacitors to one another, and
wherein forming the second electrical conductor of the first and second capacitors includes electrically isolating the second electrical conductors of the first and second capacitors from one another.

16. The method of claim 15, wherein:
forming the first electrical conductor includes forming a first metal conductor; and
forming the second electrical conductor includes forming a second metal conductor.

17. The method of claim 15, wherein:
forming the first electrical conductor of the first and second capacitors extends along a central axis of the column-shaped opening;
forming the second electrical conductor of the first and second capacitors includes forming the second electrical conductor as a lining along the column-shaped opening; and
forming the first electrical conductor of the first and second capacitors includes electrically connecting the first electrical conductor to an electrical common line;

forming the second electrical conductor of the first capacitor includes forming an electrical contact of the second electrical conductor of the first capacitor with the first transistor; and forming the second electrical conductor of the second capacitor includes forming an electrical contact of the second electrical conductor with the second transistor.

18. The method of claim 17, wherein forming the second electrical conductor of the first capacitor and the second electrical conductor of the second capacitor includes disposing a second dielectric between the first and second electrical conductors.

19. The method of claim 18, wherein disposing the dielectric and second dielectric includes disposing dielectric materials that are different from one another.

* * * * *